United States Patent [19]
Bosshart

[11] Patent Number: 6,055,204
[45] Date of Patent: Apr. 25, 2000

[54] CIRCUITS, SYSTEMS, AND METHODS FOR RE-MAPPING MEMORY COLUMN REDUNDANCY

[75] Inventor: Patrick W. Bosshart, Plano, Tex.

[73] Assignee: Texas Instruments Incorporated, Dallas, Tex.

[21] Appl. No.: 09/067,403

[22] Filed: Apr. 28, 1998

Related U.S. Application Data

[60] Provisional application No. 60/044,415, Apr. 29, 1997.

[51] Int. Cl.[7] .................................................. G11C 8/00
[52] U.S. Cl. ........................... 365/230.06; 365/189.02; 365/200; 365/225.7; 365/230.02
[58] Field of Search ............................. 365/230.06, 200, 365/189.02, 225.7, 230.02

[56] References Cited

U.S. PATENT DOCUMENTS

| | | | |
|---|---|---|---|
| 4,771,404 | 9/1988 | Mano et al. | 365/238 |
| 5,050,126 | 9/1991 | Tanaka et al. | 365/230.03 |
| 5,745,401 | 4/1998 | Lee | 365/189.02 |

*Primary Examiner*—Son T. Dinh
*Attorney, Agent, or Firm*—Rebecca Mapstone Lake; Fred Telecky

[57] ABSTRACT

A memory configuration (304) comprising a row array (302) having a plurality of rows. The memory configuration further includes a plurality of memory columns ($C_0$ through $C_4$). Each of the plurality of rows is constructed to communicate a plurality of signals along the plurality of memory columns and each of the plurality of memory columns provides a memory column output. Further, the memory configuration includes a plurality of output columns ($OC_0$ through $OC_3$). Each of the plurality of output columns is operable to output a data signal external from the memory configuration. Still further, the memory configuration includes an encoder circuit (308) and a decoder circuit (306, $M_1$ through $M_4$). The encoder circuit identifies an identified one of the plurality of memory columns. The decoder circuit is responsive to the identified one of the plurality of memory columns identified by the encoder circuit, and couples selected ones of the plurality of memory columns to corresponding ones of the data columns. Particularly, the corresponding ones of the data columns include at least each of the plurality of memory columns other than the identified one of the plurality of memory columns.

30 Claims, 16 Drawing Sheets

FIG. 6
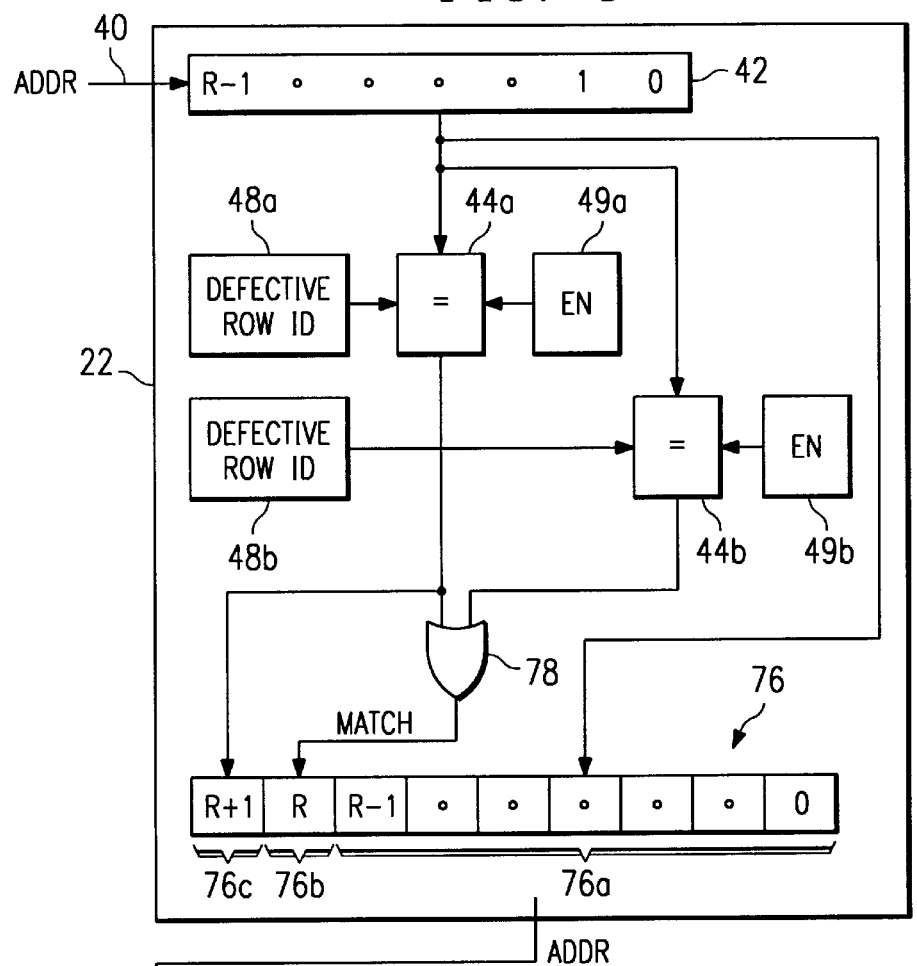
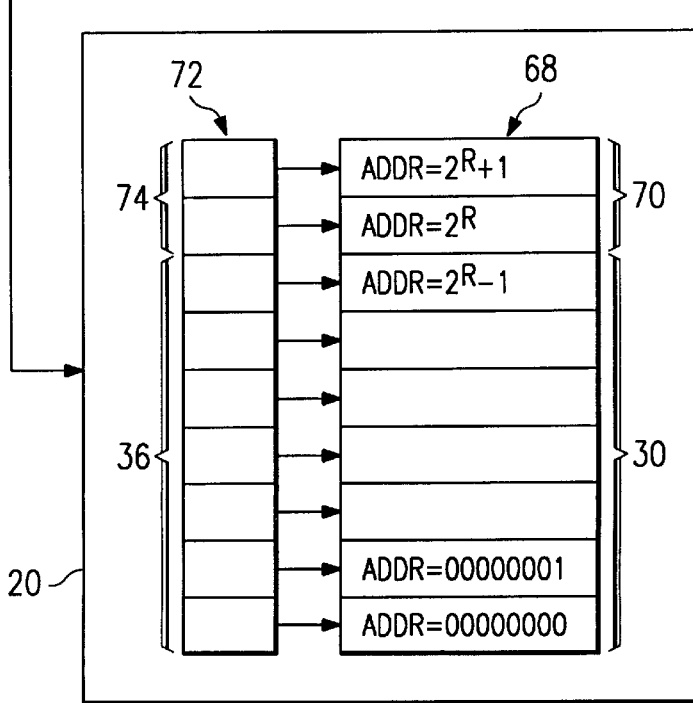

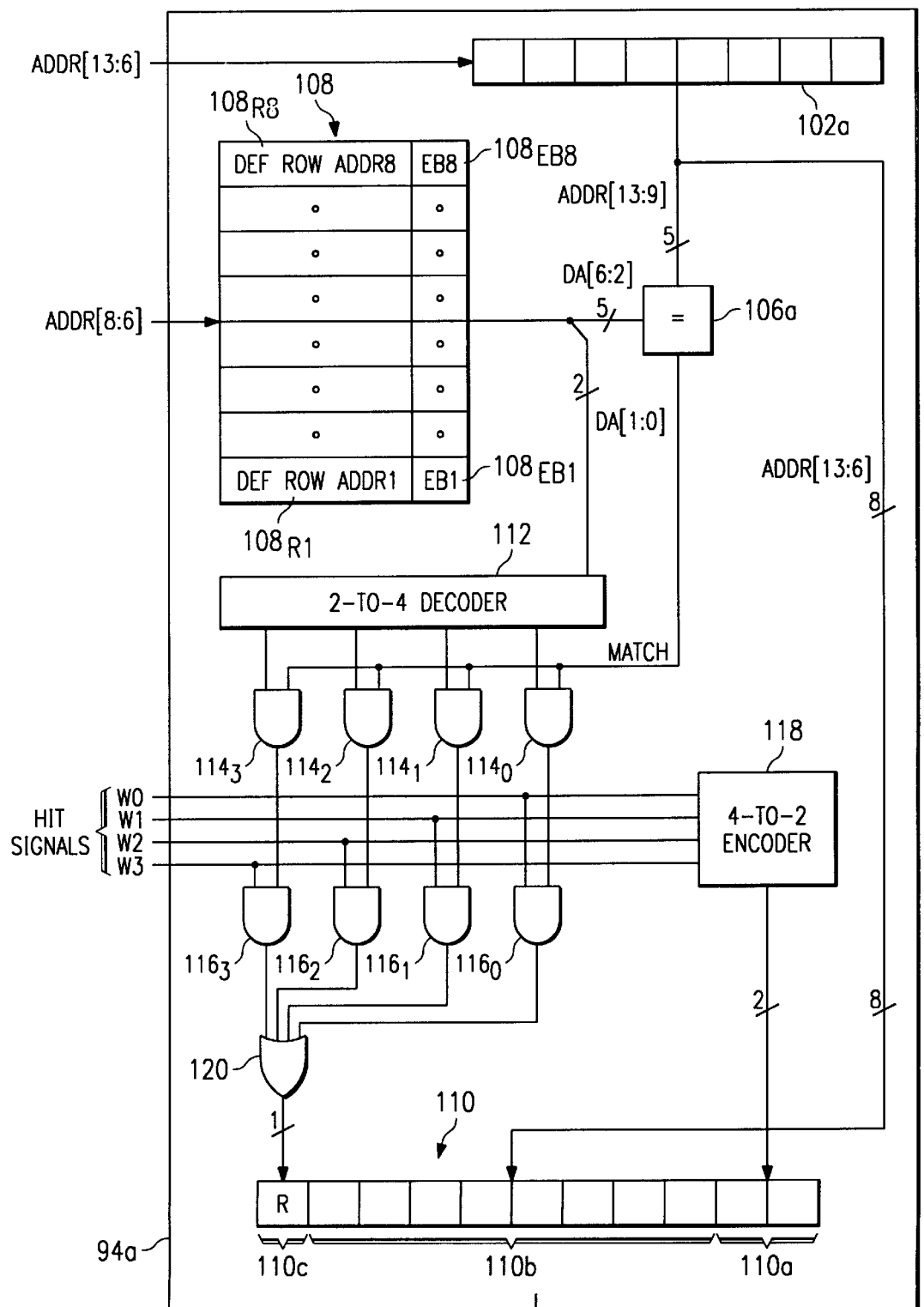
FIG. 9    DATA MEMORY ADDRESS

CIRCUITS, SYSTEMS, AND METHODS FOR RE-MAPPING MEMORY COLUMN REDUNDANCY

CROSS-REFERENCES TO RELATED APPLICATIONS

This application claims priority under 35 USC § 119 (e) 1) of provisional application No. 60/044,415 filed Apr. 29, 1997.

The present application is related to co-pending U.S. Provisional Patent Application No. 60/044,414, entitled "Circuits, Systems, And Methods For Remapping Memory Row Redundancy During Two Cycle Cache Access", having the same inventor and filed on the same date as the present application, and which is hereby incorporated herein by reference.

STATEMENT REGARDING FEDERALLY SPONSORED RESEARCH OR DEVELOPMENT

Not Applicable.

BACKGROUND OF THE INVENTION

The present embodiments relate to memory configurations. In one group of the present embodiments, they relate to microprocessors, and are more particularly directed to microprocessors having circuits, systems, and methods for re-mapping memory row redundancy by converting an original address to a spare row address during a two cycle cache access. In another group of the present embodiments, they relate to circuits, systems, and methods for remapping memory column redundancy.

In the digital memory art, it is known that after a memory is constructed there is some statistical probability that one or more rows of the memory may be found to be defective. In other words, although a row was constructed to store a certain predetermined number of bits of information, after construction it is determined through testing that the row, for whatever reason, is inoperable and thus cannot store the information as originally intended. Given this probability, often a memory includes one or more so-called redundant or spare rows, and information which originally would have been stored to, and read from, the defective row is somehow instead stored to, and read from, one of the spare rows.

Given the spare row redundancy described above, in one prior art approach each of those rows in the memory also includes a row enabling fuse which determines whether the corresponding row may be energized. Moreover, each spare row includes a group of decoder fuses to decode the address to energized the corresponding row. Thus, if a row is found to be defective, the row enabling fuse is configured (e.g., disabled) so that the defective row cannot be energized. Further, the decoder fuses for one of the spare rows are then configured so that the decoder decodes an incoming address intended for the defective row and instead addresses the spare row. While this approach is heavily used, it has various drawbacks. For example, fuse construction may add complexity to the construction process. As another example, fuses also require additional usage of area on the integrated circuit. Given these considerations, note further the number of fuses required for the prior art described above. Specifically, the total number of fuses required equals the number of rows plus the number of spare rows times the sum of the number of bits to decode an address for the memory plus one enable bit for each spare row. For example, for a 256 line memory with two independent spare rows, a total of 274 fuses are required (256 row enabling fuses plus 2* (8 decode fuses+1 enable fuse)). Moreover, note that the great majority of these fuses are not located in one place, but are placed along each row. These as well as other drawbacks will be appreciated by a person skilled in the art.

Given the above observations about row implementation in the digital memory art, it is likewise known with respect to memory columns that after a memory is constructed there is some statistical probability that one or more columns of the memory may be found to be defective. Thus, although a column was constructed to be able to either output, input, or both input or output a bit of information, after construction it is determined through testing that the column, for whatever reason, is inoperable and thus cannot communicate the information as originally intended. Given this probability, often a memory includes one or more so-called redundant or spare columns, and information which originally would have been stored to, and read from, the defective column is somehow instead stored to, and read from, one of the spare columns.

Given the spare column redundancy described above, in one prior art approach detailed later each of those columns is directed through one or more multiplexers to an external column, and those multiplexers are controlled by fuses fixed between successive control inputs to the multiplexers. Thus, if a column is found to be defective, a fuse controlling the multiplexer through which the defective column would otherwise communicate is configured (e.g., disabled) so that the defective column cannot either receive information in the case of input, or produce information in the case of output. While this approach may be used, it too has various drawbacks. For example, in some configurations, if more than one column is identified as defective then this prior art approach by itself is insufficient since it is capable of only excluding one column from reaching the external connections of the memory configuration. As another example, the number of fuses required by this prior art approach is one greater than the number of output columns and, thus, for a large memory, there is correspondingly a large number of fuses required. As another example, note the fuses are typically physically oriented between output columns of the memory configuration and, therefore, require considerable space relative to the columns of the memory configuration In view of the above, there arises a need to address various drawbacks of the prior art, and improve upon prior art approaches as is accomplished by the inventive embodiments discussed below.

BRIEF SUMMARY OF THE INVENTION

In one embodiment, there is a memory configuration for implementing column redundancy. The memory configuration includes a row array having a plurality of rows, and further includes a plurality of memory columns. Each of the plurality of rows is constructed to communicate a plurality of signals along the plurality of memory columns and each of the plurality of memory columns provides a memory column output. Further, the memory configuration includes a plurality of data columns. Each of the plurality of data columns is operable to communicate a data signal external with respect to the memory configuration. Still further, the memory configuration includes an encoder circuit and a decoder circuit. The encoder circuit identifies an identified one of the plurality of memory columns. The decoder circuit is responsive to the identified one of the plurality of memory columns identified by the encoder circuit, and couples selected ones of the plurality of memory columns to corresponding ones of the data columns. Particularly, the corresponding ones of the data columns include at least each of the plurality of memory columns other than the identified one of the plurality of memory columns.

BRIEF DESCRIPTION OF THE SEVERAL VIEWS OF THE DRAWING

FIG. 6 illustrates a block diagram of an alternative inventive embodiment wherein up to two defective rows in a data memory may be re-mapped to one of two spare rows;

FIG. 8b illustrates the address format for the embodiment of FIG. 8a;

FIG. 9 illustrates a block diagram of an alternative inventive embodiment to address a data memory having several banks, where the diagram of FIG. 9 compares the incoming to a defective address in successive steps, where the first step compares a portion of the incoming address to a block address and where the second step compares a way address corresponding to the incoming address to the way address of a defective row address;

DETAILED DESCRIPTION OF THE INVENTION

Given the Background set forth above, the following Detailed Description sets forth various embodiments. For purposes of assisting the reader, but without any limitation to the inventive scope of those embodiments and the many features of such embodiments, the following Table Of Contents sets forth four subheadings to identify particular topics within the Detailed Description.

| Table Of Contents | |
|---|---|
| Subheading Title | Section |
| Memory Row Redundancy | 1 |
| Memory Column Redundancy | 2 |
| Combined Memory Row and Memory Column Redundancy | 3 |
| Microprocessor Configuration | 4 |
| Conclusion | 5 |

1. Memory Row Redundancy

Figure 1:
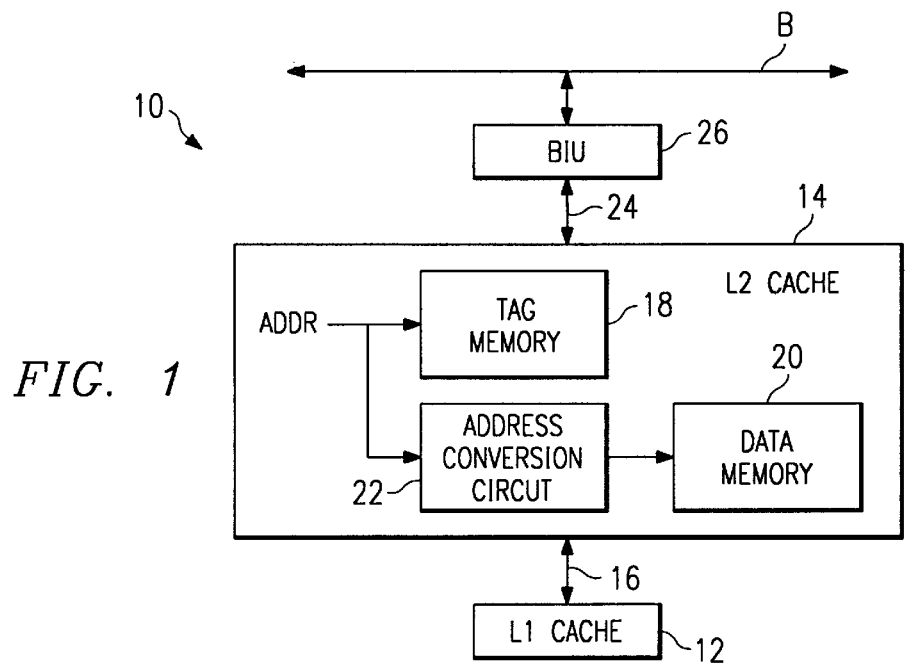
FIG. 1 illustrates a block diagram of one inventive embodiment of a memory hierarchy scheme including an L1 and L2 cache circuit, wherein the L2 cache circuit further includes an address conversion circuit for re-mapping to a spare row an original address directed to a defective row.

FIG. 1 illustrates a block diagram of a microprocessor memory system 10 in accordance with the present embodiments. System 10 may be included within various types of microprocessor structures, and an example of one such structure is detailed below in connection with FIG. 21. At this point, however, the details related to such a microprocessor other than in connection with the memory components of FIG. 1 are neither shown nor explained in order to simplify the present discussion. Instead, such a discussion is deferred until the detailed discussion of FIG. 21, below.

Turning to the blocks shown in FIG. 1, system 10 includes a memory hierarchy in a manner known in the art, that is, a hierarchy which reads and writes information in an order from a lowest order storage system to higher order storage systems. At the lowest level of such a system is a level one cache circuit, shown in FIG. 1 as L1 cache circuit 12. The "L1" indication demonstrates the matter of memory hierarchy as is known in the art. Specifically, cache circuits with a lower numerical designation are commonly closer to the execution unit of the microprocessor (not shown) as compared to cache circuits with a higher numerical designation, such as the L2 cache circuit discussed later. Moreover, the numerical designation of the cache circuit provides an ascending indication of the order in which the caches are accessed by stages of an instruction pipeline (not shown) when it is either reading from, or writing to, a particular cache. Thus, such an access first occurs to an L1 cache circuit and, if a cache miss occurs to that cache, it is followed by an access to an L2 cache circuit, and so forth through the memory hierarchy until a hit is found in either a cache or other memory structure. Moreover, while system 10 of FIG. 1 shows L1 cache circuit 12 at its lowest level, some microprocessors, such as that shown in FIG. 21, below, may further include an ever lower level cache which, therefore, is referred to as an L0 cache. For the present embodiments, however, the cache circuits of FIG. 1 are sufficient to establish a basis for a presentation of various inventive aspects described below.

System 10 further includes an L2 cache circuit 14, and which is connected to L1 cache circuit 12 via a bus 16. Again, the "L2" designation necessarily indicates that this cache is higher in the memory hierarchy as compared to L1 cache circuit 12. In the preferred embodiment, L2 data cache circuit 14 is preferably larger than L1 cache circuit 12. For example, an exemplary relative size of the two caches might establish L1 cache circuit 12 as operable to store a total of 8 Kbytes of information while L2 cache circuit 14 is operable to store a total of 64 Kbytes of information. Moreover, the output capacity of L2 cache circuit 14 is preferably larger than that of L1 cache circuit 12, with an example being L2 cache circuit 14 outputting 256 bits (i.e., 32 bytes) at a time, while L1 cache circuit 12 is operable to output 128 bits (i.e., 16 bytes) at a time at a time. L2 cache circuit 14 includes a separate tag memory 18 and data memory 20. As known in the art, tag memory 18 is operable to store cache address tags as that term is used in the art, and further operates to compare those tags to an incoming address. Also as known in the art, if an incoming tag matches a tag in tag memory 18, then a cache hit occurs and the information corresponding to the incoming address is accessed in data memory 20. Note that data memory 20 is referred to as a "data" memory, but it should be understood throughout this document that the data memory is actually an information memory, that is, it may store different types of information, such as data, instructions, and/or address translation tables. To provide terminology more consistent with the current art, however, from this point forward in the detailed description this memory is referred to as a data memory with it understood that such reference is without limitation to the memory storing other types of information. In any event the process of accessing data memory 20 is further detailed below. Before reaching that discussion, however, note also that in the preferred embodiment L2 cache circuit 14 further includes an address conversion circuit 22. Briefly, note that address conversion circuit 22 also receives the incoming address and provides a corresponding address to data memory 20. As detailed extensively below, address conversion circuit 22 either outputs the same effective incoming address to data memory 20, or converts it to a different address, based on whether the incoming address is directed to a storage row within data memory 20 which is known to be defective.

Completing the illustration of FIG. 1, L1 cache circuit 14 is further connected by way of a bus 24 to a bus interface unit ("BIU") 26 which is connected to a bus B. Bus B extends external from the microprocessor including system 10 and, therefore, may control and perform communication between system 10 and other elements external from the microprocessor, including an external memory which would be higher in the memory hierarchy than L2 cache circuit 14 (and, of course, also higher than L1 cache circuit 12). At this point, any additional elements external from the microprocessor are not detailed for sake of simplicity, with examples of such elements deferred until the discussion of FIG. 21, below.

Figure 2:
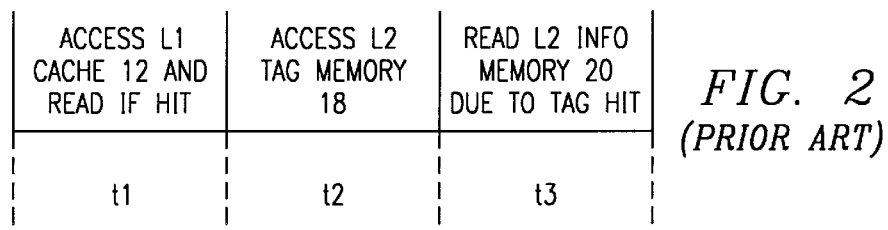
FIG. 2 illustrates a detailed diagram of a prior art system for accessing an L2 cache circuit in two successive cycles following a miss in an L1 cache circuit.
Figure 3:
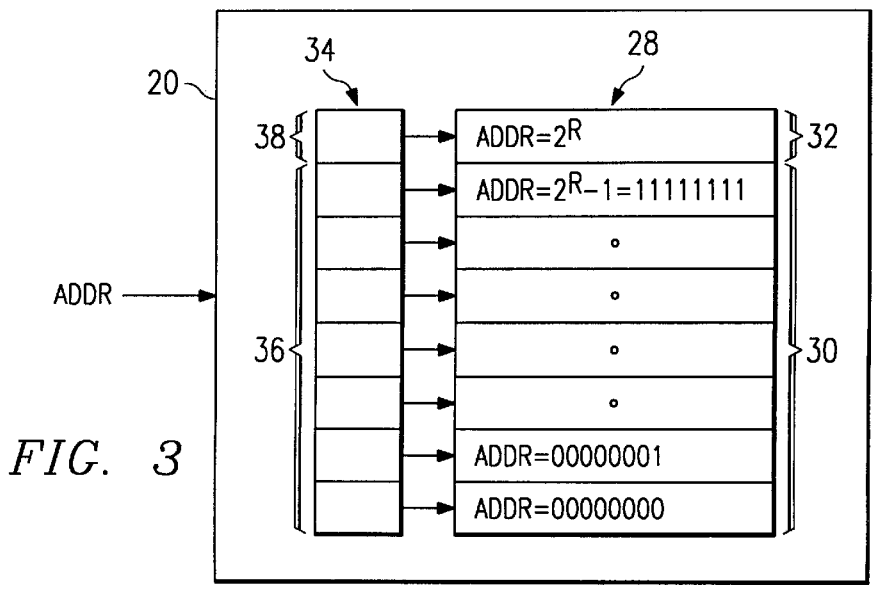
FIG. 3 illustrates a detailed block diagram of the data memory of the L2 cache circuit of FIG. 1.
Figure 4:
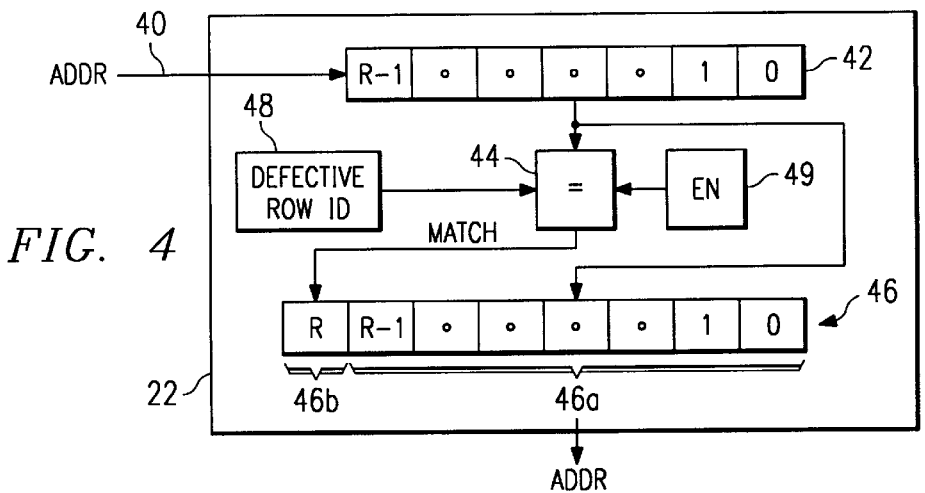
FIG. 4 illustrates a detailed block diagram of the address conversion circuit of the L2 cache circuit of FIG. 1.

The operation of the circuits of FIG. 1 are better understood after detailing additional aspects as shown in FIGS. 3 and 4, below. In addition to those aspects, however, the present embodiments preferably operate according to a preferred timing with respect to successive microprocessor clock cycles, and that preferred operation is also better understood by first exploring some additional observations about the prior art. Therefore, as background for understanding the preferred timing of address conversion circuit 22 of FIG. 1, FIG. 2 illustrates a timing diagram of a prior art cache accessing scheme for a multi-level cache architecture comparable to that shown generally in connection with FIG. 1 (i.e., one without address conversion circuit 22). Specifically, FIG. 2 illustrates successive events in clock cycles t1 through t3 where a lower level cache miss results in a cache access to L2 cache circuit 14. Turning to the specific clock cycles of FIG. 2, during t1, an access causing a miss in L1 cache circuit 12 is shown, meaning L1 cache circuit 12 is provided an address and the information sought at that address is not in that cache. In response, and under control of some type of arbitration circuit (not shown), the miss is detected and causes the next step in t2. Particularly, during t2, access is made to L2 cache circuit 14. However, note from above that L2 cache circuit 14 is preferably considerably larger than L1 cache 12. As a result, one known approach is to access tag memory 18 of L2 cache circuit 14 in a first clock cycle and, if a cache hit occurs, to access data memory 20 of L2 cache 14 in the next successive clock cycle. This operation is shown in t2 and t3, where a hit in tag memory 18 occurs during t2 and the information from data memory 20 of L2 cache 14 circuit is read during t3. Lastly, note that this two-cycle process is often performed to save power, that is, to prevent all of data memory 20 of L2 cache 14 from being accessed in the event of a cache miss, or in some instances to enable only a part of data memory 20 of L2 cache 14 to be accessed in the event of a cache hit.

Given the above discussion of FIG. 2, the present inventor has recognized how the operation of accessing a cache over two clock cycles may be taken advantage of in the context of memory row redundancy. In this regard, the present inventor provides below various embodiments below illustrating aspects of the inventive scope, and which preferably use the first of the two clock cycles shown in FIG. 2 for an additional activity in connection with memory redundancy. Specifically, and by way of introduction, this additional activity during the first of the two clock cycles is performed in the context of address conversion circuit 22 of FIG. 1, as better appreciated below. Once this occurs, the result of this additional activity may then be used during the second of the two clock cycles shown in FIG. 2 such that the access of a data memory is performed having the benefit of the additional activity which took place during the preceding clock cycle.

FIG. 3 illustrates a block diagram of information memory 20 of FIG. 1 above, but in greater detail. Data memory 20 includes a plurality of storage rows designated generally at 28. As in the art, each one of rows 28 operates to store a predetermined number of bits, and that number may range widely depending on the implementation (e.g., 8 bits to 256 bits or more). For reasons more clear below, rows 28 are separated into two groups of rows, consisting of a primary row group 30 and a spare row group 32.

Primary row group 30 includes rows which are constructed with the intention that each row is operable to store the above-discussed bits of information, but with the further understanding that one of those rows may be found to be defective after construction. In the preferred embodiment, primary row group 30 includes $2^R$ rows, where R may be selected based on implementation. For purposes of presenting an example for this and certain following Figures, assume R equals 8 and, therefore, primary group 30 includes 256 rows (i.e., $2^8=256$). Moreover, row addresses for certain rows using the example of 256 rows are shown in FIG. 3 for reasons more clear below.

Spare row group 32 includes one or more rows which are constructed to operate as spares in the instance that one or more rows within primary row group 30 are found to be defective. For the current discussion, assume that spare row group 32 includes only a single row, with other embodiments discussed later having spare groups with more than one row. Given that spare row group 32 is in addition to primary row group 30, note that the spare row address is preferably one greater than the largest address in primary row group 30. Thus, in the current example, because the largest address in group 30 is $2^8-1$, then the address of the row in spare group 32 is $2^R$ or $2^8$ the current example. The benefits from this preferred addressing format are appreciated below.

Data memory 20 further includes a plurality of decoders designated generally at 34, where each decoder corresponds to a respective one of the rows 28. Moreover, to further indicate various differences as detailed below, decoders 34 are also separated into two groups, a primary decoder group 36 corresponding to primary row group 30, and a spare decoder group 38 corresponding to spare row group 32. Because of the one-to-one correspondence between a row and a decoder, therefore, if there are 256 rows in primary row group 30, then primary decoder group 36 includes 256 decoders. Similarly, if there is 1 row in spare row group 32, then spare decoder group 38 includes 1 decoder. Each decoder in groups 36 and 38 is constructed to respond to a different address. In other words, a given address input to data memory 20 only corresponds to one of the decoders and, therefore, only its corresponding row is energized in response to that address. Thus, unlike the prior art, a decoder corresponding to a spare row does not decode to the same address as a decoder in one of the primary rows. Additionally, in the preferred embodiment, note also that each row decoder does not include a separate enabling fuse. Moreover, note that decoders in primary decoder group 36 may be constructed according to prior art principles but, again, while eliminating an additional disabling fuse or like device which is not necessary for reasons set forth below. Lastly, note that each decoder in primary group 36 must distinguish among a total of $2^R+1$ different rows. Consequently, each decoder is configured to decode an address of R+1 bits. For example, for the case of R=8, data memory 28 includes a total of 257 rows (i.e., 256 primary rows and 1 spare row). Thus, a total of 9 bits are required in each of the decoders in primary decoder group 36. Construction of the decoder(s) in spare decoder group 38 is detailed later.

FIG. 4 illustrates a block diagram of address conversion circuit 22 of FIG. 1 above, but in greater detail. Address conversion circuit 22 has an input 40 for receiving the incoming address shown in FIG. 1. Input 40 is preferably connected to a storage device 42 such as a latch or the like. Using the reference of $2^R$ rows in primary row group 30 of data memory 20, note that the incoming address will have R bits; thus, if the first of these bits is the $0^{th}$ bit, then the address stored in storage device 42 will consist of bit 0 through bit R-1 as shown. The output of storage device 42 is connected to a first input of a comparator 44, and also to a lower significant portion 46a of an address output storage device 46. Address conversion circuit 22 further includes a defective row identifier circuit 48 which, as detailed below, stores an identification of a defective row within primary row group 30 if one of such rows is defective. In a preferred embodiment, the encoding of the defective row in identifier circuit 48 is established using fuses in a manner similar to that for fuse technology used in address decoding and row enabling in the prior art. For example, for an R bit address, identifier circuit 48 includes R fuses which may be configured (e.g., blown by laser) to indicate an address of a defective row within primary row group 30. Note that alternative configurations also may be used to form row identifier circuit 48. For example, a multiple bit register, or a combination of single bit registers, could be used to provide the encoding functionality described below. As another example, other storage or memory types may be used, such as a random access memory or an electrically erasable programmable read only memory. As still another approach, a combination of re-programmable and permanent storage structures also could be used for row identifier circuit 48. In this respect, during testing the re-programmable device is used to determine the appropriate value to be encoded and, once that value is known, the permanent storage structure is used to encode that value and thereafter perform the function of row identifier circuit 48. In any event, the output of defective row identifier circuit 48 is connected as a second input to comparator 44. Moreover, comparator 44 receives a control signal from an enabling circuit 49. In the preferred embodiment, enabling circuit 49 also includes a single fuse which indicates whether a defective row has been found within primary row group 30. In other words, after primary row group 30 is constructed, it is tested using known techniques to determine whether one of its rows is defective. If so, and for reasons more clear below, it is desirable to enable the comparison and resulting operations of comparator 44. Consequently, in this event, the single fuse of enabling circuit 49 is configured (e.g., again, blown by a laser) to one state to indicate that a defective row was identified and, therefore, to enable the functionality of comparator 44. Note that enabling this functionality may be achieved through various techniques. For example, the comparison result may be logically ANDed with a signal which is set when the comparison is enabled. Consequently, when the comparison is not enabled, the output will be masked by the low input to the logic AND. In any event, if no defective row is found, the fuse of enabling circuit 49 is configured to an opposite state to indicate that no defective row was identified; in this case, therefore, the functionality of comparator 44 is not enabled. In either event, the output of comparator 44 is connected as a MATCH signal to a higher significant portion 46b of address output storage device 46. In the embodiment of FIG. 4, this higher significant portion 46b consists of a single bit concatenated to lower significant portion 46a and, therefore, is shown as bit R in FIG. 4. Lastly, the address stored in output storage device 46 in its entirety (i.e., both higher and lower significant portions 46b and 46a) is output by address conversion circuit 22 and connected to data memory 20 as shown in FIG. 1. Moreover, as appreciated from FIG. 3, this address of bits 0 through R is connected to decoders 34 of data memory 20.

Figure 5:
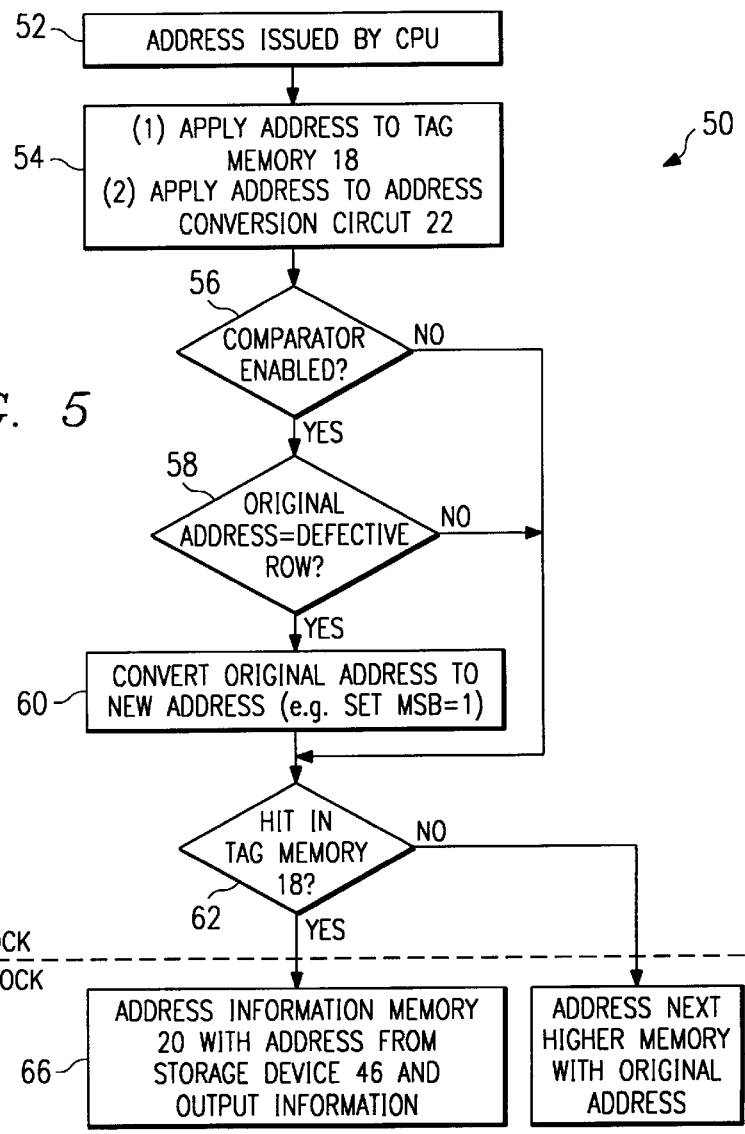
FIG. 5 illustrates a flow chart of the method of operation of the circuits of FIGS. 1, 3 and 4.

FIG. 5 illustrates a flow chart of a method of operation 50 for the circuits of FIG. 1 given the further details of those circuits. Briefly, before addressing the steps of method 50, note that method 50 is directed only at the accessing of L2 cache circuit 14 as opposed to L1 cache circuit 12. Thus, a discussion of the access to L1 cache 12 and the resulting miss in that cache is not presented in method 50, but it is understood that ultimately information need not be read from L2 cache circuit 14 if the same information may be found in L1 cache circuit 12 (i.e., if a cache hit occurs in L1 cache 12). Given this introduction, the steps of method 50 are detailed below with the assumption of a miss in L1 cache circuit 12, and are then followed by an example to further illustrate application of those steps according to the present inventive embodiments.

Method 50 begins with step 52, where the microprocessor which includes memory system 10 issues an address for information stored in a main memory and, by definition, which therefore also may be stored in one of the levels of cache memory. For purposes of distinguishing this address, it is referred to from this point forward as the original address. It is further assumed, therefore, as suggested above, that this original address does not cause a hit in L1 cache circuit 12; thus, the following discussion is directed to the access of L2 cache circuit 14. Method 50 continues to step 54, where two concurrent actions occur. As one action, step 54 applies the original address to tag memory 18 of L2 cache circuit 14, and this may occur according to known principles in the art. As a separate action, however, step 54 also applies the original address to address conversion circuit 22, where the original address is stored to storage circuit 42 (see FIG. 4). Note also that by placing the original address in storage circuit 42, the original address is also copied to lower significant portion 46a of output storage device 46.

In step 56, address conversion circuit 22 determines whether comparator 44 is enabled. In other words, recall from above that address conversion circuit 22 includes an enabling circuit 49 which includes some mechanism, such as a fuse, which enables comparator 44 to perform additional functionality if a defective row in primary row group 30 has been identified. Thus, from step 56, if comparator 44 is enabled, method 50 continues to step 58. On the other hand, if comparator 44 is not enabled (i.e., there is no defective row in primary row group 30), method 50 continues to step 62 discussed below.

From the above, note that step 58 is reached only if a valid defective row identifier is stored in circuit 48. In this instance, in step 58, comparator 44 determines whether the original address in storage circuit 42 matches the defective row identifier stored in circuit 48. If a match occurs, method 50 continues to step 60. On the other hand, if a match does not occur, method 50 continues to step 62 discussed below.

Step 60, having been reached due to a match of the original address to the defective row identifier, asserts the MATCH signal which sets the bit of higher significant portion 46b to a high state. Recall also from step 54 that the lower significant portion 46a is already established as a copy of the original address. At this point, therefore, note that by setting the bit in portion 46b using the MATCH signal, and because this set bit is concatenated as the most significant bit as combined with lower significant portion 46a, this step effectively converts the original address to a new address in output storage device 46 as represented by the combination of most significant portion 46b with lower significant portion 46a. Alternatively, note that if step 60 is bypassed by step 58 (i.e., if a match does not occur between the original address and the defective row identifier), then the MATCH signal is not asserted and the bit of higher significant portion 46b remains at a low state. Thus, no address conversion effectively occurs if a match does not occur between the original address and the defective row identifier and only the original address remains in output storage device 46.

Step 62 determines whether a hit occurred in tag memory 18 in response to the original address. If a hit did not occur (i.e., a miss occurred in tag memory 18), method 50 continues to step 64. On the other hand, if a hit occurred method 50 continues to step 66.

Before discussing the alternative actions of steps 64 and 66, note further the timing of the steps of method 50 with respect to successive microprocessor clock cycles. Specifically, recall that FIG. 2 above introduced the concept of successive microprocessor clock cycles and the accessing of ascending ordered cache structures given those cycles. From that Figure, it was noted that the present inventor has recognized that for certain cache structures (e.g., L2 cache circuit 14), two successive clock cycles are required when information is ultimately read from such a cache, a first clock generally for accessing the tag memory and a second successive clock generally for accessing the data memory. In FIG. 2, these two clock cycles are shown as t2 and t3. Given this context, note that steps 52, 54, and 62 of FIG. 5 are comparable to the tag memory access of t2 of FIG. 2. Thus, in FIG. 5, a dashed line is shown after step 62, with an indication immediately above that line designating that the steps above the line preferably occur during a first clock cycle. However, note that steps 56, 58, and 60 also occur during this same cycle. In other words, and as better appreciated from examples set forth below, during the same clock cycle that tag memory 18 of L2 cache circuit 14 is checked for a hit, the address conversion, if any, of steps 56, 58, and 60 also may occur. Below the dashed line, therefore, a next successive clock occurs, and the following steps preferably occur during that successive clock cycle.

Recall that step 64 is reached when there is no hit in tag memory 18 of L2 cache circuit 14. Thus, in the manner of the prior art, step 64 addresses the next higher level of storage in the memory structure of the microprocessor by using the original address. For example, this next higher level of storage may be an additional cache circuit. Alternatively, this next higher level of storage may be a main memory, such as an external memory coupled to bus B shown in FIG. 1. In any event, therefore, ultimately the information at the original address will be located and placed on the appropriate bus for use by the circuit seeking that information.

As an alternative step to step 64, recall that step 66 is reached when there is a hit in tag memory 18 of L2 cache circuit 14. In this instance, step 66 addresses data memory 20 of L2 cache circuit 14 and outputs the addressed information. Moreover, note that step 66 uses the address from output storage device 46 to address data memory 20. Given that data memory 20 is addressed with the address from output storage device 46, note several observations about the above process given the alternative actions of the steps preceding step 66. For example, if no address conversion is made (i.e., bit 46b remains low because either comparator 44 was not enabled or the MATCH signal is not asserted), then the address in output storage device 46 is no different for addressing purposes than the original address. In other words, given this instance, while the address in output storage device 46 now has a new leading zero (i.e., from higher significant portion 46b), it addresses the same location as it would have without the leading zero. Thus, effectively the original address is connected to data memory 20 and data memory 20 outputs the information from a row within primary row group 30 as addressed by the original address. To the contrary, however, note now the effect if an address conversion is made. Specifically, such a conversion occurred by setting higher significant portion 46b high because comparator 44 found a match between the original address and the defective row identifier. In other words, the original address, without a change, would have addressed a defective row within primary row group 30 of data memory 20. However, because of the set most significant bit, a new address is created in output storage device 46 which does not address the defective row within primary row group 30 of data memory 20, but instead is re-mapped to address the row within spare row group 32 as further detailed below.

Given the above, one skilled in the art will appreciate that once an original address directed to a defective row is converted, it will have a logical 1 as its most significant bit (i.e., in the location of bit R). Recognizing this effect, attention is now returned to FIG. 3 and, more particularly, to spare decoder 38 of that Figure. Recall that spare decoder 38 corresponds to row with an address of $2^R$. Thus, under conventional design, spare decoder 38 would be set to decode an address of one greater than the address of row $2^R-1$. For example, using R=8 as suggested above, spare decoder 38 would be set to decode an address of 100000000. Moreover, under that same convention, spare decoder 38 would be configured to decode an address of R+1 bits. However, from the above discussion, one skilled in the art will appreciate that the row with the address of $2^R$ is to be addressed to be used as a spare in any event where the most significant bit ("MSB") is 1; in other words, all bits other than the MSB are irrelevant for purposes of addressing the spare row because, if the MSB is set, it is known that the spare row 32 is to be addressed. Consequently, spare decoder 38 may be configured to disregard bits 0 through R-1, and only to respond to an MSB (i.e., bit R) equal to 1. In this instance, once an address conversion occurs to set bit R equal to 1, the converted address is detected as different than the original address because it has bit R equal to 1 and, therefore, the converted address is re-mapped to address spare row 32 rather than the defective row which would have been addressed by the original address.

To further illustrate the above principles, an example is now presented where an original address is converted because it seeks to address a defective row in data memory 20. Thus, assume that after manufacturing data memory 20, it is determined that the row with address 00001111 within primary group 30 is found to be defective. Thus, enable circuit 49 is set to enable address comparison and the address of the defective row (i.e., 00001111) is stored within defective row identifier circuit 48. Next, assume that the microprocessor issues address 00001111 as an original address, and that the address causes a miss in L1 cache circuit 12. Thus, this original address is issued to L2 cache circuit 14 to begin the steps of method 50 as further evaluated as follows. During a first clock cycle, step 54 applies the address of 00001111 to tag memory 18. During the same clock cycle, because address comparison is enabled due to enabling circuit 49, the original address of 00001111 is compared by comparator 44 to the identifier in defective row identifier circuit 48. Given the assumptions of the current example, there is a match between the original address and the defective row address and, thus, comparator 44 asserts the MATCH signal thereby concatenating a new set MSB to the original address and effectively converting it from 00001111 to 100001111. Assuming then that the original address also causes a hit in tag memory 18, then in the next clock cycle the converted address is applied to decoders 34. Because the address has been converted, the decoder corresponding to the defective row address of 00001111 will not energize the corresponding row because the converted address no longer matches the address of the defective row. Instead, because of the set MSB in the converted address, the decoder corresponding to spare row 32 instead is energized, thereby accessing that spare row for outputting the addressed information.

To further illustrate the above principles, the previous example address of 00001111 is now again followed through method 50, but an example is shown where that original address is not converted because it does not seek to address a defective row in data memory 20. Here, therefore, assume again that a defective row is identified after manufacturing data memory 20, and assume further that it has an address of 00000011. Thus, again enable circuit 49 is set to enable address comparison and the address of the defective row (i.e., 00000011) is stored within defective row identifier circuit 48. Next, assume that the microprocessor issues address 00001111 as an original address, and assume a miss in L1 cache circuit 12. Thus, in a first clock cycle, step 54 applies the address of 00001111 to tag memory 18 as well as to comparator 44. In response the original address of 00001111 is compared to the defective row identifier address of 00000011 stored in defective row identifier circuit 48. Therefore, there is not a match between the original address and the defective row address and comparator 44 does not assert the MATCH signal. Consequently, the original address of 00001111 remains undisturbed as it is merely concatenated with a new MSB equal to 0, leaving the effective resulting addressing signal now as 000001111. Assuming then that the original address also causes a hit in tag memory 18, then in the next clock cycle the effectively unaltered address is applied to decoders 34. Because the address has not been converted, the decoder corresponding to row address of 000001111 energizes the appropriate row within primary group 30, thereby accessing that primary row for outputting the addressed information.

Having presented the above, one skilled in the art will appreciate various benefits over the prior art arising from the present embodiments. For example, the number of fuses (or other like devices) required to encode the defective row address is far less than that required by the prior art configuration requiring one fuse per primary row and additional fuses to decode an incoming address to a spare row. As another example, the location of the fuses (or again, other like devices) may be placed in a common location rather than along each row, thereby improving construction and design considerations. Still other benefits will be appreciated by a person skilled in the art, including various other flexible approaches and alternatives of the inventive scope, some of which are presented below in additional embodiments.

FIG. 6 illustrates an alternative embodiment where more than one spare row may be used in connection with the above-introduced concepts of address conversion and row addressing. More specifically, FIG. 6 illustrates address conversion circuit 22 and data memory 20 as in FIGS. 4 and 3, respectively, but further modifies various aspects of those circuits to accommodate multiple spare rows. Thus, where like elements from the earlier Figures are used, so are the common reference numerals. However, for different features, different reference numerals are introduced in FIG. 6 as detailed below.

Turning to data memory 20 in FIG. 6, note that it again includes a plurality of storage rows, here designated generally at 68. These rows include a primary row group 30 and a spare row group 70. In this embodiment, spare row group 70 includes two rows as opposed to only one as in the earlier embodiment. Thus, as appreciated from the discussion below, up to two defective rows may be identified in primary row group 30, where each one of those may be re-mapped to one of the two spare rows in group 70. Data memory 20 also includes a plurality of decoders designated generally at 72, again with a single decoder for each of the spare storage rows 68. Moreover, the decoders are again separated into two groups, with a primary decoder group 36 corresponding to primary row group 30 and a spare decoder group 74 corresponding to spare row group 70. The construction of group 36 is in the same manner as described above. Construction of the decoders within group 72 is discussed later.

Looking to address conversion circuit 22 in FIG. 6, it again includes an input 40 for connecting an original address to a storage circuit 42. In FIG. 6, the output of storage circuit 42 is connected to a first portion 76a of an address output storage device 76. Additionally, the output of storage circuit 42 is connected to the input of two separate comparators 44a and 44b. Comparator 44a is connected to receive from a second input a first defective row identifier from a defective row identifier circuit 48a, while comparator 44b is connected to receive from a second input a second defective row identifier from a defective row identifier circuit 48b. Moreover, each of comparators 44a and 44b is connected to enable its comparing functionality in response to a corresponding enable circuit 49a and 49b, respectively. The outputs of comparators 44a and 44b are connected to the input of an OR gate 78. The output of OR gate 78 is connected to provide the MATCH signal to a second portion 76b of address output storage device 76. Moreover, the output of comparator 44a is also connected to the input of a third portion 76c of address output storage device 76. Lastly, in the present embodiment, preferably only first and second portions 76a and 76b, respectively, of address output storage device 76 are connected to group 36 of decoders, and only second and third portions 76b and 76c, respectively, are connected to spare decoder group 74 for reasons more dear below.

The operation of FIG. 6 may be understood with reference again to method 50 of FIG. 5, along with some additional statements set forth below. Thus, the reader is assumed familiar with the above discussion with the following focus being on the additional or alternative aspects of FIG. 6 when contrasted with FIGS. 3 and 4. In operation, the circuits of FIG. 6 generally follow method 50, but permit the option of having an original address to be remapped to one of two spare rows. Again, an original address is loaded into register 42, and here it is copied to first portion 76a of storage device 76. Next, the original address may be compared by either or both of comparators 44a and 44b to a corresponding defective row identifier in identifier circuits 48a and 48b, respectively, assuming that each comparator 44a and 44b is enabled by a corresponding enable circuit 49a and 49b. Given the above, one skilled in the art will appreciate that, after data memory 20 of FIG. 6 is manufactured, a first defective row may be identified (using known techniques), its address stored in circuit 48a, and the comparison enabled by configuration enable circuit 49a. Additionally, a second defective row may be identified (again, using known techniques), its address stored in circuit 48b, and the comparison enabled by configuration enable circuit 49b. If either comparator 44a or 44b asserts the MATCH signal, the output of OR gate 78 is asserted, thereby setting second portion 76b in address output storage device 76. From the above, recall that first and second portions 76a and 76b are then connected to data memory 20. As a result (and assuming a tag match), again either an unaltered original address is connected to access one of the rows in primary row group 30 or, if that original address has been re-mapped, to not address the defective row. The additional aspects of then addressing a spare row are discussed below.

From the above, note that the second portion 76b (i.e., bit R) effectively operates as an indication to either primary decoder group 36 or spare decoder group 74 that a corresponding row is to be accessed by the current address. Specifically, in the above example, if the second portion 76b is not set, then a decoder within primary decoder group 36 energizes its corresponding row, whereas if the second portion 76b is set, then a decoder within spare decoder group 74 energizes its corresponding row. In the embodiment of FIG. 4, this sole additional bit also therefore provided a basis to address the sole spare row. However, in the embodiment of FIG. 6, there are two spare rows and, therefore, at least one additional indication is needed to indicate which of the spare rows should be addressed once it is determined that the original address was directed to a defective row. In the preferred embodiment, therefore, third portion 76c of storage device 76 provides this additional indication and, therefore, may be considered a signal which is part of the "address" to address one of the spare rows. More specifically, recall from above that both second portion 76b and third portion 76c are connected to spare decoder group 74. Thus, based on the combination of those two bits, one of the two rows in spare row group 74 may be addressed by the corresponding decoder. For example, one approach is as shown in the following Table 1:

TABLE 1

| Spare row address | Second portion 76b | Third portion 76c |
|---|---|---|
| $2^R$ | 1 | 1 |
| $2^R + 1$ | 1 | 0 |

Given Table 1, therefore, spare decoder group 74 may be constructed such that each decoder of that group receives only two bits (i.e., second and third portions 76b and 76c), and decodes those bits to address the appropriate spare row as shown. For the given example, in either instance of second portion 76b being set, the MATCH signal has been asserted and, therefore, one of the two spare rows should be addressed. Moreover, given a set second portion 76b, the value of the third portion will cause either the row with address $2^R$ or the row with the address $2^R+1$ to be energized. In either event, therefore, the original address is remapped to one of two spare row addresses.

The above alternative embodiment of FIG. 6 may be further modified by a person skilled in the art to include a total of any integer number of two or more spare rows, with that integer being represented as S spare rows. More specifically, for each spare row, an identifier circuit 48, a comparator 44, an enable circuit 49, and a decoder may be added. Thus, such an alternative embodiment includes S identifier circuits 48, S comparators 44, S enable circuits 49, and S decoders in spare decoder group 74. Moreover, the output of each of the S comparators 44 is then connected to the input of logical OR gate 78. In this regard, therefore, if any of the S comparators 44 detects a match, then MATCH is asserted such that second portion 76b is set and thereby re-mapping the original address to not address the row within the primary row group for which it was originally intended to address. Note further, therefore, that by expanding the number of spare rows to S rows for S greater than two, additional techniques are necessary for then selecting the appropriate spare row once an original address is re-mapped. In one approach, therefore, each output of the S comparators 44 may be connected to one of S corresponding spare decoders. Thus, in the event that bit R is set, the spare decoder also receiving an asserted output from its corresponding comparator 44 would then energize its corresponding spare row. As an alternative, the outputs of each of the S comparators could be encoded to a signal in a manner which is then decoded by all of the spare decoders, again so that only the appropriate and corresponding spare row is energized in response to the decoded signal. In either event, therefore, one skilled in the art will appreciate how the above embodiments may be implemented for one, two, or even greater than two spare rows for a given memory structure.

Figure 7:
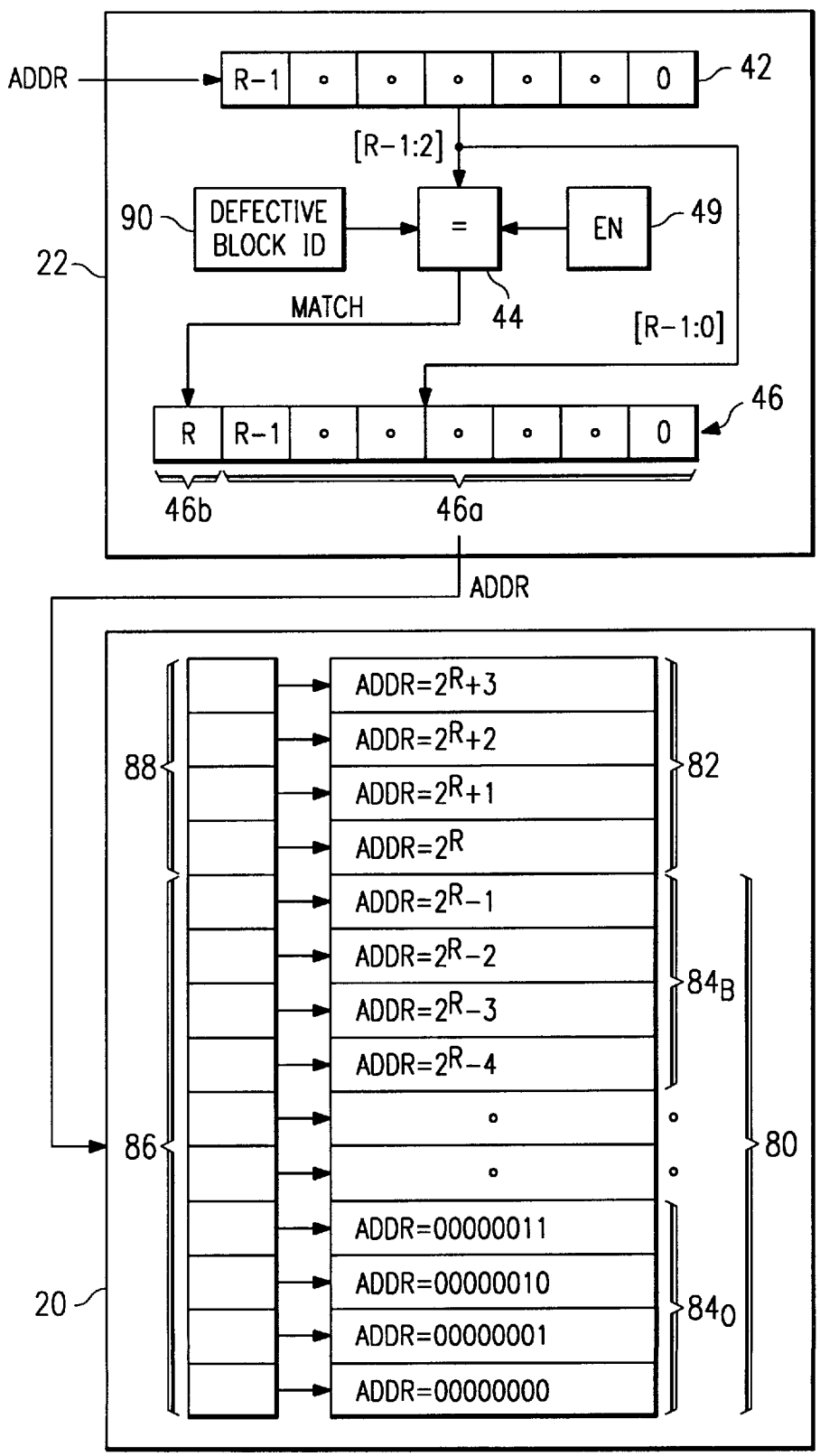
FIG. 7 illustrates a block diagram of an alternative inventive embodiment wherein up to four defective rows in a block of rows in a data memory may be re-mapped to a spare block of rows.

FIG. 7 illustrates a block diagram of yet another alternative embodiment, wherein a defective row within a block of rows may be re-mapped to a spare row within a block of spare rows. More specifically, again as in the case of the above alternatives, where like elements from the earlier Figures are used, so are the common reference numerals in FIG. 7. However, for different features, different reference numerals are introduced as discussed below.

Turning to data memory 20 of FIG. 7, note again that it includes generally a primary row group 80 having $2^R$ rows, and a spare row group 82. In the embodiment of FIG. 7, however, primary row group 80 is logically grouped into a number of row blocks, designated $84_0$ through $84_B$. For purposes of example, assume that R again equals 8 (i.e., 256 primary rows), and assume further that each block 84 has four rows. Thus, primary row group 80 includes 64 blocks, with each block having four primary rows. Moreover, note further that spare row group 82 also is organized by blocks having the same number of rows as the blocks in primary row group 80. Additionally for the present example, assume that spare row group 82 only includes a single block (i.e., four spare rows), but in alternative embodiments could also include more than one block as appreciated by a person skilled in the art. Lastly, note that each of primary row group 80 and spare row group 82 also has a corresponding decoder group, thereby providing a primary decoder group 86 and a spare decoder group 88, respectively. Within each decoder group, there is preferably a single decoder for each row within the group, for reasons detailed below.

Turning to address conversion circuit 22 of FIG. 7, note that it departs from address conversion circuit 22 of FIG. 4 in two respects. First, in FIG. 7, address conversion circuit 22 includes a defective block identifier circuit 90 connected as the second input to comparator 44 rather than a single row identifier as discussed above. Second, all bits other than the two least significant bits from storage device 42 are connected as the first input to comparator 44 whereas all bits from storage device 42 are connected to comparator 44 in FIG. 4. The purpose and benefits of these differences are appreciated from the operational description set forth below.

The operation of the FIG. 7 components is comparable in many respects to various aspects described above, and the reader is assumed to be familiar with the earlier discussions; generally, however, note that the FIG. 7 embodiment may re-map a defective row on a block basis as opposed to a single row basis as demonstrated above. In other words, after data memory 20 is manufactured, it is determined whether a row in any of blocks $84_0$ through $84_B$ is defective. In this event, an identifier of the block is stored in defective block identifier circuit 90. Again, the identification may be accomplished by way of fuses as in the case of identifier circuit 48 of FIG. 4. Here, however, because a block of rows is at issue rather than a single row, the block address requires fewer bits than a row address. For the present example of blocks having four rows, the block identifier is preferably the defective row address without its two least significant bits. For example, if it is determined that the row with address 00001111 within primary row group 80 is found to be defective, then a block address of 000011 is stored in defective block identifier circuit 90. Moreover, as with the above embodiments, enable circuit 49 is set to enable address comparison. Next, when an incoming address is received in storage device 42, its block address (i.e., bits [R-1:2]) is compared with the block identifier in circuit 90. Again, if a match is found, the MATCH signal is asserted, thereby setting bit R in output storage device 46. Thus, when the total address from output storage device 46 is connected to data memory 20, it will be remapped such that it does not address the defective row which it otherwise would have addressed.

Given the above description of FIG. 7, a few additional comments are warranted with respect to decoding the address in connection with data memory 20 shown therein. With respect to primary decoder group 86, like the above embodiments each decoder of that group may be constructed using known techniques and to decode an R+1 bit address to one of $2^R$ rows within primary row group 86. With respect to spare decoder group 88, however, note that decoding in addition to that described in connection with FIG. 3 is required because of the need to address an individual row within a block of rows. More specifically, like FIG. 4, in the FIG. 7 embodiment each spare decoder receives bit R from output storage device 46. In addition, however, each spare decoder must receive sufficient information to energize the appropriate one of the spare rows within spare row group 82. In one embodiment, this information is by way of an integer L of the least significant bits from output storage device 46, where L equals $\log_2$(number of rows in a block). In the current example, therefore, L equals $\log_2(4)$ which is equal to 2 and, thus, bits [1:0] from output storage device 46 are also connected to each spare decoder. Thus, bit R from output storage device 46 is decoded by each spare decoder to indicate that the incoming address is re-mapped to the spare block of rows, and the L least significant bits are then decoded to select one of the rows within spare block group 82. Given this functionality, known decoding structures may be constructed to perform the appropriate control. As an alternative embodiment, each of the L bits may be connected to a single decoder, with that decoder then outputting a signal to one of the spare rows to energize that row based on the possible combinations of the L input bits to the decoder.

Given the above description of FIG. 7, one skilled in the art will appreciate that the inventive scope also includes block-oriented remapping of defective rows to spare rows. Note that this alternative provides various of the benefits from above, as well as certain additional benefits. For example, the FIG. 7 embodiment permits re-mapping to a spare row for up to four defective rows rather than only for a single row, provided all four defective rows are within the same group of rows. As another example, the FIG. 7 embodiment may be expanded to block sizes other than four rows. Still further, recall that FIG. 6 illustrates how the circuit of FIG. 4 may be modified to implement multiple rows. Similarly, by combining those teachings with that of FIG. 7, a person skilled in the art also may modify FIG. 7 to permit remapping to more than one spare block as well. Still additional benefits and examples also will be ascertainable by a person skilled in the art.

Figure 8A:
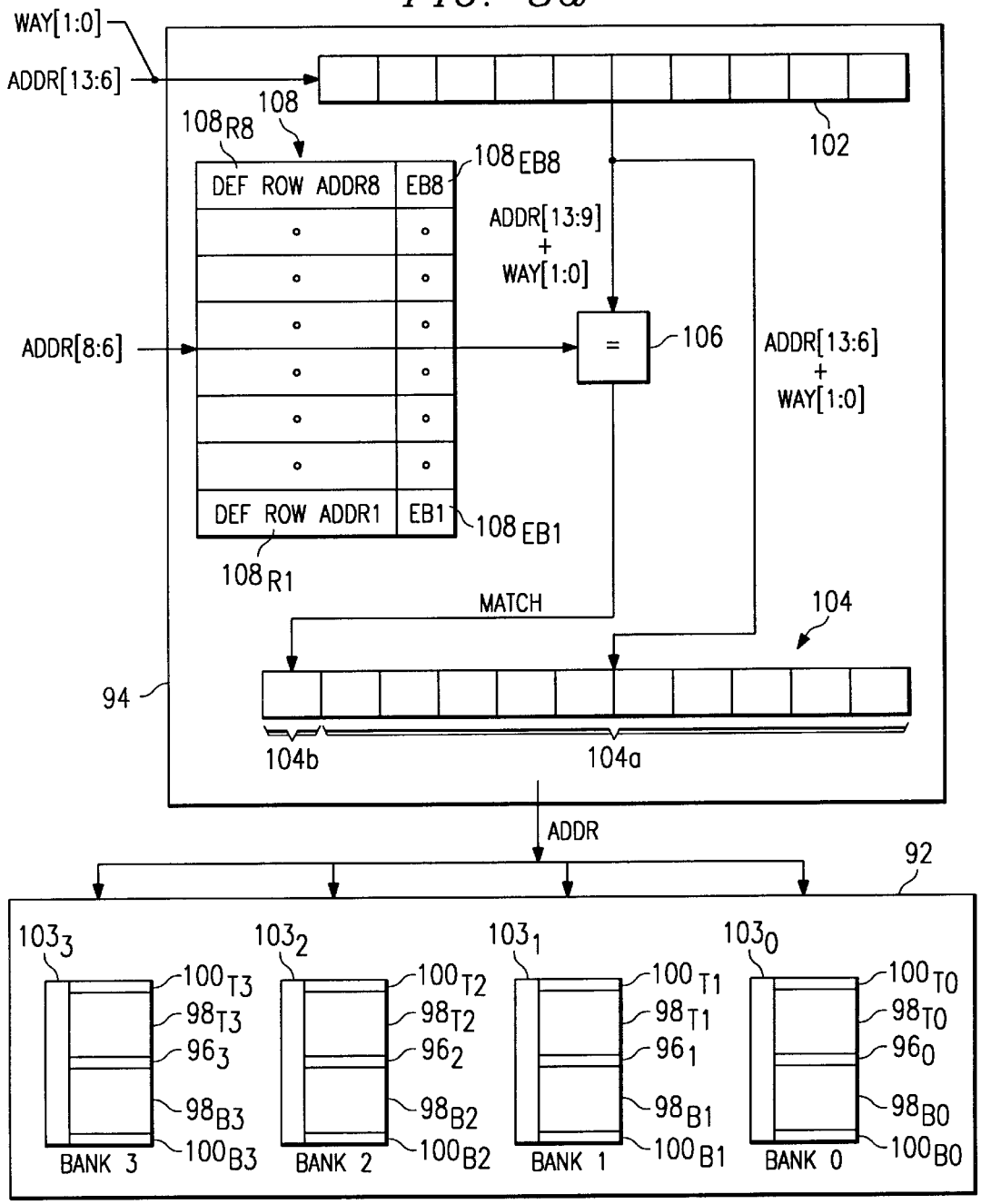
FIG. 8a illustrates a block diagram of an alternative inventive embodiment wherein the data memory includes several banks, where each bank includes an upper and lower half, where each half includes various sets and has one spare row to which a defective row in the bank half may be remapped.

FIG. 8a illustrates yet another alternative embodiment within the inventive scope, and which shares various principles with various of the embodiments described above. Due to its complexity and some differences, however, new reference numerals are used throughout FIG. 8a while a person skilled in the art will recognize from its connections as well as the following terminology those items which share common aspects with various embodiments above. Turning then to FIG. 8a, it shows generally a data memory 92 which may be included in a cache circuit and for receiving an address from an address conversion circuit 94, again in a manner such as that shown in FIG. 1 with respect to L2 cache circuit 14. As a more complex yet often useful implementation, data memory 92, however, includes four different banks of memories designated BANK0 through BANK3. Moreover, within each bank, the storage rows are separated into different "ways" as that term is known in the art. In the present example, assume that each such BANK is separated into four such ways and, therefore, data memory 92 is referred to as 4-way set associative.

Each of the BANKs of data memory 92 is constructed in general in a like manner, with different decoders so that each BANK may be separately addressed; thus, in total, the BANKS store a total of four times the amount of information stored in a single BANK. To better appreciate the like elements of each of the BANKs, note that like reference numerals are used for each BANK, with subscripts designating the bank to which the referenced item belongs. Looking therefore at BANK0 as an example of how each bank is constructed, it includes a top half and a bottom half, separated by a sense amplifier line $96_0$ as known in the art. Sense amplifier line $96_0$ may be energized to read information from a given way of either the top or bottom half of BANK0 and thereby output that information from data memory 92. In addition to this known configuration, however, is circuitry consistent with the above embodiments. Specifically, each half of BANK0 includes a primary row group and a spare row group. Thus, the top half of BANK0 includes a primary row group $98_{T0}$ while the bottom half of BANK0 also includes a primary row group $98_{B0}$. In the preferred embodiment, each primary row group includes 128 rows, with each row operable to store 512 bits (i.e., 64 bytes) of information. Similarly, the top half of BANK0 includes a spare row group $100_{T0}$ while the bottom half of BANK0 also includes a spare row group $100_{B0}$. In the preferred embodiment, each spare row group includes a single row, but as demonstrated above that number may be increased by a person skilled in the art. Lastly, BANK0 includes a column of row decoders $103_0$, which although not shown, includes separate decoders for each row and, therefore, includes separate decoders for each of the primary and spare rows. As mentioned above, the remaining banks of data memory 92 are constructed in the same manner as BANK0 and, therefore, one skilled in the art may readily appreciate from the like reference numerals (with differing subscripts) the relationship of the various components of those banks as well.

Figure 8B:
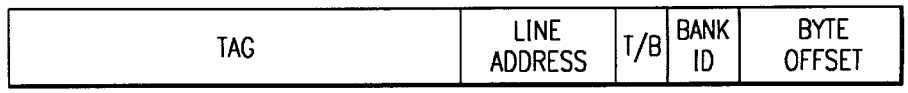

Address conversion circuit 94 in general shares a common aspect with some of the above embodiments in that it may convert an address intended for data memory 92 from an original address to a re-mapped address if the original address was directed to a defective row. However, to better appreciate this common aspect as well as the distinctions and complexities of address conversion circuit 94, it is first instructive to evaluate the preferred format of the address as received by address conversion circuit given the configuration of the memory banks of data memory 92. In this regard, FIG. 8b illustrates the format of such an address. Turning then to FIG. 8b, note generally that the address shown is a 32 bit signal and includes five portions, each of which is as follows. A first portion of the address is a byte offset, which may address one of the bytes within a row of a data memory BANK. Recall that each row stores 64 bytes. Therefore, this first portion is 6 bits wide (i.e., $2^6$=64 bytes). A second portion of the address is a bank identification ("i.d."). Recall that data memory 92 includes a total of four banks; therefore, this second portion is 2 bits wide (i.e., $2^2$=4 banks). A third portion of the address indicates, for a given bank, whether the address corresponds to the top half or the bottom half of the bank. Therefore, because the indication is only one of two possibilities, this third portion is 1 bit wide (i.e., $2^1$=2 possible halves). A fourth portion of the address is a line address. Recall that each half of each BANK of data memory 92 includes a total of 128 primary rows and, that those rows are separated into four different ways. Therefore, this fourth portion is 5 bits wide (i.e., $2^5$=32 rows*4 ways= 128 rows). A fifth portion of the address is a tag address, and which includes the remaining 17 bits of the address. This tag address is what is used to address the tag memory (not shown) corresponding to data memory 92 and, according to the preferred timing described above, which may be accomplished during the same clock cycle as the operation of address conversion circuit 94 as discussed below. Moreover, as is known in the cache art, if a hit occurs in response to the tag comparison, an indication of which "way" is hit will be output by the tag memory. Because the present example includes four possible ways, this indication will be 2 bits wide (i.e., $2^2$=4 ways). For the following discussion, this indication is abbreviated as WAY[1:0], designating a 2 bit signal indicating the particular way at issue. Lastly, for the following discussion, note that the address bits are depicted by the convention of ADDR[x:y], meaning a group of bits from the address of FIG. 8b where x is the most significant one of those bits and y is the least significant of those bits. For example, an indication of ADDR[7:6] corresponds to the address bits of bit 7 and bit 6 (i.e., the bank i.d.).

Address conversion circuit 94 includes an address input storage device 102 which receives bits ADDR[13:6] as well as bits WAY[1:0]. The output of address input storage device 102 is connected to a lower significant portion 104a of an address output storage device 104, and bits ADDR[13:9] and WAY[1:0] from that output are also connected to a first input of a comparator 106. The second input of comparator 106 is connected to receive an output from a defective row identifier block 108. Defective row identifier block 108 includes up to eight defective row identifiers $108_{R1}$ through $108_{RB}$, and each of those identifiers has a corresponding enable bit $108_{EB1}$ through $108_{EB8}$. Each row identifier $108_{R1}$ through $108_{R8}$ preferably includes seven bits represented by fuses or the like to identify an address of a defective row in data memory 92. More specifically, recall that the configuration of the four banks, each with separately addressable top and bottom halves, gives rise to eight different sets of primary row groups. Accordingly, up to one defective row for each of these bank halves may be represented in the eight defective row identifiers $108_{R1}$ through $108_{R8}$. Additionally, once a defective row is identified and encoded into one of row identifiers $108_{R1}$ through $108_{R8}$ (e.g., by blowing fuses), the corresponding enabling bit $108_{EB1}$ through $108_{EB8}$ is configured to designate that the corresponding row identifier is designating a defective row. Lastly, the output of comparator 106 is connected to provide a MATCH signal to a higher significant portion 104b of address output storage device 104.

The operation of the circuits of FIG. 8a are presented below, again with the assumption that the reader is familiar with the above examples and embodiments and, therefore, may readily appreciate the comparable steps as to those of method 50 of FIG. 5 as applied to FIG. 8a. Thus, the circuits of FIG. 8a generally follow method 50, but permit the option of having an original address directed to a primary row in a given half of a bank to be re-mapped to one spare row for the same bank when it is determined that the original address is directed to a defective primary row. In operation, therefore, during a first clock cycle, a tag memory is addressed and during the same clock cycle the address and way portions shown are loaded into register 102. Moreover, these address and way portions are copied to lower significant portion 104a of storage device 104. During the same clock cycle, bits ADDR[8:6] are connected to defective row identifier block 108. Note from FIG. 8b that these bits indicate both the bank i.d. and whether the row address at issue is from the top or bottom of the identified bank. In response, defective row identifier block 108 outputs to comparator 44 an enabling signal along with a defective row address within the half of the bank being addressed, assuming a defective row has been earlier identified in that half of the bank. Next, the portion of the original address from storage device 102 is compared by comparator 106 to the identified defective row. Again, if comparator 106 finds a match between the compared signals, it asserts the MATCH signal, thereby setting higher significant portion 104b in address output storage device 104. Conversely, if comparator 106 does not find a match (or is not enabled because there was not a defective row identified for the half of the bank at issue), the MATCH signal is not asserted and the address in output storage device 104 remains effectively unchanged. From the above, recall that lower and higher significant portions 104a and 104b are then connected to data memory 92. As a result (and assuming a tag match), in a successive clock cycle either the original address has been remapped to not address the defective row but instead to address the spare row for the addressed half of the identified bank, or an unaltered original address is connected to access one of the rows in one of the primary row groups.

From the above description of FIGS. 8a and 8b, therefore, one skilled in the art will further appreciate that the present embodiments also may include set associative memories and banking of those memories as well. Again, the number of fuses or other devices for identifying defective rows will be far less than the prior art requirements of including a fuse on each primary row as well as additional fuses to decode an address to energize a spare row. Moreover, again the location of the fuses may be centralized, leaving the memory structure to be constructed in a more efficient manner. Still further, the embodiment of FIG. 8a further demonstrates that alternative addressing formats may be modified so that an incoming original address is either left unaltered in the event that the original address is directed to a properly operating row, or may be re-mapped to a spare row if directed to a row which has been identified as defective.

While the embodiment of FIG. 8a provides still additional functions and benefits as described above, note further that it raises a timing consideration which is described below, and which is further addressed with yet additional inventive embodiments. Specifically, recall that address conversion circuit 94 receives as part of its input the bits WAY[1:0] (i.e., the way bits). Recall also that the address comparison and conversion functionality of circuit 94 is preferably performed during the same clock cycle that those way bits are produced, that is, during the same clock cycle as the address comparison with respect to the corresponding tag memory (e.g., tag memory 18 of FIG. 1). Therefore, because the tag memory comparison is what produces the way bits, the comparison operation of address conversion circuit 94 at first glance must await those bits. One approach to this timing consideration is to ensure that the clock period in which the tag comparison occurs is made long enough to, as a first event, produce the way bits and then, as a second event, begin the address comparison and allow address conversion circuit 94 to make its conversion if such is necessary for a given address. However, below are provided additional approaches which also address this consideration without requiring the second event (i.e., use of the way bits to begin comparison for address conversion) to necessarily follow after the first event (i.e., tag comparison) is complete.

As a first approach to the above timing consideration of the way bits relative to the address comparison of address conversion circuit 94, note that the embodiment of FIG. 8a could be modified to partially resemble that of FIG. 7, above. Particularly, recall that the embodiment of FIG. 7 allows a block of rows to be identified by defective block identifier circuit 90 and, if an incoming address is directed to any row within the identified block, then the address is remapped to a block of spare rows. In a comparable manner, therefore, the embodiment of FIG. 8a may be modified such that each indication of a defective row of a top or bottom half of a BANK instead identifies a defective block of four rows within a top or bottom half of a BANK, and where those four rows correspond to each of the four ways. In this instance, when an incoming address is received (i.e., ADDR[13:6]), it is only required to determine whether the address falls within one of four rows in the block of four ways. Thus, the way bits need not be compared again the defective block identifier. In other words, like storage device 42 of address conversion circuit 22 in FIG. 7, two less bits would be required for the comparison based on the value from storage device 102 in address conversion circuit 94 of FIG. 8a; in the example of this modification to FIG. 8a, these two bits removed from the comparison would be bits WAY[1:0]. Therefore, in this alternative, since the way bits are not required for the comparison, the modified address conversion circuit 94 may begin its comparison as soon as the ADDR[13:6] bits are received and without having to wait for the way bits. As a result, the timing consideration raised above is eliminated.

As a second approach to the timing consideration of the way bits relative to the address comparison of address conversion circuit 94, the bits ADDR[13:6] could be used to make a preliminary comparison against the corresponding bits of a defective block, and thereafter once the way bits become available they may be used given the result of the preliminary comparison from the bits ADDR[13:6]. In this regard, FIG. 9 illustrates a schematic of an alternative address conversion circuit 94a to implement this function for interaction with data memory 92 of FIG. 8a. Note that to demonstrate the comparability of FIGS. 9 and 8a, like reference numerals are used for like items, and the letter "a" is added to the reference numerals for those circuits in circuit 94a which are comparable, but differ from, the counterparts of circuit 94 in FIG. 8a. Turning to circuit 94a, again address bits ADDR[13:6] are an input, but here are connected to an input storage device 102a which does not receive bits WAY[1:0] as does storage device 102 of FIG. 8a. Storage device 102a outputs bits ADDR[13:9] to a comparator 106a, and bits ADDR[13:6] to a second portion 110b of an output storage device 110. Address bits [8:6] are also inputs to address conversion circuit 94a, and are connected to a defective row identifier block 108 in the same manner as in FIG. 8a. Again, defective row identifier block 108 has eight rows, with each row operable to store a 7 bit address of a defective row and a corresponding enable bit, where each of the defective rows is in a different top or bottom half of a different one of the BANKs in data memory 92 of FIG. 8a.

With respect to the connections to the output of defective row identifier block 108, note that they differ from that of FIG. 8a. Specifically, in FIG. 9, the five most significant bits of each defective address (shown as DA[6:2]) are connected to comparator 106a. However, the two least significant bits of each defective address (shown as DA[1:0]) are connected to a 2-to-4 decoder 112. As better appreciated below, these two least significant bits DA[1:0] identify the one of four ways in which the defective row identified by defective row identifier block 108 is located. The 2-to-4 decoder 112 operates as known in the decoding art, that is, to produce a unique 4 bit output for each different 2 bit input. Moreover, because the two bit input identifies one of four ways, note further that each unique 4 bit output then corresponds to one of these ways as shown below. To establish a convention to facilitate the remaining discussion, Table 2, below, demonstrates the 4 bit output corresponding to each 2 bit input for 2-to-4 decoder 112.

TABLE 2

| input (DA[1:0]) | output |
|---|---|
| 00(way 0) | 0001 |
| 01(way 1) | 0010 |
| 10(way 2) | 0100 |
| 11(way 3) | 1000 |

The four outputs of 2-to-4 decoder 112 are each connected to a respective first input of an AND gate $114_0$, $114_1$, $114_2$, and $114_3$. For consistency, note that the subscript of each of these AND gates relates the AND gate to the one of the 4 ways identified by bits DA[1:0] from Table 2. For example, if bits DA[1:0] equal 00, then they are identifying way 0 and AND gate $114_0$ receives a high input. As another example, if bits DA[1:0] equal 11, then they are identifying way 3 and AND gate $114_3$ receives a high input. The second input of each of AND gates $114_0$, $114_1$, $114_2$, and $114_3$ is connected to the MATCH signal which is output by comparator 106a. Given Table 2, above, one skilled in the art will appreciate that if MATCH is asserted, then one of the four AND gates $114_0$, $114_1$, $114_2$, and $114_3$ outputs a high signal while the remaining three AND gates output a low signal. Of course, if MATCH is not asserted, then the output of all four AND gates $114_0$, $114_1$, $114_2$, and $114_3$ remains low. The purpose of these resulting signals is better appreciated below.

Address conversion circuit 94a also receives as inputs a HIT signal for each of the 4 ways as resulting from the corresponding tag memory; in FIG. 9, therefore, these signals are labeled as W0 for way 0 through W3 for way 3. More specifically, in the event that the tag memory detects a match between an incoming address and one of its stored tag addresses, it asserts a HIT on one of the four signals W0 through W3. Note that each of these signals is respectively connected to a first input of an AND gate $116_0$, $116_1$, $116_2$, and $116_3$ and, again, for consistency, the subscript of each of these AND gates relates the AND gate to the way to which it is associated. For example, AND gate $116_0$ may receive a HIT signal from the W0 input, AND gate $116_1$ may receive a HIT signal from the W1 input, and so forth. The second input of each of the AND gates $116_0$, $116_1$, $116_2$, and $116_3$ is connected to the respective output of AND gates $114_0$, $114_1$, $114_2$, and $114_3$.

In addition to connecting to AND gates $116_0$, $116_1$, $116_2$, and $116_3$, note also that the four inputs for providing way HIT signals are also connected as inputs to a 4-to-2 encoder 118. Encoder 118 operates in reverse fashion as 2-to-4 decoder 112 described above, that is, if it receives a 4 bit signal indicating a hit in one of the 4 ways, in response it outputs a unique 2 bit signal encoding which of the ways is hit. Again, to establish a convention for subsequent discussion, Table 3, below, demonstrates each 4 bit input and resulting 2 bit output for 4-to-2 bit encoder 118.

TABLE 3

| input W0W1W2W3 | output |
|---|---|
| 1000 | 00 |
| 0100 | 01 |
| 0010 | 10 |
| 0001 | 11 |

The 2 bit output of encoder 118 is connected to a first portion 110a of output storage device 110.

The outputs of AND gates $116_0$, $116_1$, $116_2$, and $116_3$ are connected to inputs of a 4 input OR gate 120. The output of OR gate 120 is connected to a third portion 110c of output storage device 110. Thus, one skilled in the art will appreciate that if any of AND gates $116_0$, $116_1$, $116_2$, and $116_3$ asserts their output, then OR gate 120 also asserts its output thereby setting bit R in output storage device 110. This setting of bit R, as in the embodiment of FIG. 8a, causes the incoming address to be re-mapped to a spare row within data memory 92.

In operation, address conversion circuit 94a provides an address to data memory 92 of FIG. 8a and, like address conversion circuit 94 of FIG. 8a, again either re-maps an incoming address to a spare row if the incoming address is directed to a row identified as a defective row or effectively does not alter the incoming address and permits it to address a primary row within data memory 92 if the incoming address is not directed to a defective row. However, recall also at the outset that the embodiment of FIG. 9 reduces the timing considerations between the address comparison operation and the determination of a hit in one of the four ways of the tag memory corresponding to data memory 92. Given this introduction, the operation of address conversion circuit 94a commences again with the receipt of an incoming address, with bits ADDR[13:6] connected to input storage device 102a and bits ADDR[8:6] connected to defective row identifier block 108. In response to ADDR [13:6], bits ADDR[13:9] are connected to one input of comparator 106a and bits ADDR[13:6] are connected to second portion 110b of output storage device 110. In response to ADDR[8:6], one row of defective row identifier block 108 is addressed. If the incoming address corresponds to a memory BANK having a defective row in the BANK half addressed by the incoming address, then defective row identifier block 108 outputs DA[6:2] to a second input of comparator 106a along with an enable bit to enable the next comparison steps, and it also outputs DA[1:0] to 2-to-4 decoder 112. On the other hand, if the incoming address does not correspond to a memory BANK having a defective row in the half addressed by the incoming address, then no defective address is output by defective row identifier block 108 and the comparison is not enabled (e.g., by outputting a low enable bit); therefore, ultimately the incoming address will be output to data memory 92 without being altered. To detail the remaining operation of circuit 94a, however, assume that the incoming address caused the output of a comparison enable bit and a stored defective row address which cause the additional operations set forth below.

Two different actions occur in response to the defective row address output by identifier block 108. As one action, in response to DA[1:0], 2-to-4 decoder 112 outputs 4 bits according to Table 2, above. For the current example, assume that DA[1:0] correspond to way 1; therefore, 2-to-4 decoder 112 outputs the bit sequence 0010 to AND gates $114_3$ through $114_0$, respectively. As another action, in response to DA[6:2], comparator 106a compares these bits with bits ADDR[13:9] from the incoming address. Because the way bits are not yet being compared, note therefore that the comparison by comparator 106a determines whether the currently compared bits from the incoming address are directed to a block of four rows wherein one of those four rows (i.e., four ways) is defective. If no correspondence is found, then a low signal is connected from comparator 106a to each of AND gates $114_3$ through $114_0$ and, therefore, each of those AND gates outputs a low signal. In this event, each of AND gates $116_3$ through $116_0$ also necessarily outputs a low signal to OR gate 120 which, in response, does not set the R bit in third portion 110c of output storage device 110. As with earlier embodiments, therefore, if the most significant bit (i.e., bit R) is not set, then ultimately the incoming address is output to data memory 92 without effectively being altered and the primary row in data memory 92 which is addressed by the incoming address may then be accessed using the unaltered address. On the other hand, if correspondence between DA[6:2] and ADDR[13:9] is found, then MATCH is asserted having the effect described below.

An asserted MATCH signal connects a logic high to a first input of each of AND gates $114_3$ through $114_0$. Recall also that 2-to-4 decoder 112 has output a logic high at one of its outputs and, therefore, this high is connected to one of the second inputs of AND gates $114_3$ through $114_0$ while each of the other three of those AND gates receives a logic low at their second inputs. In the current example, recall that the logic high from decoder 112 corresponds to way 1 and, thus, AND gate $114_1$ receives logic highs at both of its inputs while each of the other three AND gates $114_0$, $114_2$, and $114_3$ receives a logic high (i.e., asserted MATCH) at one input and a logic low at another input. Based on these inputs signals, AND gate $114_1$ outputs a high signal while each of AND gates $114_0$, $114_2$, and $114_3$ outputs a low signal. Each of the output signals from AND gates $114_0$ through $114_3$, respectively, is connected to a first input of a corresponding one of AND gates $116_0$ through $116_3$ as further described below.

Given the above, provided that the incoming address is directed to a group of four rows (each corresponding to a different way) where one of those rows is identified as by block 108 as defective, then a first input to one of AND gates $116_0$ through $116_3$ is a logic high. In the current example, this first input is that to AND gate $116_1$ since it is way 1 which is the way having the defective row as identified by bits DA[1:0] and decoded by decoder 112. At this point, recall that each of the way HIT signals, respectively, is connected to a second input of a corresponding one of AND gates $116_0$ through $116_3$; thus, it is only at this point in the currently described operational steps that the value of the HIT signals need be available. In other words, the steps preceding the operation of AND gates $116_0$ through $116_3$ may be carried out at the same time that the tag memory is generating one of the HIT signals corresponding to one of the four ways. As a result, the timing issues discussed after the description of FIG. 8a above are greatly relieved in that the way bits are not required to begin the operation of address comparison circuit 94a. Once these way bits are available, they are logically ANDed by AND gates $116_0$ through $116_3$ with the results from logic AND gates $114_0$ through $114_3$, one of which is high if the incoming address is directed to a group of four rows wherein one of those rows is identified as defective.

The result of the operation of each of logic AND gates $116_0$ through $116_3$ finalizes the determination of whether the incoming address is directed to the defective row identified by block 108. Specifically, recall that at most only one output of logic AND gates $114_0$ through $114_3$ is high. Thus, for the output of any of logic AND gates $116_0$ through $116_3$ to be high, it must both receive the one high output from the one of logic AND gates $114_0$ through $114_3$ and also receive an asserted HIT signal from the corresponding one of the ways W0 through W3. Continuing with the present example, therefore, the outputs of each of logic AND gates $114_0$, $114_2$, and $114_3$, are low; thus, the outputs of corresponding logic AND gates $116_0$, $116_2$, and $116_3$ are also low. However, with respect to logic AND gate $116_1$, the logic high it receives from logic AND gate $114_1$ is ANDed with W1 HIT input. Therefore, if the W1 HIT is asserted, meaning the incoming address is addressing way 1, then the output of logic AND gate $116_1$ is also high. On the other hand, if the incoming address is not addressing way 1, then the HIT signal at W1 is not asserted and, therefore, the output of logic AND gate $116_1$ is low.

From the above, one skilled in the art will appreciate that at this point of operation either the outputs from all of logic AND gates $116_0$ through $116_3$ are low or, at most, one of those outputs is high. This latter event occurs after each of the previous determinations have tested affirmative, that is, once it is determined that the incoming address is directed to a defective row identified by block 108. Also given these previous affirmative determinations, there is one logic high output from one of logic AND gates $116_0$ through $116_3$ and it causes the output of logic OR gate 120 also to go high, thereby setting bit R in the third portion 110c of output storage device 110. In opposite fashion, note also the effect if a way other than W1 were being addressed by the incoming address in the current example. In this instance, although AND gate $116_1$ were receiving a high from AND gate $114_1$ at one of its inputs, the other of its inputs would receive a logic low. Therefore, the output of AND gate $116_1$ would be low, causing the output of OR gate 120 to be low and, thus, not setting bit R in output storage device 110.

In addition to the operation of logic AND gates $116_0$ through $116_3$ based on the W0 through W3 HIT signals, note also that these signals are encoded by 4-to-2 encoder 118 according to Table 3 by way of example. Thus, in the present example where way 1 is being addressed, encoder 118 outputs a value of 01. Once the 2 bit encoding is complete, this output value is connected to the first portion 110a of output storage device 110. Therefore, the output of encoder 118 corresponds to the least two significant bits of the incoming address.

Once each of the above steps are performed, again the entire address in output storage device 110 is connected to data memory 92. As in the manner of FIG. 8a, therefore, if bit R is set, the address has been remapped to a spare row address for the appropriate half of the appropriate memory BANK. Also as in the manner of FIG. 8a, if bit R is not set, the address is effectively unaltered and will address a non-spare row in the appropriate half of the appropriate memory BANK.

Figure 10A:
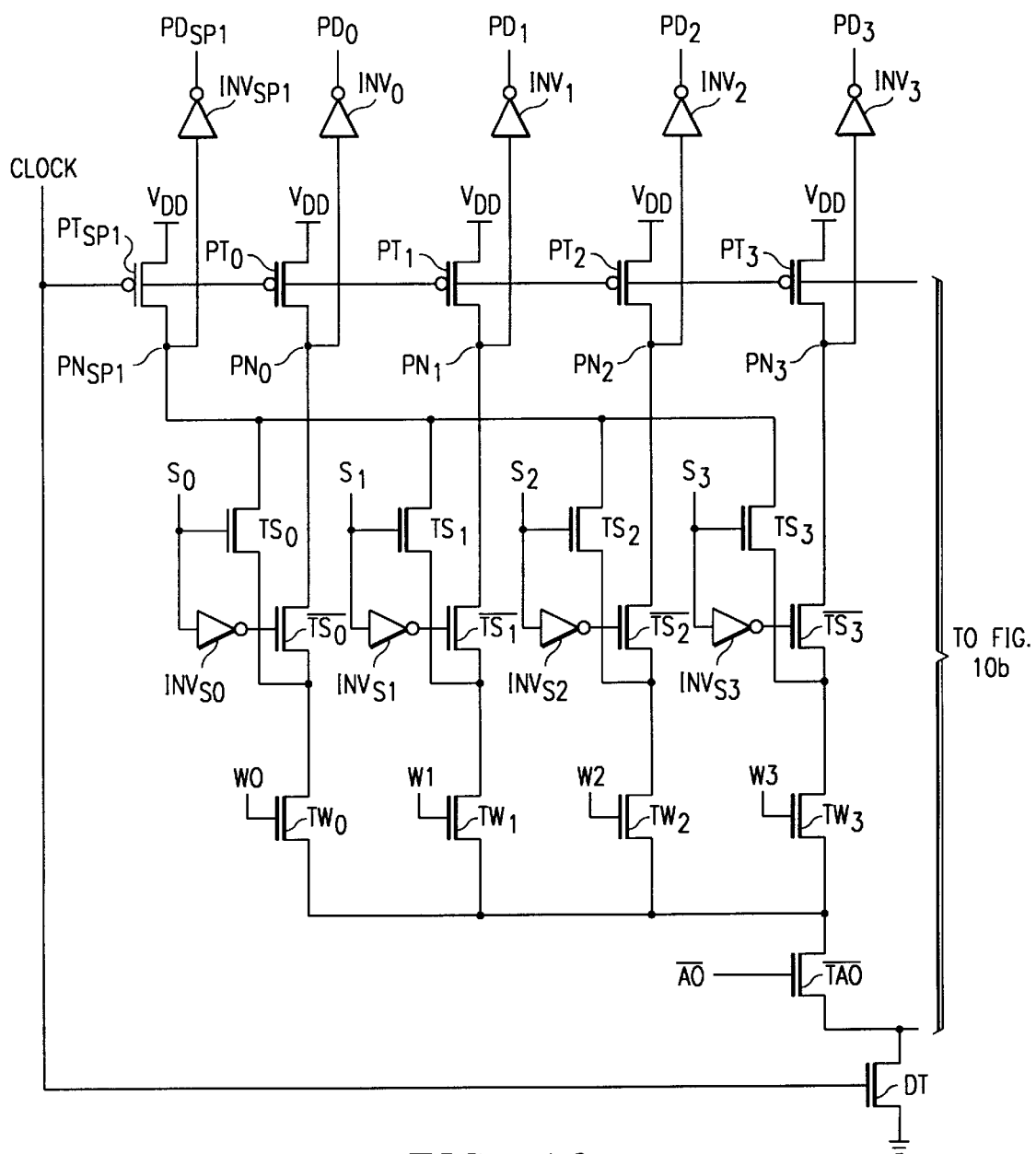
FIGS. 10a and 10b illustrates a dynamic logic decoding circuit for implementing various features of the block diagram of FIG. 9.
Figure 10B:
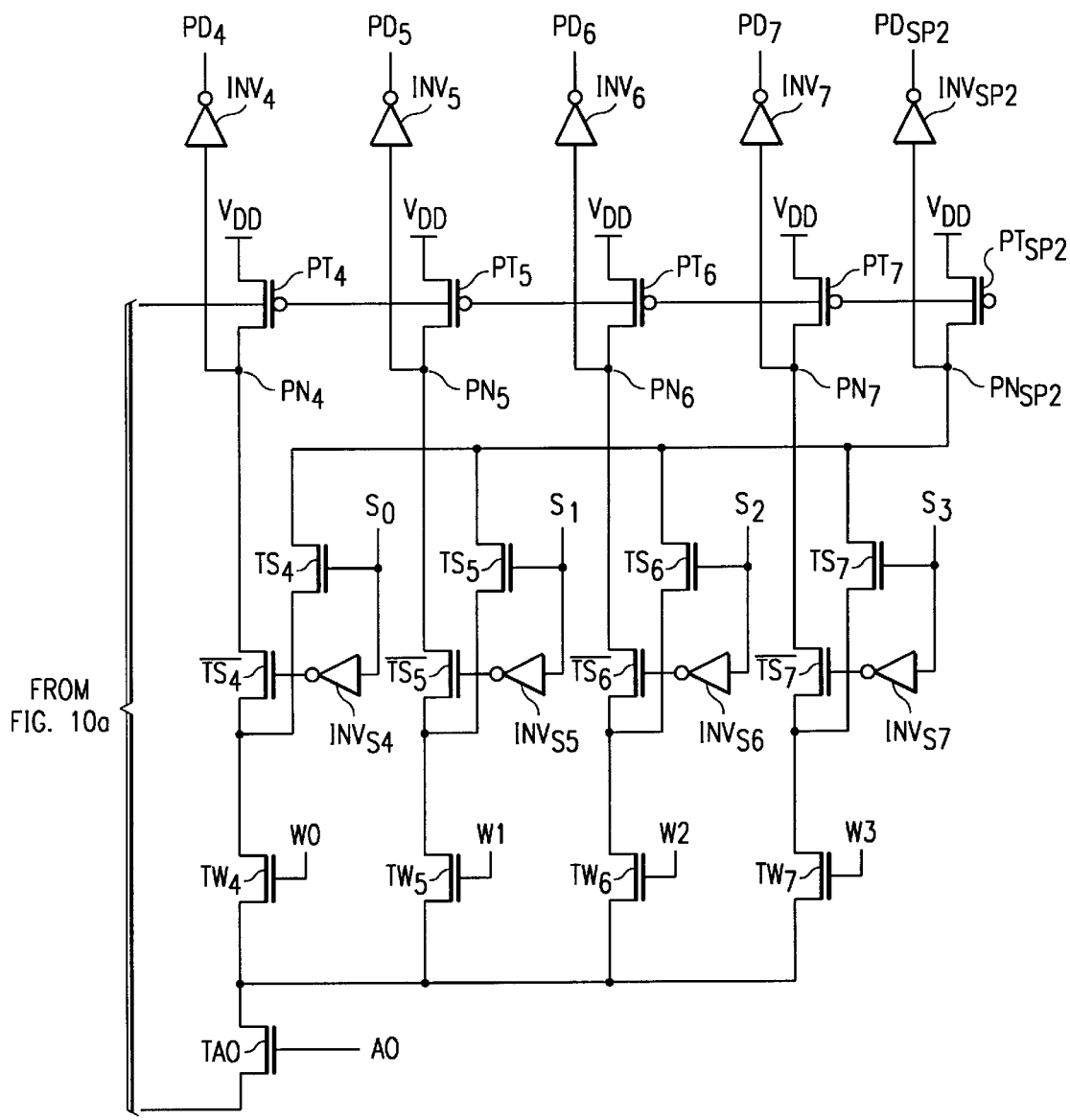

Given an understanding of the improvements provided by the embodiment of FIG. 9, FIGS. 10a and 10b provide a schematic implementing various of the concepts of FIG. 9 and provides still additional benefits as well. Before detailing the structure of FIGS. 10a and 10b, some introductory comments are instructive. When addressing rows in a data memory, various decoding techniques have arisen to receive an N bit address and decode it to one of $2^N$ rows. For example, given 236 rows, one approach is to include a transistor network requiring each of eight address bits to be connected to each row, where the network requires eight transistors in series at each row. As a more efficient alternative, it is known in the art that for a row array having a large number of rows (e.g., 256), multiple decoders may be used at a given level to avoid the need for an extensive level of decoding at each row. Continuing with the example of 256 rows, therefore, a first level could include three decoders, with a first decoder being a 2-to-4 decoder, and a second and third decoder being 3-to-8 decoders. Thus, by following through the three decoders, an address ultimately may reach one of 256 locations. Given this multiple decoder technique, the schematic of FIGS. 10a and 10b further demonstrates how various of the concepts from FIG. 9 may be included within one such decoder, thereby further improving timing considerations with respect to both address conversion circuit 94a as well as its corresponding data memory (e.g., data memory 20 in FIG. 1).

Turning to FIGS. 10a and 10b, they provide a 3-to-8 decoder designated generally at 122. Across the top of decoder 122 are eight outputs, designated $PD_0$ through $PD_7$, and corresponding to a primary row. In other words, upon decoding a three bit signal to one of eight possibilities, then under operation where a primary row is to be addressed, one of these eight outputs is asserted. In addition, however, decoder 122 also includes two spare row indicators designated $PD_{SP1}$ and $PD_{SP2}$. As demonstrated below, when a spare row is to be addressed, then one or the other of these spare row outputs is asserted rather than one of the primary row outputs. Moreover, because decoder 122 is a 3-to-8 decoder, it may be combined with other decoders to address a total of 256 rows (or some other multiple of 8).

Looking to decoder 122 in greater detail, the three levels of input conditions include A0 and its complement $\overline{A0}$, W0 through W3, and S0 through S3. For reasons more clear below, W0 through W3 correspond to the same named signals from FIG. 9, that is, the way HIT signals coming from the tag memory. Also for reasons discussed below, S0 through S3 correspond to the outputs of logic AND gates $114_0$ through $114_3$ of FIG. 9 and, therefore, represent an indication of the way identified by the stored defective row identifier if the present incoming address is addressing the block of rows which includes that defective row. Lastly, note that A0 and its complement merely represents some third address bit at issue. For the present example, assume that A0 corresponds to ADDR[8] and, thus, indicates whether the incoming address is directed to the top half or bottom half of a given one of the BANK memories in data memory 92 of FIG. 8a. Thus, outputs $PD_0$ through $PD_3$ could be energized to address the top half of one of those BANK memories, while $PD_4$ through $PD_7$ could be energized to address the bottom half of one of those BANK memories. In this regard, therefore, $PD_{SP1}$ would likewise be energized to address the spare row for the top half of one of those BANK memories, while $PD_{SP2}$ would likewise be energized to address the spare row for the bottom half of one of those BANK memories.

Decoder 122 is constructed as a dynamic logic circuit and thus is precharged during a first phase and evaluates (i.e., conditionally discharges) during a second phase following the first phase. In this regard, each output has a corresponding precharge node PN, charged through a corresponding clocked precharge transistor PT to $V_{DD}$, and connected to the input of a corresponding inverter INV. To simplify the illustration, each such node, precharge transistor, and inverter uses the same subscript as its corresponding output. Each PN is connected to three transistors which, if all conducting, connect the PN to a discharge transistor DT. Thus, once DT is conducting due to the high clock signal, then a PN is connected to ground if each of the three transistors connecting a PN to DT is also conducting.

To uniquely identify the upper two of the three transistors which connect a PN to DT, each of the two transistors is indicated by combining the letter "T" with the capital letter corresponding to the input signal for the transistor, and also by including a subscript corresponding to the output of which the transistor is connected to via its series connection. As a further distinction, some transistor names are indicated with a horizontal bar over the identifier where the signal input to the transistor is the complement of another transistor which does not include the horizontal bar over its identifier. To demonstrate these conventions, consider the following example which traces from output $PD_0$ to DT. Thus, $PD_0$ is connected through an inverter having a similar subscript, $INV_0$. The input to $INV_0$ may be connected to DT via three transistors. The first of these transistors is $\overline{TS_0}$ (having an S input, where the complement of that input is used for transistor $TS_0$). The second of these transistors is $TW_0$ (having a W input). Lastly, note that this second transistor is connected to transistor $\overline{TA0}$, which is named by combining the "T" with the identifier of its input signal, and including a horizontal bar over the same name because the complement of that input is used for transistor TA0.

Having introduced the identifier conventions used in FIGS. 10a and 10b, note further that any of the primary row outputs will go high if its corresponding "W" and "A" inputs are high, but the corresponding "S" input must be low since it is the complement of the "S" signal which connects to a gate of a transistor in each discharge path for a primary row input. For example, with respect to precharge node $PN_3$, it may conduct through transistor $\overline{TS_3}$, through transistor $TW_3$, and through transistor $\overline{TA0}$ to transistor DT. Thus, if DT is also conducting, then $PN_3$ is discharged to ground. Conversely, therefore, for either of the two spare row outputs to go high, again its corresponding "W" and "A" inputs must be high, as must be the corresponding "S" input as well. For example, with respect to precharge node $PN_{SP1}$, it may conduct through any pair of transistors having a corresponding high S and W input to transistor DT. Thus, if DT is also conducting, then $PN_{SP1}$ is discharged to ground.

The operation of decoder 122 is as follows, and the discussion below assumes an understanding of the earlier embodiments. During the precharge phase, the CLOCK signal shown in FIGS. 10a and 10b is low and, thus, each of the ten shown PNs precharges to a logic high signal (i.e., $V_{DD}$). Consequently, each of the ten outputs across the top of FIGS. 10a and 10b is a logic low. During the evaluate phase, the CLOCK signal transitions high, thereby disconnecting each PN from $V_{DD}$ while also allowing DT to conduct. At this point, only one of the PNs discharges given the input signals to decoder 122. To better illustrate this operation, assume two examples, the first of which addresses a row which is not within a block of rows including a defective row and the second of which addresses a spare row, each of which is detailed below.

For a first operational example of decoder 122, a primary row (as opposed to a defective row) is addressed. Note therefore the following characteristics of the inputs during the precharge phase. First, either A0 or its complement is asserted as is one of the four way bits W0 through W3. Second, because the row being addressed is not within a block of rows including a defective row, then MATCH is not asserted in FIG. 9. Consequently, each value of S0 through S3 (i.e., each of the outputs of AND gates $114_0$ through $114_3$) is low. In FIGS. 10a and 10b, therefore, each of transistors $\overline{TS_0}$ through $\overline{TS_7}$ conducts. Given the above, assume as an example that A0 is high and way 1 is being addressed by the incoming address (i.e., W1 is high while W0, W2 and W3 are low). Consequently, during the evaluate phase, the following four transistors conduct (1) DT; (2) TA0; (3) $TW_5$; and (4) $\overline{TS_5}$. In response, therefore, $PN_5$ discharges and output $PD_5$ transitions from low to high while the remaining outputs of decoder 122 remain low. Thus, this output may then be used directly, or in combination with the operation of other decoders, to energize the appropriate primary row in data memory 92.

For a second operational example of decoder 122, a defective row is addressed. Note therefore the following characteristics of the inputs during the precharge phase. First, either A0 or its complement is asserted as is one of the four way bits W0 through W3. Second, because the row being addressed is within a block of rows including a defective row, then MATCH is asserted in FIG. 9. Consequently, one of S0 through S3 is high while the other three of S0 through S3 are low. In FIGS. 10a and 10b, therefore, two of the eight transistors $TS_0$ through $\overline{TS_7}$ conduct. Given the above, assume as an example that $\overline{A0}$ is high, way 2 is being addressed by the incoming address, and that the stored defective row address indicates that the defective row is in way 2 as well (i.e., S2 is high). Consequently, during the evaluate phase, the following four transistors conduct (1) DT; (2) $\overline{TA0}$; (3) $TW_2$; and (4) $TS_2$. In response, therefore, $PN_{SP1}$ discharges and output $PD_{SP1}$ transitions from low to high while the remaining outputs of decoder 122 remain low. Thus, this output may then be used directly, or in combination with the operation of other decoders, to energize the appropriate spare row in data memory 92. Note further that the example immediately above assumes that the way HIT (i.e., W2) matched the stored defective way (i.e., asserted S2). To further illustrate the operation, however, assume the same signals as immediately above but assume further that the incoming address caused a way HIT to way 3 (i.e., asserted W3) while the defective identified row is again in way 2 (i.e., S2 asserted). In this case, therefore, a primary row rather than a spare row is to be addressed. Toward this end, and given these input signals, note that S2 being asserted again causes $TS_2$ (and $TS_6$), which is connected to address a spare row, to conduct. However, because W2 is not asserted (instead, W3 is being asserted), then $TW_2$ does not conduct and hence no discharge path is caused between $PN_{SP1}$ and ground. Therefore, the output at $PD_{SP1}$ remains low. Instead, again given that S2 and W3 are asserted, a discharge path is created from output $PD_3$ to ground, because each of the following transistors are conducting: (1) DT; (2) $\overline{TA0}$; (3) $TW_3$; and (4) $\overline{TS_3}$. In his instance, therefore, the $PD_3$ output may then be used directly, or in combination with the operation of other decoders, to energize the appropriate primary row in data memory 92.

Figure 11:
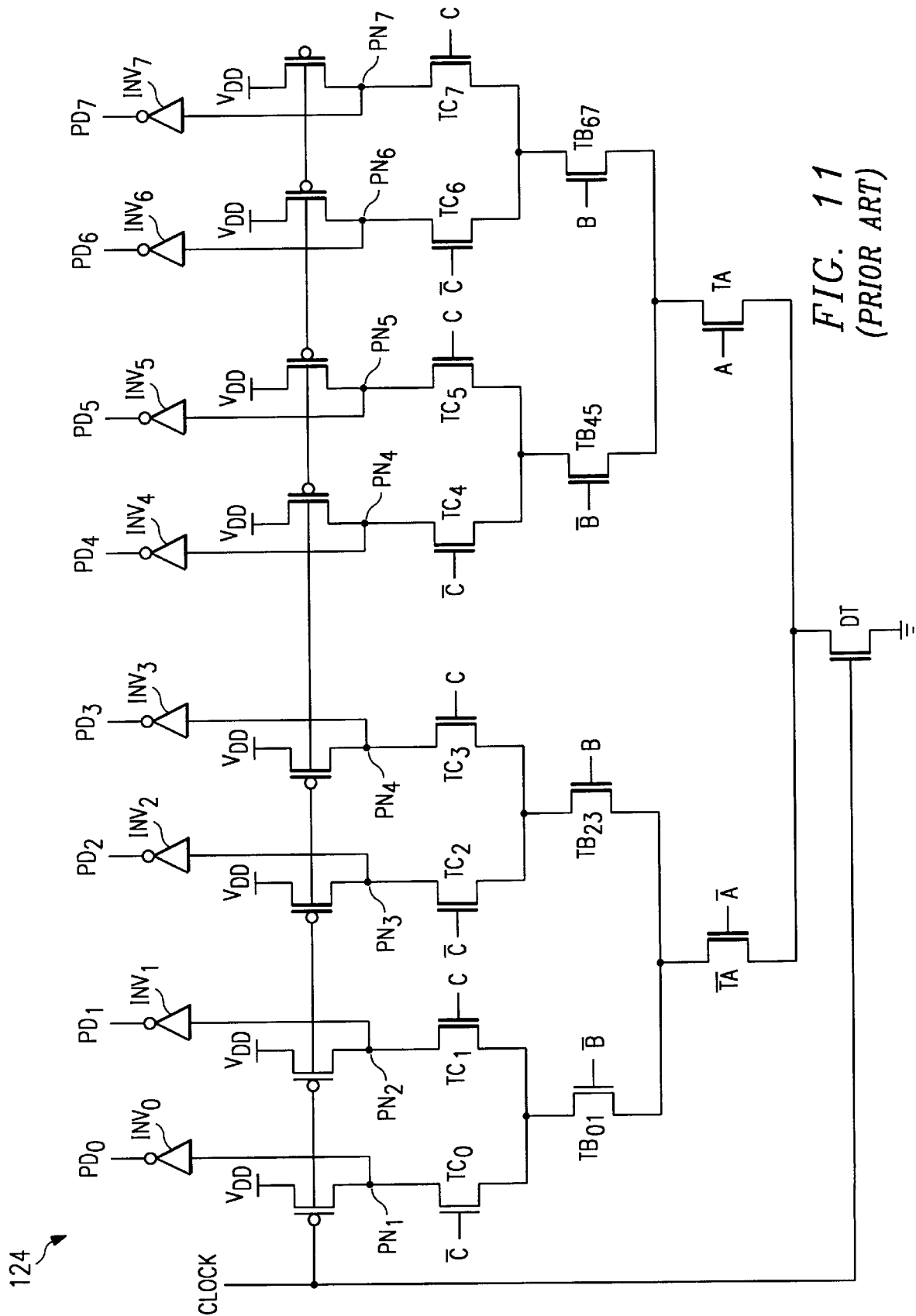
FIG. 11 illustrates a prior art 3–8 decoding circuit to contrast an additional benefit of the inventive dynamic logic decoding circuit of FIGS. 10a and 10b.

As a final demonstration of the benefits of decoder 122, FIG. 11 shows by way of contrast a prior art 3–8 decoder 124. As will be appreciated by one skilled in the art, the three inputs to decoder 124 are signals A, B, and C. Thus, based on a combination of those input signals, one of the eight outputs $PD_0$ through $PD_7$ is asserted once DT is enabled. In other words, upon discharge, one of the precharge nodes $PN_0$ through $PN_7$ is discharged, and that discharged node is inverted by a corresponding inverter $INV_1$ through $INV_7$, thereby causing the corresponding output to transition from low to high. Given this operation, note that the discharge path for any valid output is four transistors long, that is, a discharge occurs only in response to a conducting series connection which includes four transistors.

Having illustrated the prior art decoder 124 of FIG. 11, note now that the discharge path of the inventive decoder 122 of FIGS. 10a and 10b also requires series connection which includes four transistors and, therefore, decoder 122 of the present inventive embodiment operates with approximately the same delay as decoder 124 of the prior art. Note that this comparable speed is achieved while decoder 122 provides the additional functionality of potentially activating a spare row. In other words, the delay of decoder 122 of the preferred embodiment to decode an address and activate the appropriate wordline is not appreciably increased by implementing the row redundancy features discussed above. Lastly, with respect to the timing of operation for decoder 122 to discharge a spare row node (i.e., either $PD_{SP1}$ or $PD_{SP2}$), note that the connection of each of those spare row nodes is to four n-channel transistors whereas the precharge nodes of decoder 124 each connect to only a single n-channel transistor. Thus, the former may have a slightly longer delay to due this extra diode capacitance. However, this delay may well be offset due to a faster response of the subsequent spare row decoder (as opposed to a non-spare row decoder) because, as discussed earlier, the spare row decoder is required to evaluate a lesser number of total bits as compared to the decoders for the non-spare rows.

From the above, it may be appreciated that the above embodiments provide various alternatives for improving memory row redundancy. Numerous advantages have been set forth or apparent from the above. Still further, note that while the above examples are described in connection with addressing a memory row to read information from that memory row, many of the same above embodiments and principles apply equally, or with slight modification as ascertainable by a person skilled in the art, to addressing a memory row for purposes of writing information to that row. Thus, this alternative is clearly also within the inventive scope. Therefore, while the present embodiments have been described in detail, and various substitutions, modifications or alterations also have been suggested, still further variations could be made to the descriptions set forth above without departing from the inventive scope.

2. Memory Column Redundancy

Figure 12:
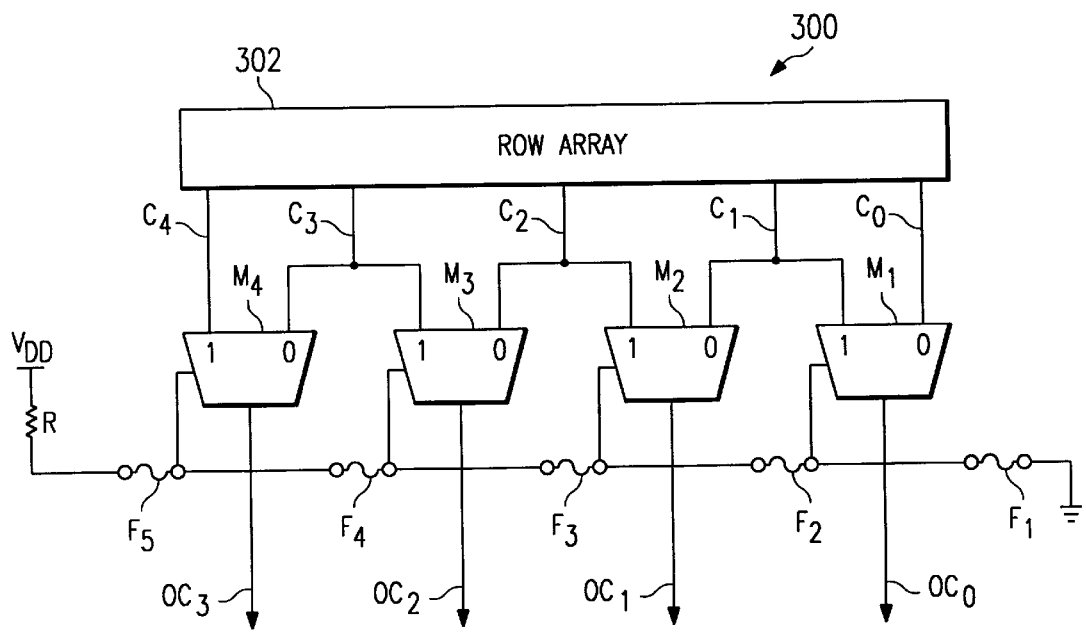
FIG. 12 illustrates an electrical diagram of a prior art memory configuration having a row array which outputs data signals along a series of columns including a single redundant column, and further including a multiplexer configuration controlled by fuses corresponding to each such multiplexer to exclude a defective one of the memory columns from being output from the configuration.

As mentioned in the above Background, fuses are used in the prior art for implementing column redundancy in memories. In this regard, and as a further introduction to the following inventive embodiments, FIG. 12 illustrates a prior art memory configuration designated generally at 300. Configuration 300 includes a row array 302 which may be constructed according to various techniques known in the art and to include a group of memory rows. Thus, in operation, one of the memory rows is energized to access the row and the information from the energized row is output along a series of memory columns. Note further that the memory columns are merely a representation of column bits output from a sense amplifier included within the memory. In actuality, often the memory includes a number of physical columns which is some multiple of the number of column output bits. For example, a memory with 256 physical columns may connect those physical columns through multiplexers such that only 64 bits of the bits on those 256 physical columns are output by the sense amplifier at a time. Of course, other examples are also known in the art. In any case, for purposes of this document, the term memory columns is a representation of a number of bits output from the memory in a sense which corresponds to the actual physical columns of the memory, where those physical columns typically connect to a sense amplifier for outputting those bits. Given this background, in the example of FIG. 12, there are a total of five such memory columns designated $C_0$ through $C_1$. In practice, the actual number of memory columns may be considerably larger than five (e.g., 257, 513, or more), but only five are included in the current example to simplify the illustration and discussion. As better appreciated below, in operation the digital signals from all but one of these memory columns is thereafter output from configuration 300, with the one memory column for which its information is not output typically being a defective column (or a column excluded from the output for some other reason).

The digital information output from configuration 300 is provided along a series of output columns numbering one less than the number of memory columns, and designated $OC_0$ through $OC_3$. Each output column is connected to the output of a corresponding two-input multiplexer $M_1$ through $M_4$. The two inputs of each of multiplexers $M_1$ through $M_4$ are connected to a pair of successive memory columns, starting with a first pair of successive memory columns $C_0$ and $C_1$ connected to the input of multiplexer $M_1$, and with each ascending numbered multiplexer connected to a next pair of successive memory columns, where this next pair of successive memory columns shares the higher ordered output column of the preceding pair of memory columns. For example, ascending after multiplexer $M_1$ is multiplexer $M_2$, and the inputs of multiplexer $M_2$ are connected to memory columns $C_1$ and $C_2$ (with $C_1$ being the higher ordered of the preceding column pair of $C_1$ and $C_0$). One skilled in the art will appreciate that this connection pattern continues through multiplexer $M_4$, with the inputs of multiplexer $M_4$ connected to memory columns $C_3$ and $C_4$. Finally, to facilitate a discussion below of the operation of each of multiplexers $M_1$ through $M_4$, note that both a "0" and a "1" are shown in the illustration of each multiplexer, with it intended to represent that a logic high (i.e., logic 1) at the control input of the multiplexer causes it to select the input adjacent to the "1" on the Figure while a logic low (i.e., logic 0) at the control input of the multiplexer causes it to select the input adjacent to the "0" on the Figure. For example, a logic 0 at the control input of multiplexer $M_1$ causes it to select the input from memory column $C_0$ and, therefore, output the signal from that input to output column $OC_0$.

Configuration 300 includes additional connections in connection with fuses so as to implement column redundancy. These fuses are preferably some type of laser configurable fuse or the like which may be configured after array 302 and its output columns are tested in order to isolate a defective column as described in greater detail below. Turning then to the fuses, configuration 300 includes a first fuse $F_1$ connected between the control input of multiplexer $M_1$ and ground. After fuse $F_1$, an additional fuse is connected between the control input of each successive multiplexer. For example, a fuse $F_2$ is connected between the control input of multiplexer $M_1$ and the control input of multiplexer $M_2$. This pattern also continues through fuse $F_4$ connected between the control input of multiplexer $M_3$ and the control input of multiplexer $M_4$. Additionally, one additional fuse $F_5$ is connected between the control input of multiplexer $M_4$ and a resistor R connected to some source of voltage (shown as $V_{DD}$ in FIG. 12). Lastly, note that while a resistor R is shown in FIG. 12, typically a more complicated circuit is implemented to avoid dissipating static power either before one of the fuses $F_1$ through $F_5$ is broken, or where it is determined that none of the fuses $F_1$ through $F_5$ need be broken. In any event, the resistive function is not particularly germane to the following discussion and, therefore, is simplified as a single resistor in FIG. 12.

The operation of configuration 300 in the context of column redundancy is as follows. First, after configuration 300 is constructed, each memory column which is accessible from output columns $OC_0$ through $OC_3$ is tested, using known techniques, to determine whether any one of those memory columns cannot transfer the information as originally intended. For purposes more dear below, memory column $C_4$ is the redundant column thereby leaving memory columns $C_0$ through $C_3$ to be tested in this regard. Second, if one of the tested memory columns is determined to be defective, then one of the fuses is broken (or otherwise configured) to exclude one of the memory columns from connecting its information, or lack thereof, to one of the corresponding output columns $OC_0$ through $OC_3$. To better appreciate this step, first consider the instance where it is determined that one of memory columns $C_0$ through $C_3$ is defective. In response, one fuse is broken so that each multiplexer having an input connected to that defective memory column connects its output to the input connected to the non-defective memory column. For example, assume that memory column $C_1$ is found to be defective after testing. Therefore, to exclude any electrical communication from $C_1$ to the external connections of configuration 300, fuse $F_2$ is disabled. In response, note that multiplexer $M_2$ receives a logic high signal at its control input due to its connection via fuses $F_3$, $F_4$, $F_5$, and through resistor R, to $V_{DD}$. Consequently, multiplexer $M_2$ selects memory column $C_2$ and connects it to output column $OC_1$. Similarly, note that multiplexer $M_1$ receives a logic low signal at its control input due to its connection through fuse $F_1$ to ground. Consequently, multiplexer $M_1$ selects memory column $C_0$ to output to output column $OC_0$. As a result, memory column $C_1$ is excluded from communicating beyond the two multiplexers $M_1$ and $M_2$ and its signal, if any, does not reach the external connections to configuration 300.

Given the above, one skilled in the art may trace other examples through FIG. 12 to identify the exclusion of a memory column by breaking one of fuses $F_1$ through $F_5$. Rather than detailing as above the breaking of each such fuse, Table 4 below sets forth each variation of breaking a fuse and the corresponding memory column which is excluded as a result of such action. Lastly, Table 4 also indicates in its last row the result if none of the fuses is broken.

TABLE 4

| Broken fuse | Memory Column Exduded |
|---|---|
| 1 | $C_0$ |
| 2 | $C_1$ |
| 3 | $C_2$ |

TABLE 4-continued

| Broken fuse | Memory Column Exduded |
|---|---|
| 4 | $C_3$ |
| 5 | $C_4$ |
| none | $C_4$ |

The last row of Table 4 indicates that if none of the fuses is broken, then memory column $C_4$ is excluded since the control input of each of multiplexers $M_1$ through $M_4$ receive a logic low. Note therefore that before testing for a defective column, no fuse is broken and each of memory columns $C_0$ through $C_3$ is connected to a respective one of $OC_0$ through $OC_3$. Thus, memory column $C_4$ is the redundant column which then may be used if one of the non-redundant memory columns is found to be defective after the initial testing described above.

Note also that the above configuration is feasible only where one or less defective column is identified in the testing step. Specifically, if more than one column is identified as defective, then configuration 300 by itself is insufficient since it is capable of only excluding one column from reaching the external connections of configuration 300. Moreover, note that in the event that testing determines that none of the memory columns $C_1$ through $C_5$ is defective, configuration 300 still outputs the information of only four of those five columns. In this instance, no fuse may be broken in which case $C_4$ is excluded. Otherwise, other considerations may cause any of the memory columns, although otherwise operable, to be selected as the memory column to be excluded. In this instance, again Table 4 indicates the appropriate fuse to configure so as to exclude the chosen memory column.

Given the above, prior art configuration 300 of FIG. 12 provides various benefits in that it permits at least one defective column to be excluded from outputting erroneous information to a system including the configuration. However, the present inventor has also recognized various of its drawbacks. For example, note that the number of fuses required by configuration 300 is one greater than the number of output columns. While this number is only five in the example of FIG. 12, in a more common example of output columns in the hundreds, there likewise will be hundreds of fuses as well. As another example, note the fuses are typically physically oriented as shown in schematic fashion in FIG. 12, and therefore require considerable space relative to the columns and other structures of configuration 300. In view of these detriments as well as others ascertainable by a person skilled in the art, the present inventor provides below various inventive embodiments which improve upon these drawbacks and provide additional benefits as well.

Figure 13:
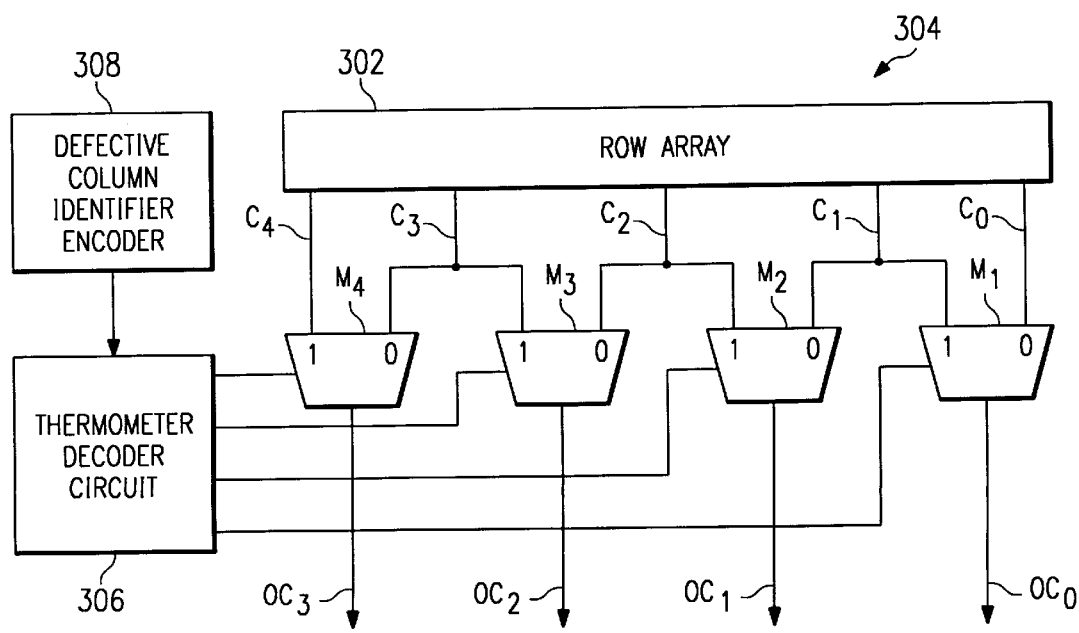
FIG. 13 illustrates an electrical diagram of an inventive embodiment memory configuration having a row array which outputs data signals along a series of columns including a single redundant column, and further including a multiplexer configuration controlled by a thermometer decoder to exclude a defective one of the memory columns from being output from the configuration.

FIG. 13 illustrates an electrical diagram of a first inventive embodiment of a memory configuration designated generally at 304. Configuration 304 in certain respects is the same as that shown in FIG. 12 above and, thus, where common elements are used common reference numerals from FIG. 12 are carried forward. Briefly addressing those common elements, note that configuration 304 includes a row array 302 having any number of rows and which, when energized, communicate information along a series of memory columns designated $C_0$ through $C_4$. Again, both the number of rows and/or columns in a particular embodiment may vary and, with respect to columns, only five are included in the current example to simplify the illustration and to present various contrasts with the prior art discussed above. Again, in operation of these memory columns, the digital information from all memory columns other than one excluded memory column is ultimately output from configuration 304, with the one excluded memory column for which its information is not output typically being a defective memory column. Also like FIG. 12, configuration 304 of FIG. 13 outputs the all but one column output along a series of output columns numbering one less than the number of memory columns, and designated $OC_0$ through $OC_3$. Lastly in the manner of FIG. 12, each output column in FIG. 13 is connected to the output of a corresponding two-input multiplexer $M_1$ through $M_4$, with the two inputs of each of multiplexers $M_1$ through $M_4$ connected to a pair of successive memory columns, starting with a first pair of successive memory columns $C_0$ and $C_1$ connected to the input of multiplexer $M_1$, and with each ascending numbered multiplexer connected to a next pair of successive memory columns, where this next pair shares the higher ordered output column of the preceding column pair.

Having noted the commonality of configuration 304 to the prior art, note now the features of the inventive embodiment of FIG. 13 in contrast to the prior art. Specifically, note that the control input of each of multiplexers $M_1$ through $M_4$ in FIG. 13 is not connected between a pair of corresponding fuses as above. In contrast, the control input of each of multiplexers $M_1$ through $M_4$ is instead connected to the output of a thermometer decoder circuit 306. Thermometer decoder circuit 306 is so named for reasons more clear below. The input of thermometer decoder circuit 306 is connected to the output of a defective column identifier encoder 308 which, as detailed below, stores an identification of a defective column within columns $C_0$ through $C_4$ if one of such columns is defective. Alternatively, defective column identifier encoder 308 may present an indication that none of the memory columns is defective by outputting a particular code also as described below. In the preferred embodiment, the encoding of the defective column in identifier encoder 308 is established using fuses to output a series of binary states, again by configuring those fuses using known techniques. However, for reasons more dear below, defective column identifier encoder 308 requires far fewer fuses to exclude the defective column as compared to the number of fuses required in the prior art embodiment of FIG. 12, above. Lastly, note also that thermometer decoder circuit 306 may be constructed by a person skilled in the art given the discussion later regarding its functionality.

The operation of configuration 304 is as follows. When row array 302 is accessed to read stored data, one of the rows therein is energized and connected to communicate information to each of columns $C_0$ through $C_4$. Next, each of multiplexers $M_1$ through $M_4$ is controlled by thermometer decoder circuit 306 so that one of columns $C_0$ through $C_4$ is excluded from outputting its data, if any. In other words, only four of those five columns communicate to output data to columns $OC_0$ through $OC_3$. More specifically, to provide this control, thermometer decoder circuit 306 provides a control bit to each of multiplexers $M_1$ through $M_4$ based on the defective column identification in encoder 308 as detailed below. Before reaching that discussion, note that the defective column identification in encoder 308 outputs a number of bits to thermometer decoder circuit 306, where those bits indicate which one of the columns, if any, of memory columns $C_0$ through $C_4$ is defective. For reasons more dear below, the defective column identification in encoder 308 need only provide a number of output bits defined by the following Equation 1:

$$\text{number of output bits} = f_{CEILING}\{\log_2(N+1)\} \text{output bits} \quad \text{Equation 1}$$

where,
N is the number of output columns from row array 302 and, therefore, N+1 is the number of memory columns; and $f_{CEILING}$ is a function which takes the value of $\log_2(N+1)$ if it is an integer, or rounds the value up to the next highest integer if the value of $\log_2(N+1)$ is non-integer.

Thus, in the present example, defective column identification in encoder 308 outputs 3 bits (i.e., $f_{CEILING}\{INT(\log_2(4+1)\}=f_{CEILING}\{2.23\}=3)$.

Given the output bits of defective column identifier encoder 308, the output provided by thermometer decoder circuit 306 to control each of the multiplexers is shown in the following Table 5:

TABLE 5

| Identified Defective Column and encoding | $M_4$ control bit from thermometer decoder | $M_3$ control bit from thermometer decoder | $M_2$ control bit from thermometer decoder | $M_1$ control bit from thermometer decoder |
|---|---|---|---|---|
| $C_0$(000) | 1 | 1 | 1 | 1 |
| $C_1$(001) | 1 | 1 | 1 | 0 |
| $C_2$(010) | 1 | 1 | 0 | 0 |
| $C_3$(011) | 1 | 0 | 0 | 0 |
| $C_4$(100) | 0 | 0 | 0 | 0 |

Given Table 5, note also that the three encoding bits from Table 5 in its first column actually give rise to a total of eight different possible sequences (i.e., $2_3=8$ sequences). However, only five of those eight different possible sequences are needed and, therefore, the other three sequences are don't cares.

Having access to the multiplexer control signals shown in Table 5, one skilled in the art may appreciate how those controls cause the defective column identified by defective column identifier encoder 308 to be excluded from communicating with output columns $OC_0$ through $OC_3$. For example, consider the instance where memory column $C_1$ is defective, as determined by some type of known testing after row array 302 is constructed. The second row of Table 5 (from its top), therefore, demonstrates the set up and operation of memory configuration 304 in such an instance. Examining this set up and operation in detail, first note that defective column identifier encoder 308 indicates that memory column $C_1$ is defective by outputting a unique bit sequence (e.g., 001) which identifies memory column $C_1$. In response, thermometer decoder circuit 306 outputs the series of bits shown along the second row of Table 5 to the corresponding multiplexers $M_4$ through $M_1$. Retuning to FIG. 13, note that when each of multiplexers $M_4$, $M_3$, and $M_2$ receives a logic 1 at its control input, it selects the input toward the left side of the multiplexer as drawn in FIG. 13, thereby causing memory columns $C_4$ through $C_2$ to communicate with output columns $OC_3$ through $OC_1$, respectively, in the present example. However, multiplexer $M_1$ receives a logic 0 at its control input and, therefore, it selects the input toward the right side of the multiplexer as drawn in FIG. 13; thus, $M_1$ causes memory column $C_0$ to communicate with output column $OC_0$. Given the operation of the four multiplexers, memory column $C_1$ is thereby excluded as an output from memory configuration 304. Lastly, note also that the above signals are by way of example and, as appreciated by a person skilled in the art, the same functionality could be achieved using complementary signals and complemented controls on multiplexers $M_1$ through $M_4$.

Given the immediately preceding example and the above discussion, one skilled in the art will appreciate how each of the memory columns $C_0$ through $C_4$ may be uniquely identified by a 3 bit signal to thermometer decoder circuit 306, and how thermometer decoder circuit 306 may then output the values shown in Table 5 to exclude the designated defective column as an output from output columns $OC_0$ through $OC_3$. Moreover, the choice of the name "thermometer decoder" may now be appreciated from Table 5. Specifically, note that for each successive row from the bottom to the top of Table 5, the number of logic 0's increments for each row and appears in a row from the right to the left of the page. In other words, starting at the top row of Table 5, there are no logic 0's, whereas the next lower row has one logic 0 at its right end, whereas the next lower row has two logic 0's at its two rightmost entries, and so forth. Stated another way, note that the number of logic 0's starting from the right of each row equals the binary number represented by the encoding of the defective column (e.g., for 011, which is binary three, there are three logic 0's starting from the right of the relevant row in Table 5). In any event, therefore, in a manner comparable to a thermometer, there is a scale which adjusts from a null value (e.g., no 1's) toward a maximum threshold (all 1's) in an incremental fashion from one end of the scale to the other. In the digital embodiment provided, this scale is represented by a sequence of bits. In other words, the scale at one extreme is all 0's and at the other extreme is all 1's. Between those two extremes, the scale has logic 1's from one end of the sequence to some intermediate bit, and has logic 0's from the other end of the sequence to the bit following the intermediate bit. Moreover, because of this thermometer pattern, note also that a different sequence is generated for each of the N+1 memory columns which may be excluded. Therefore, to select from each one of these possible sequences, the binary output of defective column identifier encoder 308 must be operable to output up to N+1 combinations, thereby requiring a total number of fuses (or other devices capable or representing a binary signal) as established by Equation 1, above.

Note that the above discussion and example generally assumes that one of the memory columns $C_0$ through $C_3$ is found to be defective after testing. However, if none of the columns is defective, then it is still required that one of those memory columns be excluded as an output. Thus, as one approach, one of the five memory columns may be arbitrarily selected and its code (i.e., identified in the first column of Table 5) could be encoded in defective column identifier circuit 304 (even though technically the column is not defective). As an alternative, note that if no fuse is broken, then the encoding signal is 000 which is shown in the top row of Table 5 and, therefore, which causes memory column $C_0$ to be excluded as an output. Still other alternatives will be ascertainable by a person skilled in the art.

Having presented a detailed discussion of the construction and operation of memory configuration 304, note now some of its benefits over the prior art. First, note that the thermometer decoder does not include fuses and fuses are not required between each of the multiplexer controls as in the prior art. Thus, the complexities (e.g., design, area of usage) associated with such fuses are eliminated. Moreover, note now that the number of fuses (or other encoding devices) required to implement the inventive embodiment of FIG. 13 is far less than that of the prior art FIG. 12. In the example given, defective column identifier encoder 308 requires only three fuses to represent the total different number of identifiers required (e.g., 5 identifiers, one for each of memory columns $C_1$ through $C_4$), whereas the FIG. 12 approach required five fuses. Moreover, FIGS. 12 and 13 present a simplified example of a memory with only five memory columns. In current technology, a more common example may include on the order of 257 memory columns. Thus, under the prior art approach of FIG. 12, a total of 257 fuses are required. In contrast, to expand the FIG. 13 inventive embodiment to accommodate 257 memory columns would require only 9 fuses (i.e., $f_{CEILING}\{\log_2(257)\} = f_{CEILING}\{8.01\} = 9$ fuses) in defective column identifier encoder 308. In addition, note that the location of the fuses may be more centralized than as in the prior art. As yet another example, and as demonstrated below, the embodiment of FIG. 13 may be further implemented in connection with banks of memories and/or various row redundancy techniques, providing yet additional improvements over the prior art. Still other benefits may be ascertainable by a person skilled in the art.

Figure 14:
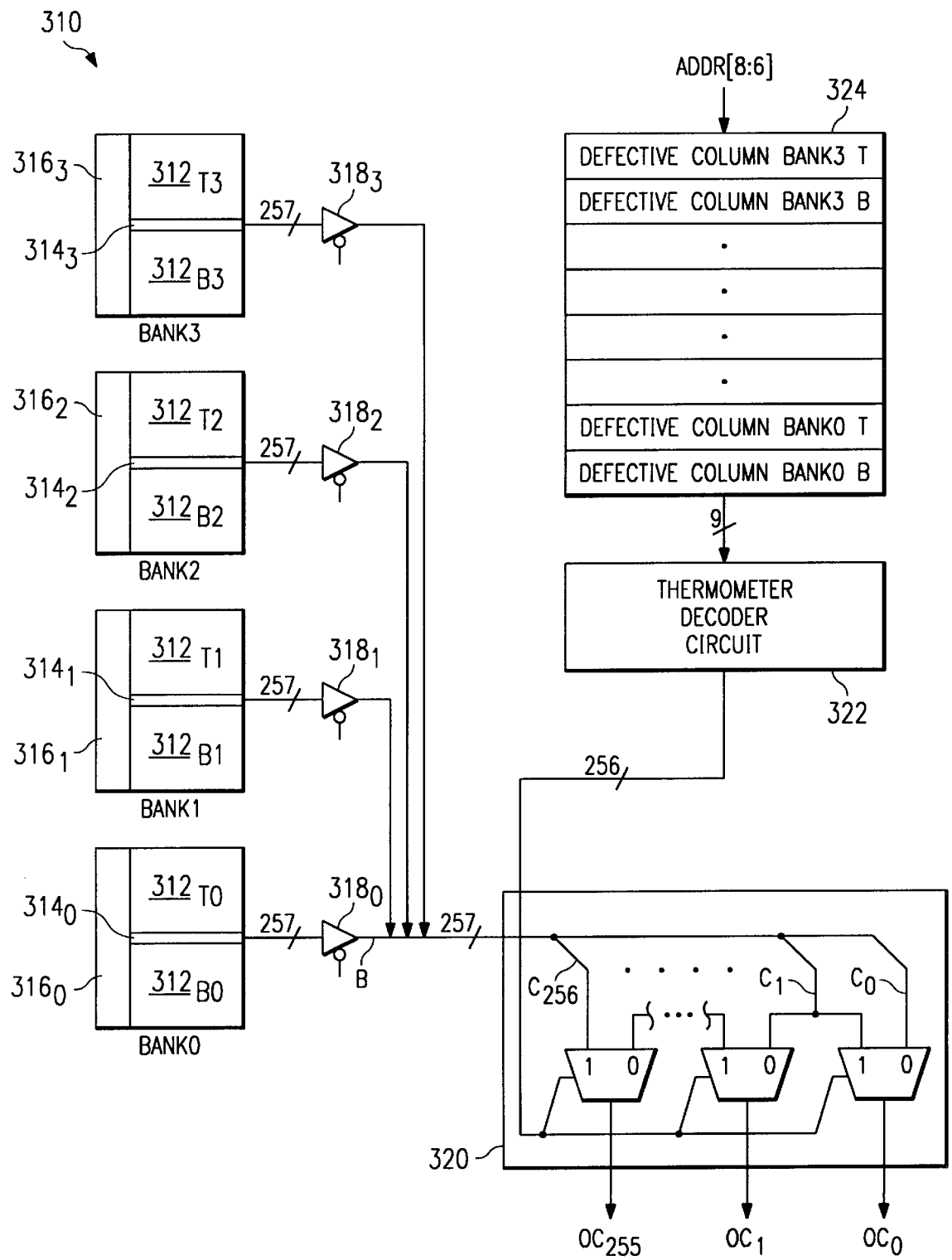
FIG. 14 illustrates an electrical diagram of an alternative inventive embodiment wherein column redundancy is increased by separating a memory into a plurality of bank memories each having separately addressable halves, such that each half provides an additional column of redundancy per bank memory.

FIG. 14 illustrates an alternative inventive embodiment of a memory configuration designated generally at 310. Memory configuration 310 includes four different banks of memories designated BANK0 through BANK3, in the same manner as in FIG. 8a discussed in the preceding section. Each of the BANKs of information configuration 310 is constructed in general in a like manner, with different decoders so that each BANK may be separately addressed. Thus, in total, the BANKs store a total of four times the amount of information stored in a single BANK. To better appreciate the like elements of each of the BANKs, note that like reference numerals are used for each BANK, with subscripts designating the bank to which the referenced item belongs. Looking therefore at BANK0 as an example of how each bank is constructed, it includes a top half $312_{T0}$ and a bottom half $312_{B0}$, with each bank half representing a memory row array as in the manner of row array 302 of FIG. 13. Further, the bank halves are separated by a sense amplifier line $314_0$ as known in the art. Sense amplifier line $314_0$ may be energized to read information from a row of either the top or bottom half of BANK0 and thereby ultimately output the addressed information from configuration 310. More particularly, sense amplifier line $314_0$ senses the data on each column from a row after that row in either the top half $312_{T0}$ or bottom half $312_{B0}$ is energized by the appropriate one of a decoder group $316_0$. For the present embodiment and only by way of example, ultimately it is desired to output a total of 256 bits of data along 256 respective output columns. Thus, to accomplish column redundancy, each of the bank halves includes one additional column to provide a total of 257 memory columns, where up to one of those columns may be detected as defective and thereafter excluded as an output in the manner described below. Before reaching that discussion, note that in response to energizing a single row within a bank half, all 257 data signals along each of the 257 columns are sensed by sense amplifier line $314_0$ and output to a tristate buffer $318_0$ which, when active, connects the 257 data bits to a bus B. Lastly, note that any one of the rows in any of the banks may be addressed by an address such as that detailed above in connection with FIG. 8b, and the reader is referred to the discussion of that Figure for extensive detail. For purposes of the present embodiment, note that the address to one of the four banks will include at least two bits from which to designate one of the four banks, and a single additional bit to designate either the upper or lower half of the selected bank. In FIG. 8b, these bits are ADDR[8:6] and, therefore, for consistency sake but without limitation, those same bits are used with respect to the present embodiment.

Configuration 310 further includes a multiplexer array circuit 320 which operates, as detailed below, in various respects in the manner of FIG. 13, above. More specifically, note that the 257 bit output from each of tristate buffers $318_0$ through $318_3$, via bus B, is connected to the input of multiplexer array circuit 320. Multiplexer array circuit 320 includes a number of multiplexers equal to one less than the number of memory columns in each of BANK0 through BANK3 and, therefore, in the present example includes 256 multiplexers shown as $M_1$ through $M_{256}$. Moreover, the column data bits from bus B are connected to respective ones of multiplexers $M_1$ through $M_{256}$ in the same manner as column data is connected to multiplexers $M_1$ through $M_4$ in FIG. 13. Thus, the two data inputs of each of multiplexers $M_1$ through $M_{256}$ are connected to a pair of successive memory columns, starting with a first pair of successive memory columns $C_0$ and $C_1$ connected to the input of multiplexer $M_1$, and with each ascending numbered multiplexer connected to a next pair of successive memory columns, where this next pair shares the higher ordered output column of the preceding pair; therefore, this pattern continues in multiplexer array circuit 320 such that memory columns $C_{255}$ and $C_{256}$ are connected as inputs to multiplexer $M_{256}$. Lastly, the outputs of each of multiplexers $M_1$ through $M_{256}$ provide corresponding output columns $OC_0$ through $OC_{255}$, thereby operable to output data from configuration 310.

The 256 multiplexers of multiplexer array circuit 320 are controlled by respective control signals from a thermometer decoder circuit 322. More specifically, thermometer decoder circuit 322 is constructed in the same manner as thermometer decoder circuit 306 of FIG. 13, but whereas thermometer decoder circuit 306 of FIG. 13 controlled only four multiplexers, thermometer decoder circuit 322 of FIG. 14 controls the 256 multiplexers of multiplexer array circuit 320. Consequently, thermometer decoder circuit 322 outputs 256 control signals, one to each of the respective multiplexers of multiplexer array circuit 320. Moreover, from Table 5, above, one skilled in the art will appreciate that the control signals provided will represent one of 257 possible different combinations of a thermometer pattern as described above, that is, somewhere along a continuum of all logic 1's to all logic 0's, with any pattern in the middle representing logic 1's to some point in the pattern combined with logic 0's in the remainder of the pattern.

Thermometer decoder circuit 322 receives an input (9 bits in the present example) from a defective column identifier encoder 324. With respect to defective column identifier encoder 324, note that it stores identifiers of up to eight different defective columns, where each of those columns is in a different top or bottom half of a different one of the four banks of configuration 310. To further illustrate this aspect, eight rows are shown within defective column identifier encoder 324 corresponding from bottom to top of each half of rows in the four banks of memories. For example, the bottom row in defective column identifier encoder 324 corresponds to an identifier of a defective column (if any) in the bottom half $312_{B0}$ of BANK0. As another example, the top row in defective column identifier encoder 324 corresponds to an identifier of a defective column (if any) in the top half $312_{T3}$ of BANK3. Note that bits ADDR[8:6] are connected as an input to defective column identifier encoder 324 for selecting one of the eight rows therein as detailed in the operational description below. Lastly, note that each of the eight entries in defective column identifier encoder 324 provides an identification in a manner similar to defective column identifier encoder 308 of FIG. 13, but whereas defective column identifier encoder 308 encoded one of five possible defective memory columns, each of the eight entries in defective column identifier encoder 324 encodes one of 257 possible defective memory columns. Thus, applying Equation 1, above, note that each of the eight entries in defective column identifier encoder 324 is nine bits long (i.e., $f_{CEILING}\log 257\}=9$).

The operation of configuration 310 is as follows. Initially, an incoming address is received to address one of the rows in one of BANK0 through BANK3. This incoming address may be decoded according to various known techniques, or consistent with the inventive embodiments set forth earlier in this document. In any event, at least one of decoders $316_0$ through $316_3$ will energize the row addressed by the incoming address. To facilitate the discussion, assume as an example that the incoming address addresses a row in the bottom half $312_{B3}$ of BANK3. Thereafter, sense amplifier line $314_3$ corresponding to the addressed BANK3 senses the data from each of the 257 memory columns of the energized row, and that data is output via tristate buffer $318_3$ to bus B. During this same time, note also that bits ADDR[8:6] are connected to defective column identifier encoder 324. In the present example, therefore, these bits indicate that the presently addressed row is in the bottom half $312_{B3}$ of BANK3. In response, defective column identifier encoder 324 outputs a 9 bit identifier of the defective column within the bottom half $312_{B3}$ of BANK3, and this output is connected to thermometer decoder circuit 322. The 9 bit identifier causes thermometer decoder circuit 322 to output a 256 bit thermometer pattern sequence to multiplexer array circuit 320, thereby causing multiplexer array circuit 320 to exclude one of the memory columns $C_0$ through $C_{256}$ of the bottom half $312_{B3}$ of BANK3 from the output provided by output columns $OC_0$ through $OC_{255}$. For example, assume that memory column $C_{40}$ is defective in the bottom half $312_{B3}$ of BANK3. Therefore, thermometer decoder circuit 322 presents a 256 bit pattern to multiplexer array circuit 320, whereby multiplexers $M_{256}$ through $M_{41}$ each receive a logic 1 at their control inputs while multiplexers $M_{40}$ through $M_1$ each receive a logic 0 at their control inputs. Consequently, given the above discussion, one skilled in the art will appreciate that the data from memory column $C_{40}$ of the bottom half $312_{B3}$ of BANK3 is excluded, while the remaining memory columns of data are passed to output columns $OC_0$ through $OC_{255}$.

Having presented a detailed discussion of the construction and operation of memory configuration 310, note that it provides the benefits of FIG. 13, above, and provides still additional benefits as well. For example, by using multiple banks of memories, each bank may include a redundant column, thereby permitting a greater number of columns to be defective while still maintaining the ability to exclude those columns. Still further, by addressing each bank per bank half (or some other form of separation), the amount of redundancy may be still further increased. As yet another example, the embodiment of FIG. 14 demonstrates that various aspects of the inventive scope may apply to memories of differing sizes. As still another example, note that various tiring considerations associated with the preceding section need not apply to the present embodiments and, therefore, these embodiments may apply to various memory structures including cache structures, but not limited thereto. Lastly, note also that while the above examples are described in connection with reading information from a memory, a column could be excluded in a comparable manner to write information to a row within a memory as well.

Figure 15:
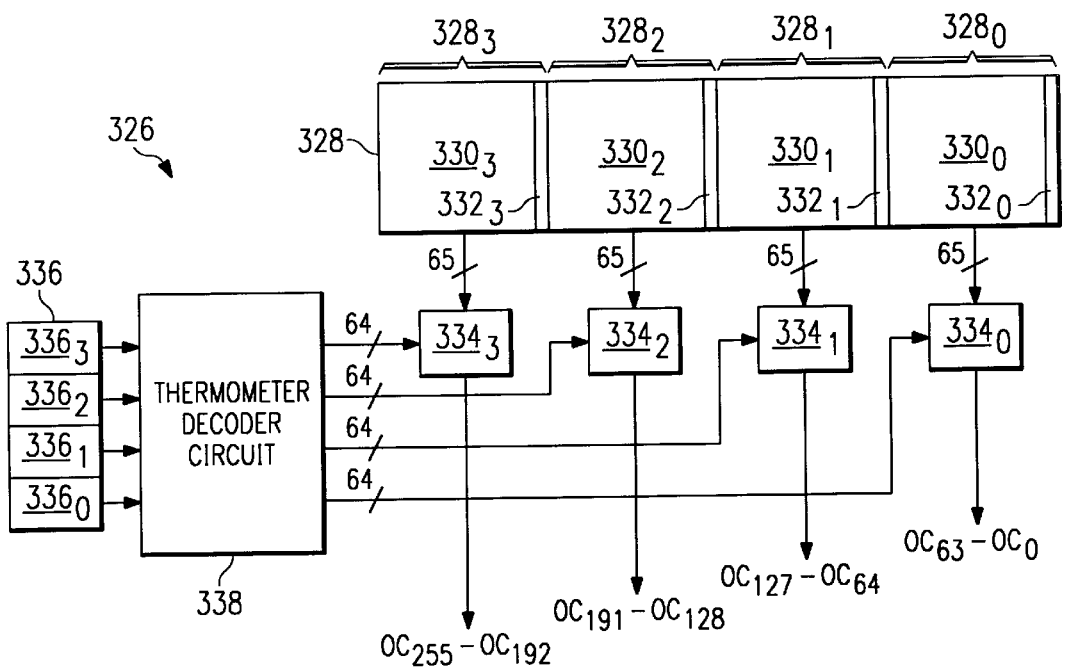
FIG. 15 illustrates an electrical diagram of an alternative inventive embodiment wherein column redundancy is increased by separating a memory into a plurality of memory groups where the same row of each group is addressed at a time, but where each group provides an additional column of redundancy.

FIG. 15 illustrates an alternative inventive embodiment of a memory configuration designated generally at 326. Memory configuration 326 includes a memory array 328 which in the present embodiment is either logically or physically separated into four memory sections $328_0$ through $328_3$. Regardless of the separation technique, in the present embodiment one row along the entirety of memory array 328 is accessed at a time. For example, if the bottom row of memory section $328_3$ is accessed, then the bottom rows of sections $328_2$, $328_1$, and $328_0$ are also accessed at that time. Each memory section includes a respective primary column group, shown as $330_0$ through $330_3$. These groups are referred to as "primary" in the same sense as that term is used with rows above, that is, to indicate that the data transferring element, which here is a column rather than a row, is normally anticipated to operate but may be found defective in which case a spare element is instead used to transfer the data. By way of example, assume that each primary column group includes 64 columns. Moreover, each memory section further includes a single spare column, shown as $332_0$ through $332_3$.

Given the above, therefore, each memory section $328_0$ through $328_3$ includes a total of 65 memory columns. Each of these memory columns is shown connected to a corresponding multiplexer array circuit designated $334_0$ through $334_3$. Although not shown in detail so as to simplify FIG. 15, it should be understood that each multiplexer array circuit $334_0$ through $334_3$ is constructed in a manner consistent with previously described embodiments, such as multiplexer array circuit 320 of FIG. 14, above. However, where multiplexer array circuit 320 of FIG. 14 includes a total of 257 memory column inputs, each multiplexer array circuit $334_0$ through $334_3$ includes a total of 65 memory column inputs connected to a total of 64 multiplexers, and each of those 64 multiplexers provides an output column. For example, with respect to multiplexer array circuit $334_0$, its 64 multiplexers provide output columns $OC_0$ through $OC_{63}$. Each of the remaining three multiplexer array circuits similarly provides 64 output columns as designated in FIG. 15 and as appreciated by a person skilled in the art.

In addition to the above, memory configuration 326 includes a defective column identifier encoder 336. In the present embodiment, defective column identifier encoder 336 stores a code for a defective column corresponding to each of memory groups $328_0$ through $328_3$; thus, defective column identifier encoder 336 stores a total of four codes designated $336_0$ through $336_3$, where each is represented in the present embodiment by fuses as in the manner of defective column identifier encoder 324 of FIG. 14 or defective column identifier encoder 308 of FIG. 13, above. Moreover, since each memory group includes a total of 65 columns, note that each stored corresponding code is 7 bits long according to Equation 1, above (i.e., $f_{CEILING}\{INT(\log_2(64+1))\}=f_{CEILING}\{6.02\}=7$). Lastly, to facilitate the discussion below, note that the subscript for each defective column code in defective column identifier encoder 336 matches the subscript of the corresponding memory group. For example, defective code $336_0$ corresponds to memory group $328_0$, defective column code $336_1$ corresponds to memory group $328_1$, and so forth for the other two defective codes and memory groups.

Memory configuration 326 also includes a thermometer decoder circuit 338 connected to receive each of the four defective column codes from defective column identifier encoder 336. Although not shown in detail here, note that thermometer decoder circuit 328 is connected to provide control signals to each of the multiplexers in each of multiplexer array circuits $334_0$ through $334_3$; thus, thermometer decoder circuit 338 provides four separate sets, of 64 thermometer control signals each, to each of multiplexer array circuits $334_0$ through $334_3$.

The operation of memory configuration 326 is presented given an understanding of the previous inventive embodiments and, therefore, the reader is assumed familiar with the prior discussion. Without extensive detail, however, note the following. Initially, a row address is used to address memory array 328 and, therefore, the same row along each of groups $328_0$ through $328_3$ is energized in response to that address. In response, the sense amplifier (not shown) outputs data along a total of 260 memory columns, with each of memory groups $328_0$ through $328_3$ contributing 65 of those memory columns. Next, however, for each of memory groups $328_0$ through $328_3$, the corresponding defective column code is encoded by thermometer encoder 338 to control the multiplexers in each of multiplexer array circuits $334_0$ through $334_3$. More specifically, in response to the defective column code, thermometer encoder 338 provides a pattern in the manner of Table 5 above, but here the output is either 64 logic 0's, 64 logic 1's, or some thermometer pattern between those extremes where one part of the pattern is consecutive logic 0's while the other part of the pattern is consecutive logic 1's. In response to each of the four 64-bit patterns, each corresponding multiplexer array circuit excludes from its output columns one of its 65 input memory columns. Thus, in completing the access, a total of 256 data bits are output from memory configuration 326.

Having presented a discussion of the construction and operation of memory configuration 326, note that it provides various of the benefits from the earlier inventive embodiments and still additional benefits as well. For example, by separating a memory into logical or physical groups, each group may have a corresponding spare column for that group, thereby permitting a greater number of columns to be defective while still maintaining the ability to exclude those columns. As another example, the embodiment of FIG. 15 again demonstrates that various aspects of the inventive scope may apply to memories of differing sizes, and again may apply to various memory structures.

Figure 16:
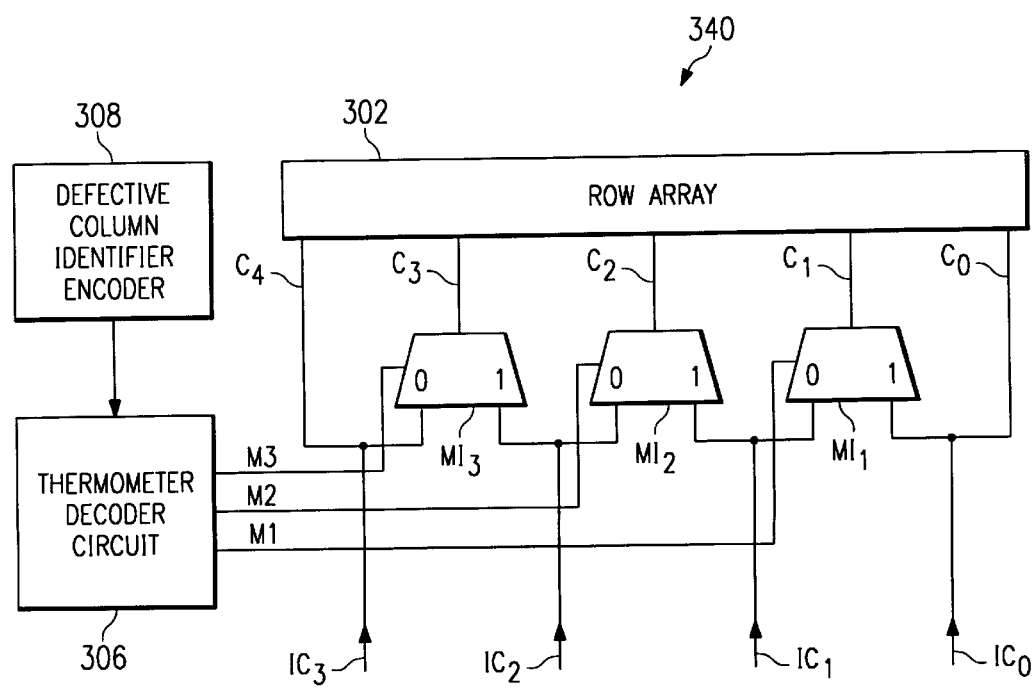
FIG. 16 illustrates an electrical diagram of an alternative inventive embodiment wherein column redundancy is implemented for purposes of writing data to the memory configuration, and wherein various of the same elements used for purposes of reading data from the memory configuration may be implemented.

FIG. 16 illustrates an electrical diagram of yet another inventive embodiment of a memory configuration designated generally at 340. Before discussing the details of memory configuration 340, note first that the descriptions above have been in the context of reading data from the columns of a memory configuration. However, numerous of the present inventive principles also apply to writing data to a memory configuration and, thus, the embodiment of FIG. 16 demonstrates the application of certain ones of those principles and is followed by yet additional embodiments demonstrating still further aspects of writing to a memory configuration within the present inventive scope. Given this introduction, memory configuration 340 shares some of the same elements of memory configuration 304 of FIG. 13 and, therefore, where such elements appear, like reference numerals and/or letters are used. Turning then to those like elements, memory configuration 340 includes a row array 302 having any number of rows and which communicate information along a series of memory columns $C_0$ through $C_4$.

In contrast to memory configuration 304 of FIG. 13, memory configuration 340 of FIG. 16 is directed to writing information to its memory columns so that the data may reach the rows within row array 302. Toward this end, memory configuration 340 includes a number of input columns, designated as $IC_0$ through $IC_3$. As in the case of output columns in the earlier inventive embodiments, the number of input columns is one less than the number of memory columns and, hence, in the current example there are four input columns to write data to four of the five memory columns. Memory configuration 340 also includes a plurality of multiplexers to control the writing of data from the input columns to selected ones of the memory columns. In this context, the number of multiplexers is one less than the number of input columns. Thus, in memory configuration 340, there are shown three multiplexers designated $MI_1$, $MI_2$, and $MI_3$, respectively. Regarding the connections of these multiplexers, note that they may be characterized depending on whether they are connected to one of the outermost input columns (i.e., $IC_0$ and $IC_3$), or solely to a pair of columns between those outermost columns. Looking first to the outermost input columns, each is connected directly to a respective outermost memory column. For example, $IC_0$ is connected directly to $C_0$. Also with respect to the outermost inputs columns, each is connected to one input of a multiplexer. For example, $IC_0$ is also connected to one input of multiplexer an input $MI_1$. Looking now to the input columns located between the outermost input columns, note that each is connected to the input of a first input multiplexer and a second input multiplexer, where the first multiplexer has its output connected to the memory column having the same subscript as the input column, and where the second multiplexer has its output connected to the memory column having a subscript one larger than the input column. For example, $IC_1$ is an input column between the outermost input columns; thus, $IC_1$ is connected to $MI_1$ which has its output connected to $C_1$, and $IC_1$ is also to $MI_2$ which has its output connected to $C_2$. Given this example, the other input column $IC_2$ which is located between the outermost input columns is similarly connected to $MI_2$ and $MI_3$. Moreover, while the embodiment of FIG. 16 only includes two input columns located between its outermost input columns, one skilled in the art will appreciate that this pattern may be duplicated for a configuration having any number of input columns located between its outermost input columns. Lastly, as in prior embodiments, again the convention of both a "0" and a "1" are shown in the illustration of each multiplexer to represent the selection of the data adjacent to either the "0" or "1" based on a control signal of 0 or 1, respectively.

Memory configuration 340 of FIG. 16 also includes defective column identifier encoder 308 as in FIG. 13 as well as its associated thermometer decoder circuit 306. With respect to thermometer decoder circuit 306, however, recall that it outputs four control bits in the embodiment of FIG. 13 (i.e., one to each of multiplexers $M_1$ through M4). In the embodiment of FIG. 16, however, there are only three multiplexers $MI_1$ through $MI_3$. Nevertheless, as proven below, a subset of the same outputs from thermometer decoder circuit 306 to control multiplexers $M_1$ through $M_4$ to exclude a defective column for purposes of reading of data (i.e., FIG. 13) may be used in FIG. 16 to exclude a defective column for purposes of writing data. As later demonstrated, this subset consists of all control bits output from thermometer decoder circuit 306 other than those corresponding to the first or last multiplexer. In other words, either the control bits for $M_1$ through $M_3$ may be used (thereby not using those corresponding to the last multiplexer $M_4$) or, alternatively, the control bits for $M_2$ through $M_4$ may be used (thereby not using those corresponding to the first multiplexer $M_1$). As an example illustration in FIG. 16, therefore, the control bits for $M_1$ through $M_3$ are used to control $MI_1$ through $MI_3$, respectively.

Given the output bits of defective column identifier encoder 308 as connected to multiplexers $MI_1$ through $MI_3$, the output provided by thermometer decoder circuit 306 to control each of the multiplexers is shown in the following Table 6:

TABLE 6

| Identified Defective Column and encoding | $MI_3$ control bit from thermometer decoder | $MI_2$ control bit from thermometer decoder | $MI_1$ control bit from thermometer decoder |
| --- | --- | --- | --- |
| $C_0$(000) | 1 | 1 | 1 |
| $C_1$(001) | 1 | 1 | x |
| $C_2$(010) | 1 | x | 0 |
| $C_3$(011) | x | 0 | 0 |
| $C_4$(100) | 0 | 0 | 0 |

Note that an "x" in Table 6 indicates that the control bit is a don't care, that is, it does not matter which binary state is presented. Moreover, a few examples of tracing the signals of Table 6 are instructive in understanding the embodiment of FIG. 16 and, therefore, such examples are provided below.

As a first example of the operation of configuration 340 given Table 6, assume that $C_0$ has been determined to be defective and, therefore, it is desired to write the data from $IC_0$ through $IC_3$ to $C_1$ through $C_4$, respectively. Thus, again $C_0$ is encoded in defective column identifier encoder 308 which gives rise to the top row of Table 6 as an output from thermometer decoder circuit 306. Specifically, the control output for this example is 111. Turning to the operation of the multiplexers in FIG. 16, note that this control output causes each of multiplexers $MI_1$ through $MI_3$ to connect the input column to the right of the multiplexer as oriented in FIG. 16 to its output, thus, $MI_1$ connects $IC_0$ to $C_1$, $MI_2$ connects $I_{C1}$ to $C_2$, and $MI_3$ connects $IC_2$ to $C_3$. In addition, note that $IC_3$ is already directly connected to $C_4$. Thus, in a write cycle under this configuration, data may be written from each input column to a non-defective memory column. Lastly, note that even though $C_0$ is defective, it still receives the data from $IC_0$; however, this is irrelevant to data integrity because the data from $IC_0$ has also been provided to a non-defective column, namely, $C_1$.

As a second example of the operation of configuration 340 given Table 6, assume that $C_2$ has been determined to be defective and, therefore, it is desired to write from $IC_0$ to $C_0$, $IC_1$ to $C_1$, $IC_2$ to $C_3$, and $IC_3$ to $C_4$. Thus, given an encoding of $C_2$ in defective column identifier encoder 308, thermometer decoder circuit 306 outputs the thermometer pattern from the third row of Table 6, that is, the value of 1x0. Note that this signal includes a don't care in its middle, so an appropriate output value could be either 110 or 100, that is, substituting either a 1 or a 0 for the x. The possibilities of these alternatives is now traced through its operation to demonstrate that either is acceptable as proposed in Table 6. Turning first to the control pattern of 110, note that it is perhaps easiest to understand its effect by first looking to the control bits in the control pattern which correspond to multiplexers having outputs connected to memory columns which are not defective. Thus, in the present example, $MI_1$ and $MI_3$ have outputs connected to memory columns which are not defective (while $MI_2$ has its output connected to defective column $C_2$). With respect to $MI_1$, the 0 at its control input causes it to connect the data from $IC_1$ to $C_1$, thereby leaving the data from $IC_0$ to connect to $C_0$. Further, with respect to $MI_3$, the 1 at its control input causes it to connect the data from $IC_2$ to $C_3$, thereby leaving the data from $IC_3$ to connect to $C_4$. Given these proper connections, note that the control of $MI_2$ does not matter in the current case. If the control input to $MI_2$ is 1 as is the case for a thermometer pattern of 110, then $MI_2$ selects the data from $IC_1$ and connects it to $C_2$. However, this action is irrelevant because the data from $IC_1$ is also already connected, via $MI_1$, to $C_1$. Moreover, since $C_2$ is defective, no harm occurs in connecting it to $IC_1$ during a data write. Given these consequences, one skilled in the art will further appreciate that in this example if the control input to $MI_2$ is 0 as is the case for a thermometer pattern of 100, then $MI_2$ selects the data from $IC_2$ and connects it to $C_2$, but again this is irrelevant because the data from $IC_2$ is also already connected, via $MI_3$, to $C_3$. Thus, either pattern 110 or 100 is appropriate for this instance and, hence, the middle bit is a don't care resulting in 1x0 as shown in the middle row of Table 6.

Given the above examples of the application of control bits from Table 6, one skilled in the art may trace the operation of memory configuration 340 to confirm the remaining rows of Table 6 and, thus, a detailed discussion is not presented for each of those instances. Nevertheless, having now demonstrated the validity of the control bits in Table 6 for purposes of writing data to memory columns, note further its commonality with Table 5 above, which recall is directed to the reading of column data. Specifically, given the don't cares in Table 6, note that either the first three or last three columns of Table 5 provide appropriate data to correspond to that shown in Table 6. As a result, it is now proven that, by eliminating either the far right or far left column of control bits from Table 5, the remaining bits may be used to provide the control bits of Table 6. Thus, with respect to the multiplexers for writing data shown in FIG. 16, they may be connected to the same outputs of thermometer decoder circuit 306 as are the multiplexers used for reading data in FIG. 13, with the exception that either the most significant or least significant bit of the control bit pattern is not used in the connection to the multiplexers associated with writing data to the memory columns.

Figure 17:
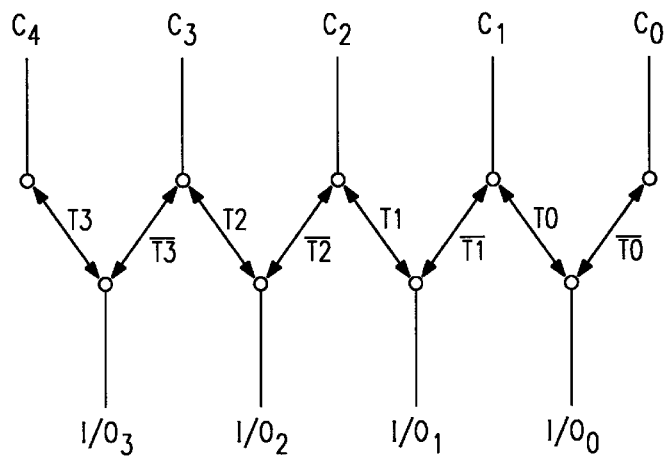
FIG. 17 illustrates a diagrammatic depiction of the coupling of memory columns to communicate with either input or output columns consistent with the present embodiments.

From the above one skilled in the art will appreciate that various of the present embodiments contemplate either reading data from a group of memory columns to a number of output columns, or writing data from a number of input columns to a group of memory columns. Regardless of whether the embodiment is reading or writing, the above embodiments permit this operation in the instance where one of the memory columns is defective. FIG. 17 further illustrates the common attribute for both reading and writing in diagram form, again using the example of 4 memory columns as shown for reading data in FIG. 13 and for writing data in FIG. 16. Thus, the same memory columns $C_0$ through $C_4$ are shown across the top of FIG. 17. With respect to either reading data from selected ones of those columns, or writing data to selected ones of those memory columns, the input and output columns of FIGS. 13 and 16 are combined to form input/output columns (abbreviated I/O) and, thus, provide columns $I/O_0$ through $I/O_3$. Between the I/O columns and the memory columns are shown bi-directional arrows which indicate a possible electrical path of communication between an I/O column and one of two possible memory columns per I/O column. Lastly, for each I/O column, its two corresponding bi-directional arrows are shown with a control bit from the thermometer code designated by a "T" combined with the subscript for the corresponding I/O column. Note that the T signal and its complement are shown to suggest that if a value of T (e.g. T0) is in a first state, then the corresponding arrow without the complemented indication (i.e., the arrow to the left of $I/O_0$ in FIG. 17) represents the connection between the I/O column and the memory column, whereas if the value of T is in a second state complementary of the first state (e.g., $\overline{T0}$), then the corresponding arrow with the complemented indication (i.e., the arrow to the right of $I/O_0$ in FIG. 17) represents the connection between the I/O column and the memory column. This convention is used in examples provided below.

Given the configuration of FIG. 17, note now that for either reading or writing data that the above embodiments share various concepts. First, a defective one of the memory columns is identified by an encoding circuit. Second, a thermometer pattern is generated based on the encoded identification. Third, in response to the thermometer pattern, data is communicated between memory columns and the I/O columns such that at least each of the memory columns other than the defective memory column is connected to a respective one of the I/O columns. Note that it is stated in the preceding sentence that "at least" each of the memory columns is connected in such a fashion. This qualification is better appreciated from the descriptions of both reading and writing data, below.

In the instance of reading data, the defective column is completely excluded from being coupled to any of the I/O columns; therefore, the signal, if any, of the defective column is not read. For example, assume that $C3$ is defective. Therefore, to exclude it for reading, a thermometer code for T3 through T0 equals 1000. Thus, $I/O_3$ communicates with $C_4$, $I/O_2$ communicates with $C_2$, $I/O_1$ communicates with $C_1$, and $I/O_0$ communicates with $C_0$. Note, therefore, that $C_3$ is not connected to any of the I/O columns. As a result, in the case of reading data, only the memory columns other than the defective memory column are connected to respective I/O columns. Consequently, it is true, as stated above, that at least each of the memory columns other than the defective memory column is connected to a respective one of the I/O columns. It is further true, however, that no other memory column (i.e., the defective memory column) is connected to an I/O column.

In the instance of writing data, note that the multiplexer embodiments provided above do again ensure that each of the memory columns other than the defective memory column is connected to a respective one of the I/O columns. However, in addition, they also actually allow the defective column to receive data from one of the I/O columns. Nevertheless, this result is of no consequence to the integrity of the data because even if this happens the use of the illustrated multiplexers further insures that the same data connected to a defective memory column is also connected to a non-defective memory column. Given this consequence of the multiplexer embodiment, note further that in a broader representation of the present inventive embodiment with respect to writing, the arrows of FIG. 17 could represent bi-directional transfer gates, again controlled by the thermometer pattern described above, and which give rise to communicate only to non-defective memory columns. More particularly, to write to the memory columns other than the defective column, the arrow or arrows to the defective memory column may be broken (i.e., transfer gates disabled) so that the defective memory column does not communicate with any I/O column. In response, only the memory columns other than the defective memory column are connected to a respective one of the I/O columns. For example, assume that $C_2$ is defective and a write is desired. Therefore, to exclude $C_2$ for writing, a thermometer code for T3 through T0 equals 1100. Thus, $I/O_3$ communicates with $C_4$, $I/O_2$ communicates with $C_3$, $I/O_1$ communicates with $C_1$, and $I/O_0$ communicates with $C_0$. Note, therefore, that $C_2$ is not connected to any of the I/O columns. As a result, the FIG. 17 representation also permits, in the case of writing data, only the memory columns other than the defective memory column are connected to respective I/O columns.

Lastly with respect to FIG. 17, note that it as well as the earlier embodiments further demonstrate that the present principles may apply to systems for only reading, only writing, or combining reading and writing. Thus, for purposes of presenting the inventive scope, note that the I/O columns merely represent some type of data column which communicates data external with respect to the actual memory columns, meaning that communication may be either reading, writing, or both.

Returning now to FIG. 16, recall that it provides an embodiment having write capability from all input columns to corresponding non-defective memory columns. Given this aspect, still another issue addressed by the present embodiments arises in the context of byte write capability. Specifically, most memories in the art include a total number of input columns considerably larger than one byte (i.e., 8 columns). Some of these memories, however, have a so-called byte write function where only one byte of the total number of input columns may be written in a single instance. Indeed, this functionality is not always limited to a single byte, but could be any sized group of bits. For example, in a 128 column memory, it may be possible to write 32 bits at a time into the memory; therefore, in this instance, the write group size is 32 bits. For purposes of this document, therefore, this group is referred to as write unit, with it understood that it could include any number of bits with either 8 or 32 provided above only by way of example. Given this introduction to write units, note further that the present embodiments may be further modified to include functionality to permit writing of write units, as described below.

As a first approach to providing write unit functionality, note that row array 302 and its associated circuitry of FIG. 16 could be repeated multiple times where each repeated structure would therefore provide a write unit which is four bits long. In other words, each repeated instance of row array 302 would provide four input columns and five memory columns, and each repeated instance could be separately written, thereby providing a four bit write unit while further providing the column redundancy aspects discussed above. Moreover, as stated above, row array 302 need not be limited to 4 input columns. Thus, in the embodiment of repeating row array 302, each repeated structure also need not be limited to 4 input columns. For example, each structure could include eight input columns, thereby providing a write unit of eight bits for each repeated structure. However, note that for some memories such an approach may not be desirable. For example, if the eight bit structure were repeated to form a 256 bit data line, then the data line would include a total of 32 structures (i.e., 8 bits* 32 structures= 256 bit data line). However, such an approach would therefore include 32 redundant columns, and that may be more redundancy than is desired. Thus, another approach is provided immediately below.

Figure 18:
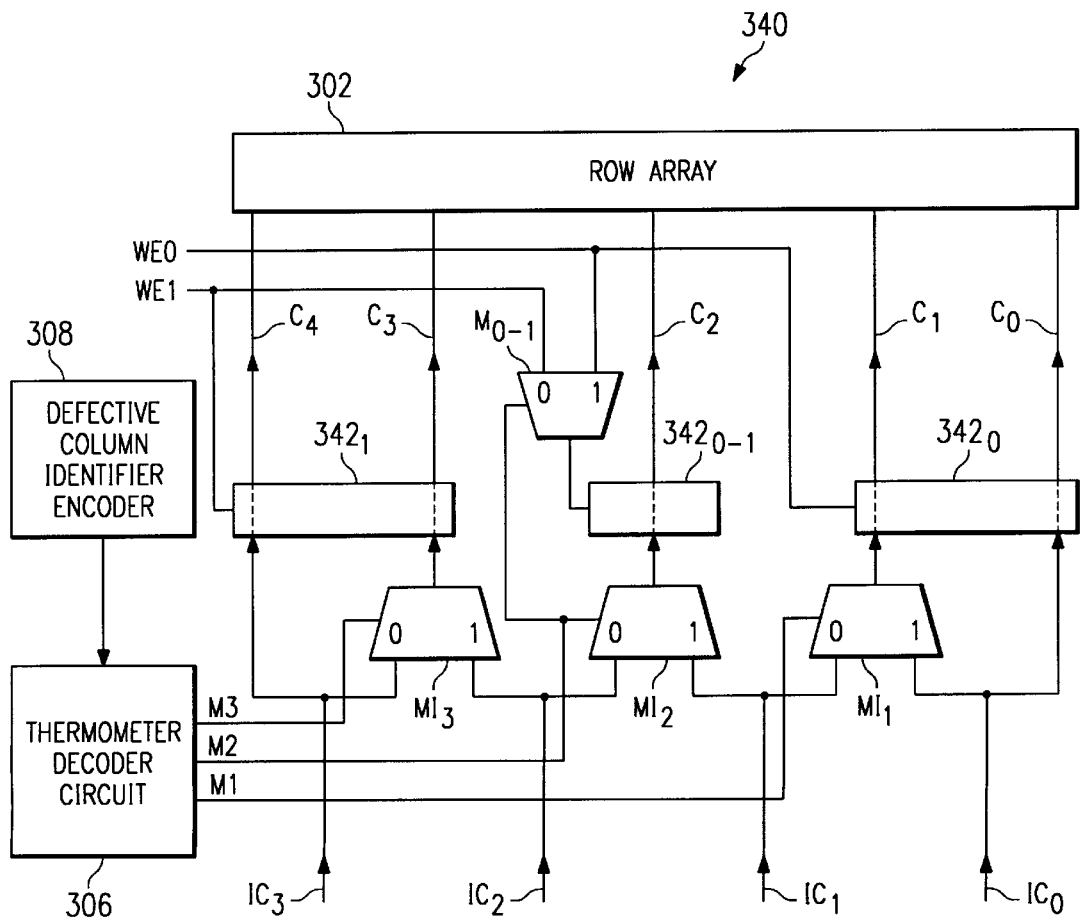
FIG. 18 illustrates the electrical diagram of FIG. 16 with additional circuitry for performing write unit functionality.

As a second approach to providing write unit functionality, FIG. 18 once again illustrates memory configuration 340 of FIG. 16 but includes additional circuitry for accomplishing the write unit functionality. For the example of FIG. 18, note that the write unit is 2 bits long and, therefore, during a write operation either one or both of the pairs of input columns may written to a corresponding one pair or two pairs of the memory columns. Of course, if desired, each write unit may be simultaneously written such that all write units are concurrently written. In the example of FIG. 18, therefore, the data from the 4 input columns would be connected to four memory columns. Turning now to the specifics of FIG. 18, the features which are carried forward from FIG. 16 above are not again detailed here and, instead, the reader is referred to the earlier discussion of such structure and its operation. Looking to the added circuitry of FIG. 18, memory configuration 340 includes a write enable signal for each of the two write units, with those signals designated as WE0 and WE1. Signal WE0 is connected as a control signal to a write enable circuit $342_0$. Write enable circuit $342_0$ provides functionality known in the art, whereby when its control signal is asserted the columns to which it is connected are enabled so that they may be written by the data input to the write enable circuit. Such functionality may be implemented, for example, by connecting the source and drain of an n-channel transistor in series with the column, and using its gate to receive the control signal. In this implementation or others selected per a person skilled in the art, when WE0 is asserted, the data input to enable circuit $342_0$ passes to memory columns C0 and C1, respectively. Due to this operation, dotted lines are shown through enable circuit $342_0$ to diagrammatically represent that the data signals input to enable circuit $342_0$ pass through it when is control signal is asserted. Signal WE1 is connected in the same manner as WE0, but to its own associated write enable circuit $342_1$. Write enable circuit $342_1$ operates in the same manner as write enable circuit $342_1$, but here with respect to memory columns $C_3$ and $C_4$. Therefore, when WE1 is asserted, the input data to write enable circuit $342_1$ passes to memory columns $C_3$ and $C_4$.

Memory configuration 340 of FIG. 18 also includes a third write enable circuit designated at $342_{0-1}$. Note that the subscript here is used to indicate that this write enable circuit enables writing to a memory column (i.e., $C_2$) located between the memory columns corresponding to write enable circuit $342_0$ and write enable circuit $342_1$. The control signal to write enable circuit designated at $342_{0-1}$ is output from a multiplexer $M_{0-1}$, which has its two data inputs connected to WE0 and WE1, and has its control input connected to the same signal which controls $MI_2$, for reasons appreciated below.

The operation of memory configuration 340 of FIG. 18 is as follows. As an introduction, note that this operation permits writing to one or more 2-bit write units based on the values of WE0 and WE1. Thus, if only one of these two values is asserted, then only the data from two of the four inputs columns are written to the memory, whereas if both of the two values are asserted, then the data at all four of input columns are written. In either case, however, recall further that the present embodiments contemplate that one of the memory columns may be defective. Consequently, the write enable function also must take this possibility into account and, as shown below, the embodiment of FIG. 18 properly achieves this goal. In general, note that write enable circuits $342_0$ and $342_1$ cause WE0 to be associated with $C_0$ and $C_1$ and WE1 to be associated with $C_3$ and $C_4$. In other words, if WE0 is asserted, then $C_0$ and $C_1$ are written, and if WE1 is asserted, then $C_3$ and $C_4$ are written. However, if one of columns $C_0$, $C_1$, $C_3$, or $C_4$ is defective, then the present embodiment further allows a part of a write unit to connect to $C_2$. In this regard, note that data passing to $C_2$ may be controlled by either W0 or W1 as determined by the control input to $M_{0-1}$. The alternative control is then based on which of the memory columns is defective. For example, assume that $C_0$ and $C_1$ are not defective and it is desired to write the data from the 2 bit write unit of $IC_0$ and $IC_1$. Therefore, WE0 is asserted and $C_0$ and $C_1$ receive the data from $IC_0$ and $IC_1$, respectively (using the thermometer pattern from above). However, assume now that $C_1$ is defective. Therefore, the write enable control signal normally intended to permit data to pass to $C_1$ (i.e., WE0) must instead be used to permit the data to pass to the non-defective column (i.e., $C_2$) which, due to the thermometer pattern, will receive the data from $IC_1$. As detailed below, multiplexer $M_{0-1}$ operates to achieve this result. In other words, for the present example, multiplexer $M_{0-1}$ couples WE0 to write enable circuit $342_{0-1}$ and, in doing so, causes the data to be written to $C_2$ such that the 2 bit write unit from $IC_0$ and $IC_1$ is written to $C_0$ and $C_2$, respectively.

Given the above example, note that during a given write, each written memory column is written in response to a write enable signal (i.e., either WE0 or WE1). As demonstrated above, however, the existence of a defective column affects which memory column is to be associated with which write enable signal in this manner. Thus, Table 7 below identifies for each memory column the corresponding write enable signal used to permit writing to that memory column given a defective one of the memory columns.

TABLE 7

|  | $C_4$ | $C_3$ | $C_2$ | $C_1$ | $C_0$ |
| --- | --- | --- | --- | --- | --- |
| WE if $C_0$ defective | WE1 | WE1 | WE0 | WE0 | don't care |
| WE if $C_1$ defective | WE1 | WE1 | WE0 | don't care | WE0 |
| WE if $C_2$ defective | WE1 | WE1 | don't cane | WE0 | WE0 |
| WE if $C_3$ defective | WE1 | don't care | WE1 | WE0 | WE0 |
| WE if $C_4$ defective | don't care | WE1 | WE1 | WE0 | WE0 |

To better appreciate Table 7, it is instructive to trace through a few of its rows, as is done immediately below.

As a first example of the Table 7 indications, assume $C_4$ is defective and, therefore, the bottom row of Table 7 is the desired use of the write enable signals. Before detailing the Table 7 row, recall from the discussion of FIG. 16 above that the thermometer pattern in the instance of defective $C_4$ directs the data from $IC_0$ to $C_0$, the data from $IC_1$ to $C_1$, the data from $IC_2$ to $C_2$, and the data from $IC_3$ to $C_3$. In the entirety of four bits, therefore, this represents a write of two write units where each write unit has two bits. Turning to the lower ordered write unit (i.e., $IC_0$ and $IC_1$), its path through the circuit should be controlled by WE0. Specifically, note the path of each of the two bits in this write unit. First, the data from $IC_0$ connects directly to write enable circuit $342_0$ and, in response to WE0 being asserted, passes to $C_0$. Second, the data from $IC_1$ connects through $MI_1$ to write enable circuit $342_0$ and, in response to WE0 being asserted, passes to $C_1$. Now considering the higher ordered write unit i.e., $IC_2$ and $IC_3$), its path through the circuit should be controlled by WE1 and, thus, consider each of the two bits in this write unit. Turning to the data at $IC_2$, recall for a defective $C_4$ that this data is directed by $MI_2$ to $C_2$. In the present instance, therefore, $C_2$ should be enabled by WE1, as is shown in the middle entry of the bottom row of Table 7. In this regard, recall from Table 6 above that for the present example of a defective $C_4$, the control signal to $MI_2$, which is also connected to control $M_{0-1}$, equals 0. Based on the configuration of the FIG. 18, therefore, the 0 control signal causes $M_{0-1}$ to selects WE1 from one of its inputs and output it to write enable circuit $342_{0-1}$. Consequently WE1 is used to control the writing of $C_2$ as indicated from Table 7. Lastly, looking at the data at $IC_3$, recall that for a defective $C_4$ that this data is directed by $MI_3$ to $C_3$. Because $C_3$ is connected to write enable circuit $342_1$, it is controlled by WE1 as shown in FIG. 18, thereby complying with the indication of Table 7.

As a second example of the Table 7 indications, assume $C_0$ is defective and, therefore, the top row of WE indications in Table 7 is the desired use of the write enable signals. First, recall from the discussion of FIG. 16 above that the thermometer pattern in the instance of defective $C_0$ directs the data from $IC_0$ to $C_1$, the data from $IC_1$ to $C_2$, the data from $IC_2$ to $C_3$, and the data from $IC_3$ to $C_4$. Turning to the lower ordered write unit (i.e., $IC_0$ and $IC_1$), its path through the circuit should be controlled by WE0. In this regard, first the data from $IC_0$ connects through $MI_1$ to write enable circuit $342_0$ and, in response to WE0 being asserted, passes to $C_1$. Second, however, the data from $IC_1$ connects through $MI_2$ to write enable circuit $342_{0-1}$. Based on Table 7, therefore, in this instance write enable circuit $342_{0-1}$ should be controlled by WE0. In this regard, recall from Table 6 above that for the present example of a defective $C_0$, the control signal to $MI_2$, which is also connected to control M0-1 equals 1. Thus, the 1 control signal causes $M_{0-1}$ to select WE0 from one of its inputs and output it to write enable circuit $342_{0-1}$. Consequently WE0 is used to control the writing of $C_2$ as indicated from Table 7. Now considering the higher ordered write unit (i.e., $IC_2$ and $IC_3$), its path through the circuit should be controlled by WE1 and, thus, consider each of the two bits in this write unit. Turning to the data at $IC_2$, recall for a defective $C_0$ that this data is directed by $MI_3$ to $C_3$. In the present instance, therefore, $C_3$ should be enabled by WE1 and this occurs due to the connection of WE1 to write enable circuit $342_1$. Lastly, looking at the data at $IC_3$, recall that it is directly connected to write enable circuit $342_1$ and, therefore, it is controlled by WE1 as shown in FIG. 18, thereby complying with the indication of Table 7.

Having presented the above two examples, one skilled in the art may trace the remaining instances depicted by Table 7 to confirm the proper operation of the write unit operability of memory configuration 340 of FIG. 18. Moreover, note that the above two examples demonstrate how the same bit which controls $MI_2$ also may control $MI_{0-1}$. This conclusion is further borne out by comparing the center column of control information in Tables 6 and 7. Specifically, it is apparent from the top two rows of Table 6 that a control value of 1 is output to $MI_2$ for either a defective $C_0$ or a defective $C_1$, and from the top two rows of Table 7 that such a value will cause WE0 to write enable $C_2$ in those events. Similarly, it is likewise apparent from the bottom two rows of Table 6 that a control value of 0 is output to $MI_2$ for either a defective $C_3$ or a defective $C_4$, and from the bottom two rows of Table 7 that such a value will cause WE1 to write enable $C_2$ in those events. In each instance, therefore, the data from an input column is properly routed to a memory column, and write unit enabling is permitted.

Figure 19:
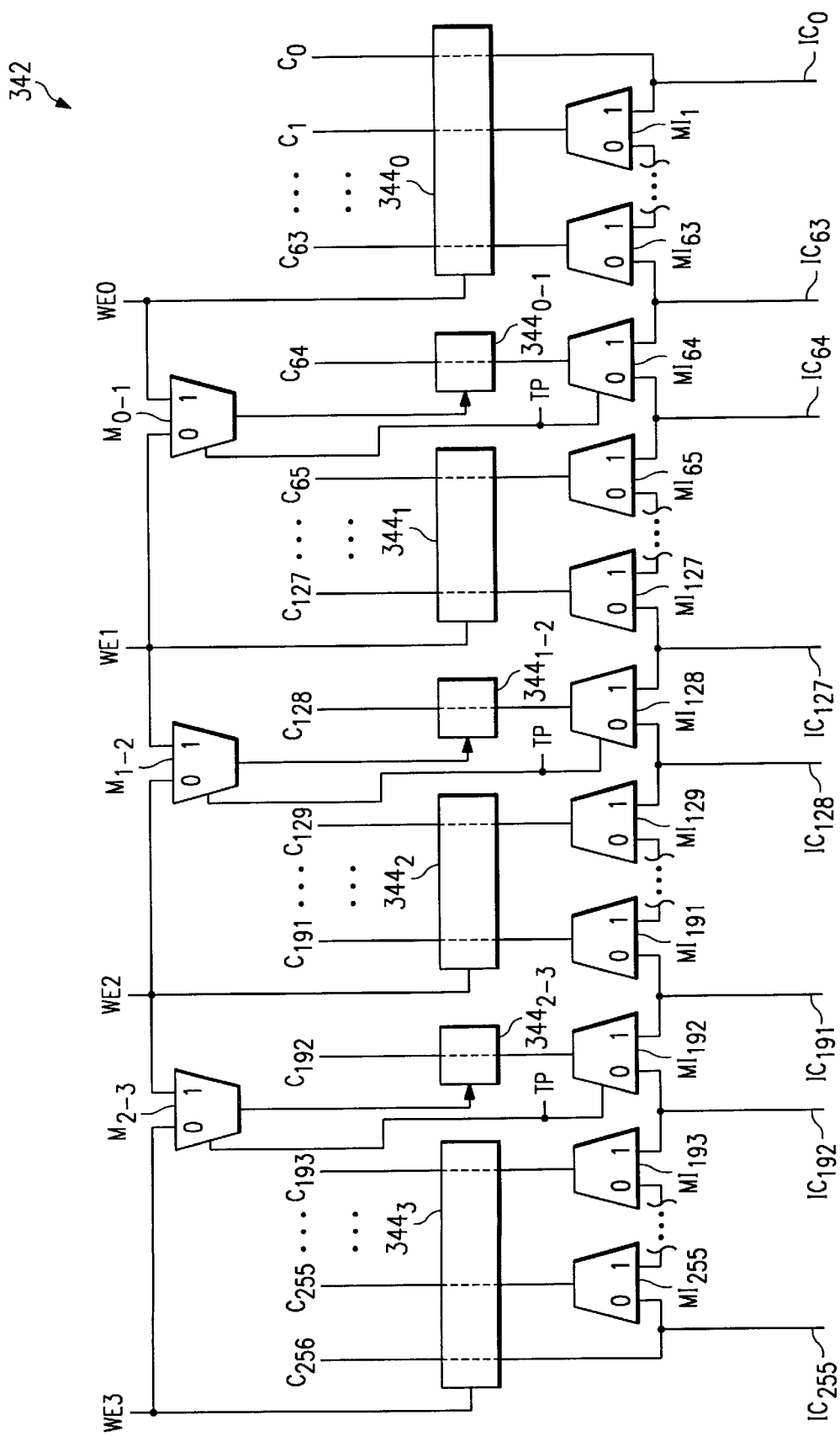
FIG. 19 illustrates an electrical diagram of an alternative memory configuration for proving write unit functionality for four 64 bit write units.

FIG. 19 illustrates a memory configuration designated generally at 342. Configuration 342 illustrates another example of the write-enable principles from FIG. 18 but in a different sized architecture in order to demonstrate to one skilled in the art that various of the present concepts may apply to architectures of size different than the example provided in FIG. 18. To simplify FIG. 19, however, it does not include each multiplexer connected to each input column for routing data based on which of the memory columns is defective, although some of these multiplexers are shown to provide a context for the overall system. Turning then to configuration 342, it includes a total of 256 input columns designated $IC_0$ through $IC_{255}$, again with only some of these input columns shown to simplify the Figure. As better appreciated below, these 256 input columns are divided into four write units, with each unit consisting of 64 bits. Thus, consistent with the above explanation, any one or more of the four write units may be written at a time. The layout of configuration 342 is perhaps most straightforward by observing the structure from outermost columns to innermost columns, and in the context of write units. Thus, each is described below.

Turning to the outermost input columns of configuration 342, note that they include input columns $IC_0$ through $IC_{63}$ to form a first write unit, and input columns $IC_{192}$ through $IC_{255}$ to form a fourth write unit. The connections of these two write units are generally symmetric within configuration 342, as appreciated by the following discussion of each such write unit. Looking to the first write unit of $IC_0$ through $IC_{63}$, and as in FIG. 18, $IC_0$ is connected so that it may pass data either directly to memory column $C_0$, or through a multiplexer $MI_1$, to memory column $C_0$, while the remaining input columns for the first write unit (i.e., $IC_1$ through $IC_{63}$) are connected to data inputs of two successive multiplexers within the group of $MI_1$ through $MI_{63}$. The outputs of each of $MI_1$ through $MI_{63}$ is connected to a single write enable unit $344_0$. Write enable unit $344_0$ responds to an asserted WE0 control signal to connect the data at its input to its outputs, which are connected to memory columns $C_0$ through $C_{63}$. Looking to the fourth write unit of $IC_{192}$ through $IC_{255}$, $IC_{255}$ is connected so that it may pass either directly toward, or through a multiplexer $MI_{255}$, toward memory column $C_{256}$, while the remaining input columns for the second write unit (i.e., $IC_{192}$ through $IC_{254}$) are connected to data inputs of two successive multiplexers within the group of $MI_{193}$ through $MI_{255}$. The outputs of each of $MI_{193}$ through $MI_{255}$ is connected to a single write enable unit $344_3$. Write enable unit $344_3$ responds to an asserted WE3 control signal to connect the data at its input to its outputs, which are connected to memory columns $C_{193}$ through $C_{256}$.

Turning to the innermost columns of configuration 342, note that they include input columns $IC_{64}$ through $IC_{127}$ to form a second write unit, and input columns $IC_{128}$ through $IC_{191}$ to form a third write unit. The connections of these two write units are also generally symmetric within configuration 342, as appreciated by the following discussion of each such write unit. Looking to the second write unit of $IC_{64}$ through $IC_{127}$, $IC_{64}$ is connected to the data inputs of two successive multiplexers. However, with respect to one of those multiplexers, namely $MI_{64}$, note that its other input is connected to an input column from an adjacent write unit. In other words, $MI_{64}$ has its second input connected to $IC_{63}$, which is part of the adjacent first write unit. Therefore, the output of $MI_{64}$ (i.e., $C_{64}$) forms a boundary column between two adjacent write units. Given the above-described operation of the embodiment of FIG. 18 and its commonality to FIG. 19, one skilled in the art will appreciate that $C_{64}$ may present data from either of the two adjacent write units, that is, it may present data from $IC_{63}$ of the first write unit or from $IC_{64}$ of the second write unit, depending on the location of the defective column among memory columns $C_0$ through $C_{256}$. Looking to the third write unit of $IC_{128}$ through $IC_{191}$, $IC_{128}$ is connected also to the data inputs of two successive multiplexers and, again, where one of those multiplexers, namely $MI_{128}$, is connected to an input column from an adjacent write unit. Here, $MI_{128}$ has one data input connected to $IC_{128}$ which is part of the third write unit, but has another data input connected to $IC_{127}$, which is part of the second write unit. Therefore, the output of $MI_{128}$ (i.e., $C_{128}$) forms a boundary column between the adjacent second and third write units. Thus, $C_{128}$ may present data from either the second or third write unit, depending on the location of the defective column among memory columns $C_0$ through $C_{256}$. Lastly, note that $IC_{191}$ of the third write unit also connects to a boundary column. Specifically, $IC_{191}$ is connected to the data input of $MI_{192}$, which has another data input connected to $IC_{192}$, which is part of the fourth write unit. Therefore, the output of $MI_{192}$ (i.e., $C_{192}$) forms a boundary column between the adjacent third and fourth write units. Thus, $C_{192}$ may present data from either the third or fourth write unit, depending on the location of the defective column among memory columns $C_0$ through $C_{256}$.

Given the connections above as well as the identified boundary columns, note further that configuration 342 includes the necessary connections to properly route data given a defective column and the write unit functionality. Specifically, note that each boundary column $C_{64}$, $C_{128}$, and $C_{192}$, is connected to a corresponding write enable circuit $344_{0-1}$, $344_{1-2}$, and $344_{2-3}$ for purposes of write unit control. As in FIG. 18, the hyphenated subscript of each of these write enable circuits designates that each circuit may be enabled by one of two write enable signals. For example, write enable circuit $344_{2-3}$, corresponding to boundary column $C_{192}$, may be enabled by either WE2 or WE3. To permit either of these two write enable signals to provide control, the control input to each write enable circuit associated with a boundary column is connected to the output of a corresponding multiplexer which shares the same subscript to illustrate the relationship just described. For example, returning to boundary column $C_{192}$, its write enable circuit $344_{2-3}$ is connected to the output of a multiplexer $M_{2-3}$, which has WE2 and WE3 as its data inputs. Lastly, the control input of multiplexer $M_{2-3}$ is connected to the same signal which controls the multiplexer which outputs data for the corresponding boundary column. In the current example, $MI_{128}$ outputs data to boundary column $C_{192}$, and, therefore, its control bit from the thermometer pattern (abbreviated "TP" on FIG. 19) is also connected to control $M_{2-3}$. Note that the immediately preceding discussion of write enable circuit $344_{2-3}$ also applies to the other write enable circuits $344_{0-1}$ and $344_{1-2}$ and their corresponding boundary columns $C_{64}$ and $C_{128}$. Thus, write enable circuit $344_{0-1}$ is connected to be controlled by either WE0 or WE1, and those two write enable signals are provided by a multiplexer $M_{0-1}$ which is controlled by the thermometer pattern bit corresponding to the multiplexer $MI_{64}$ which provides the data for the boundary column $C_{64}$. Similarly, write enable circuit $344_{1-2}$ is connected to be controlled by either WE1 or WE2, and those two write enable signals are provided by a multiplexer $M_{1-2}$ which is controlled by the thermometer pattern bit corresponding to the multiplexer $MI_{128}$ which provides the data for the boundary column $C_{128}$.

The operation of configuration of 342 is generally the same as that for configuration 340 of FIG. 18 and, therefore, the reader is referred above. The differences, however, involve the dimensions of the circuits. In other words, up to 256 input columns may be written in FIG. 19 as opposed to up to four input columns in FIG. 18. Moreover, up to four write units may be written in FIG. 19 as opposed to up to two write units in FIG. 18. Given the commonality, however, one skilled in the art should appreciate the remaining operation. Nevertheless, as one example to further demonstrate the various principles, assume the memory column $C_{10}$ is defective and it is desired to write one write unit with data from $IC_0$ through $IC_{63}$. In this instance, the appropriate thermometer pattern may be extrapolated from Table 6. For example, recall for the thermometer pattern that that the number of logic 0's starting from the right of each row equals the binary number represented by the encoding of the defective column, and that all bits other than either the least significant or the most significant bit of that pattern may be used to control the input multiplexers. Thus, disregarding the most significant bit of that pattern, the pattern for the input multiplexers for a defective $C_{10}$ will have 10 logic 0's starting from its right end to control $MI_1$ through $MI_{10}$, and 245 logic 1's thereafter to control $MI_{11}$ through $MI_{255}$. Thus, the multiplexer $MI_{64}$ corresponding to boundary column $C_{64}$ will receive a logic 1 at its control input (i.e., one of the 245 logic 1's), as will the multiplexer $M_{1-0}$ which selects between WE0 and WE1 to control write enable circuit $344_{0-1}$. In response, therefore, $M_{1-0}$ selects WE0 and connects it to control write enable circuit $344_{0-1}$, thereby properly allowing the data from $IC_{63}$ to pass to $C_{64}$.

From the above, it may be appreciated that the above embodiments provide various alternatives for improving memory column redundancy. Numerous advantages have been set forth or apparent from the above. For example, various of the above aspects apply to either reading from a group of columns where one of those columns is defective, or writing to a group of columns where one of those columns is defective, or both. As another example, the embodiments may be modified to provide more than one redundant column. As still another example, write unit functionality also may be implemented within the present embodiments. Still further, while the microprocessor of FIG. 21 may benefit from the above techniques, various other microprocessors may benefit as well. Therefore, while the present embodiments have been described in detail, and various substitutions, modifications or alterations also have been suggested, still further variations could be made to the descriptions set forth above without departing from the inventive scope.

3. Combined Memory Row and Memory Column Redundancy

Figure 20:
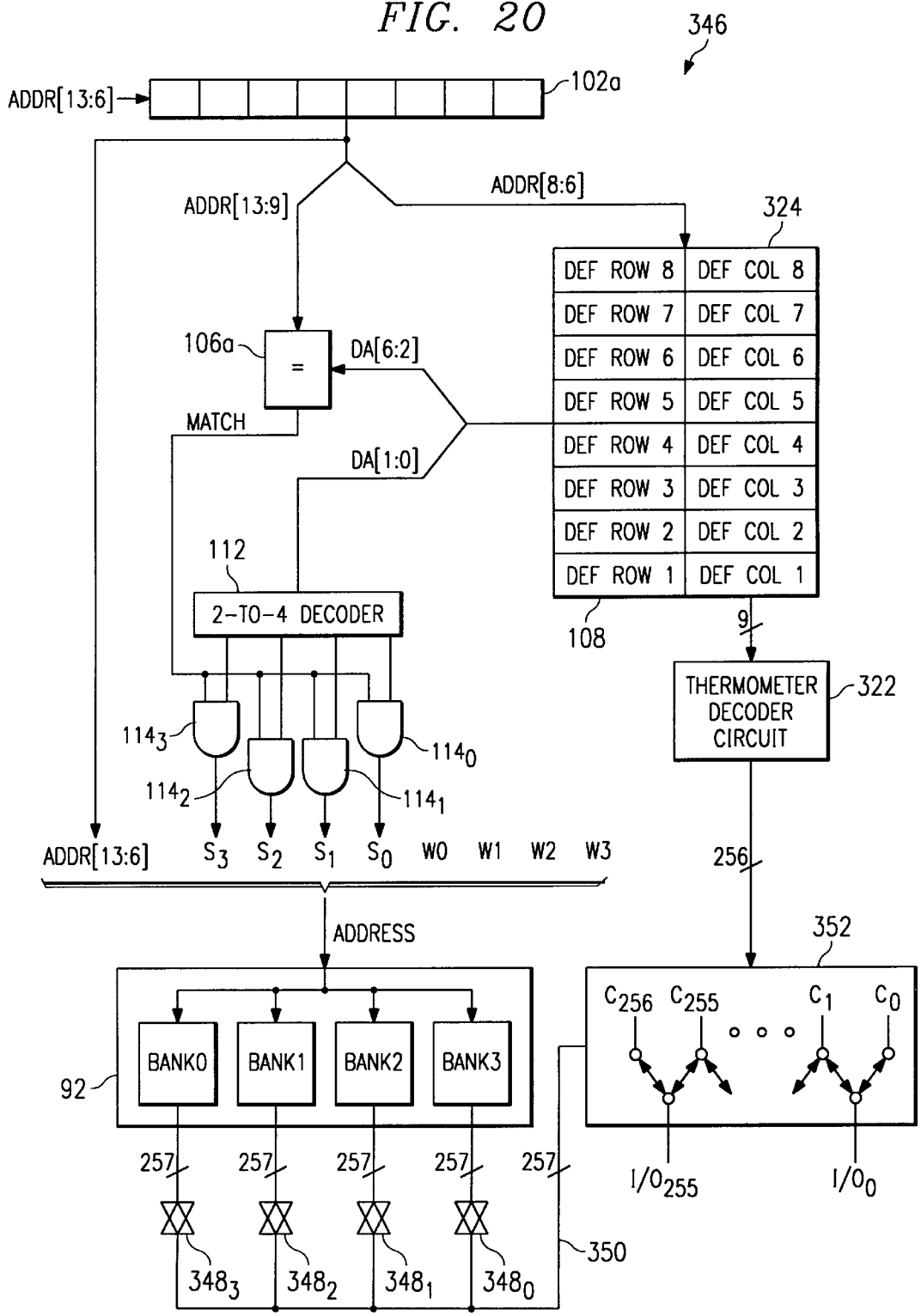
FIG. 20 illustrates an electrical diagram combining various of the above aspects with respect to both memory row and memory column redundancy.

With the above sections having described in detail both memory row and memory column redundancy configurations, FIG. 20 illustrates a memory configuration 346 which combines numerous concepts from both of the above-described types of redundancy. In this regard, where common elements are used from earlier Figures, then common reference numerals are carried forward to FIG. 20. Moreover, the reader is assumed familiar with the earlier discussion and, therefore, the following discussion briefly summarizes the combination of the technologies as exemplified by configuration 346.

Memory configuration 346 receives an ADDRESS for purposes of either reading data from, or writing data to, data memory 92 which again includes four BANKs of memory. To simplify FIG. 20, these BANKs are generally labeled but the additional detail such as shown in FIG. 8a is not shown in FIG. 20. As now demonstrated, either the read or write operation occurs in connection with both row and column redundancy. Specifically, the ADDRESS is received by input storage device 102a and, more particularly, in the present embodiment bits ADDR[13:6] of the address are received. In order to determine whether either or both of a defective row or a defective column is being addressed by this received address, bits ADDR[8:6] are connected to both defective row identifier block 108 and defective column identifier encoder 324. Again, therefore, bits ADDR[8:6] identify both the one of four BANKs at issue for the current ADDRESS, and further indicate whether the top or bottom half of that BANK is being addressed. In response to bits ADDR[8:6], and assuming the addressed BANK half includes a defective row, defective row identifier block 108 outputs a defective row address "DA" and, more particularly, bits DA[6:2] are output to comparator 106a while bits DA[1:0] are output to 2-to-4 decoder 112. Also in response to bits ADDR[8:6], and assuming the addressed BANK half includes a defective column, defective column identifier encoder 324 outputs a nine bit identifier of a defective column (if any) to thermometer decoder circuit 322. The additional operations are understood below by first examining the operation with respect to row redundancy, and then further examining the operation with respect to column redundancy.

With respect to row redundancy, comparator 106a compares bits ADDR[13:9] to bits DA[6:2] to determine if the current ADDRESS is directed to a block of rows (i.e., including four different ways) which includes a defective row. If so, the MATCH signal is asserted and, if not, the MATCH signal is not asserted. Additionally, bits DA[1:0] are decoded by 2-to-4 decoder to one of four bit sequences as shown in Table 3, above, and the sequence is output to AND gates $114_0$ through $114_3$. Note that the output of AND gates $114_0$ through $114_3$ is now shown as bits $S_0$ through $S_3$, respectively. In other words, these signals may be directly connected as a part of the address to be passed to a memory decoder such as shown in FIGS. 10a and 10b. Indeed, note further that bits ADDR[13:6] also form part of this address as well, so those bits also are passed to one or more memory decoders such as the one shown in FIGS. 10a and 10b. Lastly, recall also that the way HIT signals W0 through W3 also form part of the address and, thus, they too are shown in FIG. 20. Indeed, to generally illustrate the addressing of data memory 92, FIG. 20 merely combines bits ADDR [13:6], $S_0$ through $S_3$, and bits W0 through W3 as the overall address to be passed to data memory 92. Concluding the row redundancy operation, therefore, if the ADDRESS received by storage circuit 102a is directed to a non-defective row, then bits ADDR[13:6] and W0 through W3 are passed to data memory 92 along with values of zero for each of $S_0$ through $S_3$, thereby causing the non-defective row to be addressed. In contrast, if the ADDRESS received by storage circuit 102a is directed to a defective row, then bits ADDR [13:6] and W0 through W3 are again passed to data memory 92, but here are combined with a value of one for one of $S_0$ through $S_3$ (the other three having a value of zero), thereby effectively creating a different address and causing a spare row, rather than the defective row, to be addressed. In either event, one of the rows in one of BANKs 0 through 3 is addressed, and its 257 columns of data is coupled via a corresponding one of four bidirectional buffers $348_0$ through $348_3$ to a bus 350. From this point, therefore, column redundancy operations may occur as described below.

The 257 columns of data on bus 350 are connected to corresponding columns $C_0$ through $C_{257}$ of a switched circuit 352, which is shown generally using the same format of FIG. 17 and, thus, which may be constructed using various of the multiplexer configurations described above as well as other alternatives ascertainable by one skilled in the art. In any event, given the earlier description of FIG. 17, it is clear for purposes of FIG. 20 that a thermometer pattern is directed from thermometer decoder circuit 322 to switched circuit 352 and, in response to that pattern, data may be selectively coupled between the 257 memory columns and the 256 input/output columns, thereby prohibiting erroneous results if a defective column is at issue given the currently received ADDRESS. Again, for purposes of reading from data memory 92, the defective memory column is merely excluded from providing data to an input/output column, while for purposes of writing data to data memory 92, the defective memory column will receive data but that same data is also written to another non-defective column so that it is properly retrievable at a later time.

Given the above, one skilled in the art will appreciate that the memory row and column concepts described in this document may be combined to form still other embodiments consistent with the present teachings. Thus, where fuses are used for both defective row identifier block 108 and defective column identifier encoder 324 then a single region may be formed on the configuration where these fuses form an overall storage type structure for identifying both defective rows and columns. In addition, while FIG. 20 illustrates the combination of only two specific embodiments described earlier, clearly one skilled in the art could combine other alternatives provided above. In any event, there is provided an improved row and column redundancy system.

4. Microprocessor Configuration

Figure 21:
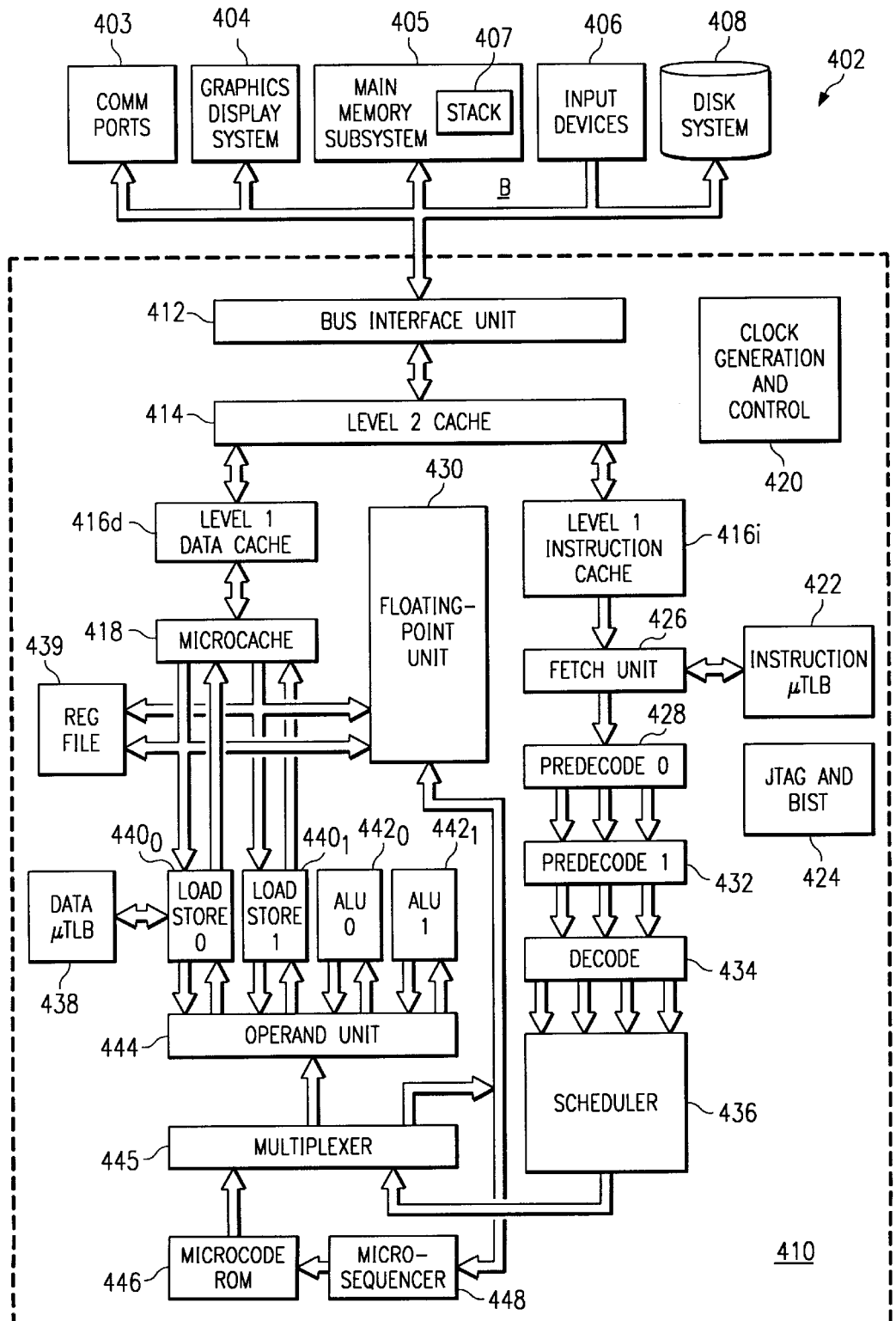
FIG. 21 illustrates an exemplary microprocessor in which the above embodiments may be implemented.

Having described the above embodiments, FIG. 21 illustrates a block diagram of a microprocessor embodiment into which the above embodiments may be incorporated. FIG. 21 depicts an exemplary data processing system 402, including an exemplary superscalar pipelined microprocessor 410 within which the preferred embodiment is implemented, will be described. It is to be understood that the architecture of system 402 and of microprocessor 410 is described herein by way of example only, as it is contemplated that the present embodiments may be utilized in microprocessors of various architectures. It is therefore contemplated that one of ordinary skill in the art, having reference to this specification, will be readily able to implement the present embodiments in such other microprocessor architectures. It is further contemplated that the present invention may be realized in single-chip microprocessors and microcomputers or in multiple-chip implementations, with the manufacture of such integrated circuits accomplished according to silicon substrate, silicon-on-insulator, gallium arsenide, and other manufacturing technologies, and using MOS, CMOS, bipolar, BiCMOS, or other device implementations.

Microprocessor 410, as shown in FIG. 21, is connected to other system devices by way of bus B. While bus B, in this example, is shown as a single bus, it is of course contemplated that bus B may represent multiple buses having different speeds and protocols, as is known in conventional computers utilizing the PCI local bus architecture; single bus B is illustrated here merely by way of example and for its simplicity. System 402 contains such conventional subsystems as communication ports 403 (including modem ports and modems, network interfaces, and the like), graphics display system 404 (including video memory, video processors, a graphics monitor), main memory system 405 which is typically implemented by way of dynamic random access memory (DRAM) and includes a stack 407, input devices 406 (including keyboard, a pointing device, and the interface circuitry therefor), and disk system 408 (which may include hard disk drives, floppy disk drives, and CD-ROM drives). It is therefore contemplated that system 402 of FIG. 21 corresponds to a conventional desktop computer or workstation, as are now common in the art. Of course, other system implementations of microprocessor 410 can also benefit from the present embodiments, as will be recognized by those of ordinary skill in the art.

Microprocessor 410 includes a bus interface unit ("BIU") 412 that is connected to bus B, and which controls and effects communication between microprocessor 410 and the other elements in system 402. BIU 412 includes the appropriate control and clock circuitry to perform this function, including write buffers for increasing the speed of operation, and including timing circuitry so as to synchronize the results of internal microprocessor operation with bus B timing constraints. Microprocessor 410 also includes clock generation and control circuitry 420 which, in his exemplary microprocessor 410, generates internal clock phases based upon the bus clock from bus B; the frequency of the internal clock phases, in this example, may be selectably programmed as a multiple of the frequency of the bus clock.

As is evident in FIG. 21, microprocessor 410 has three levels of internal cache memory, with the highest of these as level 2 cache 414, which is connected to BIU 412. In this example, level 2 cache 414 is a unified cache, and is configured to receive all cacheable data and cacheable instructions from bus B via BIU 412, such that much of the bus traffic presented by microprocessor 410 is accomplished via level 2 cache 414. Of course, microprocessor 410 may also effect bus traffic around level 2 cache 414, by treating certain bus reads and writes as "not cacheable". Level 2 cache 414, as shown in FIG. 21, is connected to two level 1 caches 416; level 1 data cache 416d is dedicated to data, while level 1 instruction cache 416i is dedicated to instructions. Power consumption by microprocessor 410 is minimized by accessing level 2 cache 414 only in the event of cache misses of the appropriate one of the level 1 caches 416. Furthermore, on the data side, microcache 418 is provided as a level 0 cache, which in this example is a fully dual-ported cache.

As shown in FIG. 21 and as noted hereinabove, microprocessor 410 is of the superscalar type. In this example multiple execution units are provided within microprocessor 410, allowing up to four instructions to be simultaneously executed in parallel for a single instruction pointer entry. These execution units include two ALUs $442_0$, $442_2$ for processing conditional branch, integer, and logical operations, floating-point unit (FPU) 430, two load-store units $440_0$, $440_1$, and microsequencer 448. The two load-store units 440 utilize the two ports to microcache 418, for true parallel access thereto, and also perform load and store operations to registers in register file 439 as well as to the level 1 caches 116d and 116i. Data microtranslation lookaside buffer ($\mu$TLB) 438 is provided to translate logical data addresses into physical addresses, in the conventional manner.

These multiple execution units are controlled by way of multiple pipelines with seven stages each, with write back. The pipeline stages are as follows:

F Fetch: This stage generates the instruction address and reads the instruction from the instruction cache or memory PD0 Predecode stage 0: This stage determines the length and starting position of up to three fetched x86-type instructions PD1 Predecode stage 1: This stage extracts the x86 instruction bytes and recodes them into fixed length format for decode DC Decode: This stage translates the x86 instructions into atomic operations (AOps)

SC Schedule: This stage assigns up to four AOps to the appropriate execution units OP Operand: This stage retrieves the register and/or memory operands indicated by the AOps EX Execute: This stage runs the execution units according to the AOps and the retrieved operands WB Write back: This stage stores the results of the execution in registers or in memory Referring back to FIG. 21, the pipeline stages noted above are performed by various functional blocks within microprocessor 410. Fetch unit 426 generates instruction addresses from the instruction pointer, by way of instruction micro-translation lookaside buffer ($\mu$TLB) 422, which translates the logical instruction address to a physical address in the conventional way, for application to level 1 instruction cache 116i. Instruction cache 116i produces a stream of instruction data to fetch unit 426, which in turn provides the instruction code to the predecode stages in the desired sequence. Speculative execution is primarily controlled by fetch unit 426.

Predecoding of the instructions is broken into two parts in microprocessor 410, namely predecode 0 stage 428 and predecode 1 stage 432. These two stages operate as separate pipeline stages, and together operate to locate up to three x86 instructions and apply the same to decoder 434. As such, the predecode stage of the pipeline in microprocessor 410 is three instructions wide. Predecode 0 unit 428, as noted above, determines the size and position of as many as three x86 instructions (which, of course, are variable length), and as such consists of three instruction recognizers; predecode 1 unit 432 recodes the multi-byte instructions into a fixed-length format, to facilitate decoding.

Decode unit 434, in this example, contains four instruction decoders, each capable of receiving a fixed length x86 instruction from predecode 1 unit 432 and producing from one to three atomic operations (AOps); AOps are substantially equivalent to RISC instructions. Three of the four decoders operate in parallel, placing up to nine AOps into the decode queue at the output of decode unit 434 to await scheduling; the fourth decoder is reserved for special cases. Scheduler 436 reads up to four AOps from the decode queue at the output of decode unit 434, and assigns these AOps to the appropriate execution units. In addition, the operand unit 444 receives and prepares the operands for execution, As indicated in FIG. 21, operand unit 444 receives an input from scheduler 436 and also from microcode ROM 446, via multiplexer 445, and fetches register operands, and/or memory operands via load/store units $440_0$ and or $440_1$, for use in the execution of the instructions. In addition, according to this example, operand unit 444 performs operand forwarding to send results to registers that are ready to be stored, and also performs address generation for AOps of the load and store type.

Microsequencer 448, in combination with microcode ROM 446, control ALUs 442 and load/store units 440 in the execution of microcode entry AOps, which are generally the last AOps to execute in a cycle. In this example, microsequencer 448 sequences through microinstructions stored in microcode ROM 446 to effect this control for those microcoded microinstructions. Examples of microcoded microinstructions include, for microprocessor 410, complex or rarely-used x86 instructions, x86 instructions that modify segment or control registers, handling of exceptions and interrupts, and multi-cycle instructions (such as REP instructions, and instructions that PUSH and POP all registers).

Microprocessor 410 also includes circuitry 424 for controlling the operation of JTAG scan testing, and of certain built-in self-test functions, ensuring the validity of the operation of microprocessor 410 upon completion of manufacturing, and upon resets and other events.

Given the various levels of cache set forth above, note further that microprocessor 410 may include in one or more of its cache memories either or both of the row redundancy and column redundancy configurations set forth in previous sections of this document. From the above description of FIGS. 1 through 20, therefore, one skilled in the art will appreciate the operation of these components in connection with FIG. 21. Still further, various related functionality may be further performed by the appropriate circuitry within FIG. 21.

5. Conclusion

From the above, it may be appreciated that the above embodiments provide numerous advantages over the prior art. For example, various types of memory configurations may be formed to provide either row redundancy, column redundancy, or both row and column redundancy. Further, there is not as significant a concern with the drawback of the prior art where a large number of fuses are required to implement redundancy, and where those fuses are located in a non-central manner across the architecture. Still further, while the microprocessor of the previous section illustrates an example architecture in which the redundant memory configurations described earlier may be implemented, still other architectures may benefit as well. Moreover, numerous other advantages have been set forth above, and still further will be ascertainable by one skilled in the art. Consequently, while the present embodiments have been described in detail, various substitutions, modifications or alterations could be made to the descriptions set forth above without departing from the inventive scope which is defined by the claims set forth below.

I claim:

1. A memory configuration, comprising:

a row array comprising a plurality of rows;

a plurality of memory columns, wherein each of the plurality of rows is constructed to communicate a plurality of signals along the plurality of memory columns and wherein each of the plurality of memory columns provides a memory column output;

a plurality of data columns, wherein each of the plurality of data columns is operable to communicate a data signal external with respect to the memory configuration;

an encoder circuit for identifying an identified one of the plurality of memory columns;

a decoder circuit, responsive to the identified one of the plurality of memory columns identified by the encoder circuit, for coupling selected ones of the plurality of memory columns to corresponding ones of the data columns; and wherein the corresponding ones of the data columns include at least each of the plurality of memory columns other than the identified one of the plurality of memory columns.

2. The memory configuration of claim 1:

wherein each of the plurality of memory columns is for outputting information; and wherein the corresponding ones of the data columns include only each of the plurality of memory columns other than the identified one of the plurality of memory columns.

3. The memory configuration of claim 1:

wherein each of the plurality of memory columns is for inputting information;

wherein each of the corresponding ones of the data columns other than a single one of the corresponding ones of the data columns is connected to only a single corresponding one of the plurality of memory columns; and wherein the single one of the corresponding ones of the data columns is connected to both one of the plurality of memory columns and to the identified one of the plurality of memory columns.

4. The memory configuration of claim 1:

wherein the decoder circuit comprises an integer number M of multiplexers identifiable in an ascending order from a first multiplexer to a last multiplexer, wherein each of the multiplexers has an output, a first data input, a second data input, and a control input for receiving a control signal such that the multiplexer will select the signal from one of the first and second data inputs and connect it to the output; and wherein a pair of the plurality of memory columns is connected to the first and second data input of each of the multiplexers starting with a first pair of successive ascending ordered memory columns such that a first column of the first pair is connected to the first data input of the first multiplexer and a second column of the first pair is connected to the second data input of the first multiplexer, and with each of the ascending ordered multiplexers having its first and second data inputs connected to a next pair of successive ones of the memory columns, where the next pair of successive ones of the memory columns shares the higher ordered memory column of a preceding pair of the successive ascending ordered memory columns.

5. The memory configuration of claim 4 wherein each one of the data columns is connected to one of the outputs of one of the integer number M of multiplexers.

6. The memory configuration of claim 4:

wherein the decoder circuit comprises a thermometer decoder circuit coupled to provide a control sequence comprising a control bit connected to each control input of each of the integer number M of multiplexers;

wherein the control sequence comprises an integer number equal to M of control bits starting with a first control bit and ending with a last control bit;

wherein each of the control bits has either a first or second logic state; and wherein the control sequence comprises a continuum such that each of the control bits is either in the first logic state, in the second logic state, or such that a first group of control bits from the first control bit through an intermediate control bit are in the first logic state while a second group of control bits from the control bit immediately after the intermediate control bit through the last control bit are in the second logic state.

7. The memory configuration of claim 1 wherein the encoder circuit comprises a plurality of configurable fuses.

8. The memory configuration of claim 7:

wherein the plurality of configurable fuses is an integer number F of the configurable fuses;

wherein the integer number F is defined by the equation of $f_{CEILING}\{\log_2(N+1)\}$;

wherein N is the number of columns in the plurality of memory columns; and wherein $f_{CEILING}$ is a function which takes the value of $\log_2(N+1)$ if it is an integer or rounds the value up to the next highest integer if the value of $\log_2(N+1)$ is non-integer.

9. The memory configuration of claim 1:

wherein the row array comprises a first row array;

wherein the plurality of columns comprises a first plurality of memory columns; and further comprising:

a second row array comprising a plurality of rows;

a second plurality of memory columns, wherein each of the plurality of rows of the second row array is constructed to communicate a plurality of signals along the second plurality of memory columns and wherein each of the second plurality of memory columns provides a memory column output;

wherein the identified one of the plurality of memory columns comprises a first identified one of the first plurality of memory columns;

wherein the encoder circuit is further for identifying a second identified one of the second plurality of memory columns; and wherein the decoder circuit, responsive to the encoder circuit, is for coupling either selected one of the first plurality of memory columns to corresponding ones of the data columns responsive to the first identified one of the first plurality of memory columns or for coupling selected one of the second plurality of memory columns to corresponding ones of the data columns responsive to the second identified one of the second plurality of memory columns.

10. The memory configuration of claim 1:

wherein the memory row array comprises a first memory row array;

wherein the plurality of memory columns comprises a first plurality of memory columns;

wherein the identified one of the plurality of memory columns comprises a first identified one of the first plurality of memory columns;

and further comprising a plurality of memory banks, wherein each of the plurality of memory banks comprises:

a respective memory row array comprising a plurality of rows, wherein one of the plurality of memory banks comprises the first memory row array;

a respective plurality of memory columns, wherein one of the respective plurality of memory columns comprises the first plurality of memory columns;

wherein the encoder circuit is further for identifying a corresponding identified memory column for each of the respective plurality of memory columns;

wherein the decoder circuit, responsive to the corresponding identified memory column in the encoder circuit, is for coupling selected ones of the respective plurality of memory columns from one of the plurality of memory banks to corresponding ones of the data columns.

11. The memory configuration of claim 10:

wherein each of the plurality of memory banks has a separately addressable upper half and lower half; and wherein the encoder circuit is further for identifying an identified memory column for each of the respective plurality of memory columns in the separately addressable upper half and lower half.

12. The memory configuration of claim 1:

wherein the plurality of memory columns comprise an integer C number of memory columns;

wherein the plurality of data columns comprise an integer OC number of output columns; and wherein OC is one less than C.

13. The memory configuration of claim 1:

wherein the plurality of memory columns comprise an integer C number of memory columns;

wherein the plurality of data columns comprise an integer IC number of input columns; and wherein IC is one less than C.

14. The memory configuration of claim 1 wherein the plurality of data columns number one less than the plurality of memory columns.

15. The memory configuration of claim 1:

wherein the decoder circuit comprises an integer number M of multiplexers identifiable in an ascending order from a first multiplexer to a last multiplexer, wherein each of the multiplexers has an output, a first data input, a second data input, and a control input for receiving a control signal such that the multiplexer will select the signal from one of the first and second data inputs and connect it to the output;

wherein a first data column of the plurality of data columns is coupled to a first of the plurality of memory columns;

wherein a last data column of the plurality of data columns is coupled to a last of the plurality of memory columns;

wherein each of the plurality of data columns between the first data column and the last data column is an ascending ordered data column; and wherein each of the ascending ordered data columns is connected to an input of one of the integer number M of multiplexers and an input of a next ascending ordered one of the integer number M of multiplexers.

16. The memory configuration of claim 15 wherein each one of the plurality of memory columns is connected to one of the outputs of one of the integer number M of multiplexers.

17. The memory configuration of claim 15:

wherein the decoder circuit comprises a thermometer decoder circuit coupled to provide a control sequence comprising a control bit connected to each control input of each of the integer number M of multiplexers;

wherein the control sequence comprises an integer number equal to M of control bits starting with a first control bit and ending with a last control bit;

wherein each of the control bits has either a first or second logic state; and wherein the control sequence comprises a continuum such that each of the control bits is either in the first logic state, in the second logic state, or such that a first group of control bits from the first control bit through an intermediate control bit are in the first logic state while a second group of control bits from the control bit immediately after the intermediate control bit through the last control bit are in the second logic state.

18. A memory configuration, comprising:

a memory row array comprising a plurality of rows;

a plurality of memory columns identifiable in an ascending order from a first column to a last column, wherein each of the plurality of rows is constructed to communicate a plurality of signals along the plurality of memory columns;

an integer number M of multiplexers identifiable in an ascending order from a first multiplexer to a last multiplexer, wherein each of the multiplexers has an output, a first data input, a second data input, and a control input for receiving a control signal such that the multiplexer will select the signal from one of the first and second data inputs and connect it to the output;

a plurality of output columns, wherein each one of the output columns is connected to an output of one of the multiplexers;

wherein a pair of the plurality of memory columns is connected to the first and second data input of each of the multiplexers starting with a first pair of successive ascending ordered memory columns such that a first column of the first pair is connected to the first data input of the first multiplexer and a second column of the first pair is connected to the second data input of the first multiplexer, and with each of the ascending ordered multiplexers having its first and second data inputs connected to a next pair of successive ones of the memory columns, where the next pair of successive ones of the memory columns shares the higher ordered memory column of a preceding pair of the successive ascending ordered memory columns; and a thermometer decoder circuit coupled to provide a control sequence comprising a control bit connected to each control input of each of the integer number M of multiplexers, wherein the control sequence comprises the integer number M of control bits starting with a first control bit and ending with a last control bit, wherein each of the control bits has either a first or second logic state, and wherein the control sequence comprises a continuum such that each of the control bits is either in the first logic state, in the second state, or such that a first group of control bits from the first control bit through an intermediate control bit are in the first logic state while a second group of control bits from the control bit after the intermediate control bit through the last control bit are in the second logic state.

19. A method of operating a memory configuration having a row array comprising a plurality of rows and having a plurality of data columns operable to communicate information externally with respect to the memory configuration, comprising the steps of:

communicating a plurality of signals from one of the plurality of rows to a plurality of memory columns, wherein each of the plurality of memory columns provides a memory column output;

identifying an identified one of the plurality of memory columns;

responsive to the identified one of the plurality of memory columns, communicating a data signal along each of the plurality of data columns to couple selected ones of the plurality of memory columns to corresponding ones of the data columns; and wherein the corresponding ones of the data columns include at least each of the plurality of memory columns other than the identified one of the plurality of memory columns.

20. The method of claim 19:

wherein each of the plurality of memory columns is for outputting information; and wherein the corresponding ones of the data columns include only each of the plurality of memory columns other than the identified one of the plurality of memory columns.

21. The method of claim 19:

wherein each of the plurality of memory columns is for inputting information;

wherein each of the corresponding ones of the data columns other than a single one of the corresponding ones of the data columns is connected to only a single corresponding one of the plurality of memory columns; and wherein the single one of the corresponding ones of the data columns is connected to both one of the plurality of memory columns and to the identified one of the plurality of memory columns.

22. The method of claim 19:

wherein the step of coupling selected ones of the plurality of memory columns to corresponding ones of the data columns is performed by operating a decoder circuit;

wherein the decoder circuit comprises an integer number M of multiplexers identifiable in an ascending order from a first multiplexer to a last multiplexer, wherein each of the multiplexers has an output, a first data input, a second data input, and a control input for receiving a control signal such that the multiplexer will select the signal from one of the first and second data inputs and connect it to the output; and wherein a pair of the plurality of memory columns is connected to the first and second data input of each of the multiplexers starting with a first pair of successive ascending ordered memory columns such that a first column of the first pair is connected to the first data input of the first multiplexer and a second column of the first pair is connected to the second data input of the first multiplexer, and with each of the ascending ordered multiplexers having its first and second data inputs connected to a next pair of successive ones of the memory columns, where the next pair of successive ones of the memory columns shares the higher ordered memory column of a preceding pair of the successive ascending ordered memory columns.

23. The method of claim 22 wherein each one of the data columns is connected to one of the outputs of one of the integer number M of multiplexers.

24. The method of claim 22:

wherein the decoder circuit comprises a thermometer decoder circuit coupled to provide a control sequence comprising a control bit connected to each control input of each of the integer number M of multiplexers;

wherein the control sequence comprises an integer number equal to M of control bits starting with a first control bit and ending with a last control bit;

wherein each of the control bits has either a first or second logic state; and wherein the control sequence comprises a continuum such that each of the control bits is either in the first logic state, in the second logic state, or such that a first group of control bits from the first control bit through an intermediate control bit are in the first logic state while a second group of control bits from the control bit immediately after the intermediate control bit through the last control bit are in the second logic state.

25. The method of claim 19:

wherein the row array comprises a first row array;

wherein the plurality of memory columns comprises a first plurality of memory columns;

wherein the plurality of data columns comprises a first plurality of data columns;

wherein the identified one of the plurality of memory columns comprises a first identified one of the first plurality of memory columns;

wherein the memory configuration further has a second row array comprising a second plurality of rows;

wherein the memory configuration further has a second plurality of memory columns;

wherein the memory configuration further has a second plurality of data columns operable to communicate information externally with respect to the memory configuration;

and the method further comprises the steps of:

communicating a plurality of signals from one of the second plurality of rows to the second plurality of memory columns, wherein each of the second plurality of memory columns provides a memory column output;

identifying a second identified one of the second plurality of memory columns;

responsive to the second identified one of the second plurality of memory columns, communicating a data signal along each of the second plurality of data columns to couple selected ones of the second plurality of memory columns to corresponding ones of the data columns; and wherein the corresponding ones of the data columns include at least each of the second plurality of memory columns other than the second identified one of the second plurality of memory columns.

26. The method of claim 19:

wherein the memory row array comprises a first memory row array;

wherein the plurality of memory columns comprises a first plurality of memory columns;

wherein the identified one of the plurality of memory columns comprises a first identified one of the first plurality of memory columns;

wherein the memory configuration further comprises a plurality of memory banks, wherein each of the plurality of memory banks comprises:

a respective memory row array comprising a plurality of rows, wherein one of the plurality of memory banks comprises the first memory row array;

a respective plurality of memory columns, wherein one of the respective plurality of memory columns comprises the first plurality of memory columns;

and further comprising the step of identifying a corresponding identified memory column for each of the respective plurality of memory columns;

wherein the step of coupling selected ones of the plurality of memory columns to corresponding ones of the data columns comprises coupling selected ones of the respective plurality of memory columns from one of the plurality of memory banks to corresponding ones of the data columns.

27. The method of claim 26:

wherein each of the plurality of memory banks has a separately addressable upper half and lower half; and wherein the identifying step further identifies an identified memory column for each of the respective plurality of memory columns in the separately addressable upper half and lower half.

28. The method of claim 19:

wherein the plurality of memory columns comprise an integer C number of memory columns;

wherein the plurality of data columns comprise an integer OC number of output columns; and wherein OC is one less than C.

29. The method of claim 19:

wherein the plurality of memory columns comprise an integer C number of memory columns;

wherein the plurality of data columns comprise an integer IC number of input columns; and wherein IC is one less than C.

30. The method of claim 19 wherein the plurality of data columns number one less than the plurality of memory columns.

* * * * *